United States Patent
Murry et al.

(10) Patent No.: US 6,735,224 B2
(45) Date of Patent: May 11, 2004

(54) PLANAR LIGHTWAVE CIRCUIT FOR CONDITIONING TUNABLE LASER OUTPUT

(75) Inventors: Stefan J. Murry, Houston, TX (US); Chih-Hsiang Lin, Sugar Land, TX (US); N. Stephan Kinsella, Houston, TX (US)

(73) Assignee: Applied Optoelectronics, Inc., Sugar Land, TX (US)

( * ) Notice: Subject to any disclaimer, the term of this patent is extended or adjusted under 35 U.S.C. 154(b) by 41 days.

(21) Appl. No.: 10/029,018

(22) Filed: Dec. 20, 2001

(65) Prior Publication Data

US 2002/0172237 A1 Nov. 21, 2002

Related U.S. Application Data

(60) Provisional application No. 60/272,623, filed on Mar. 1, 2001.

(51) Int. Cl.[7] .................................................. H01S 3/10
(52) U.S. Cl. ........................................... 372/20; 372/21
(58) Field of Search ....................... 372/20, 32, 29.02; 398/202; 385/47

(56) References Cited

U.S. PATENT DOCUMENTS

| | | | |
|---|---|---|---|
| 5,031,187 A | | 7/1991 | Orenstein et al. |
| 5,469,288 A | * | 11/1995 | Onaka et al. ............... 398/202 |
| 5,673,129 A | | 9/1997 | Mizrahi |
| 5,774,486 A | | 6/1998 | Jiang et al. |
| 5,875,273 A | | 2/1999 | Mizrahi et al. |
| 5,894,535 A | * | 4/1999 | Lemoff et al. ................ 385/47 |
| 5,943,152 A | | 8/1999 | Mizrahi et al. |
| 6,067,181 A | | 5/2000 | Mizrahi |
| 6,111,681 A | | 8/2000 | Mizrahi et al. |
| 6,125,128 A | | 9/2000 | Mizrahi |
| 6,233,263 B1 | * | 5/2001 | Chang-Hasnain et al. .... 372/32 |
| 6,289,028 B1 | * | 9/2001 | Munks et al. ................. 372/20 |
| 6,349,103 B1 | * | 2/2002 | Chung et al. ................. 372/32 |
| 6,389,046 B1 | * | 5/2002 | Stayt et al. ............... 372/29.02 |
| 2001/0053265 A1 | * | 12/2001 | Yamashita et al. ............ 385/48 |

OTHER PUBLICATIONS

Sandusky, J. And Brueck, S., "A CW External–Cavity Surface–Emitting Laser," *IEEE Photonics Tech. Letters*, vol. 8, No. 3, (1996), pp. 313–315, no month.

Lemoff, Brian E. et al., "A Compact, Low–Cost WDM Transceiver for the LAN," *2000 Electronic Components and Technology Conference, 2000 IEEE*, pp. 711–716, no month.

Okamoto, Katsunari, "Planar Lightwave Circuits," *Fundamentals of Optical Waveguides*, Chapter 9, (Academic Press: 2000), pp. 341–400, no month.

* cited by examiner

*Primary Examiner*—Paul Ip
*Assistant Examiner*—Hung T. Vy
(74) *Attorney, Agent, or Firm*—N. Stephan Kinsella

(57) ABSTRACT

A planar lightwave circuit (PLC) module for conditioning light output from a tunable laser designed to generate light at a target wavelength. The PLC module has a substrate; a primary waveguide embedded in said substrate, said primary waveguide having an input end for receiving light from the tunable laser and an output end for outputting said light; and at least a first secondary waveguide embedded in said substrate, said first secondary waveguide receiving a first portion of said light from the tunable laser. A filter having a passband centered on the target wavelength is coupled to an output of the first secondary waveguide to receive said first portion of light, and generates a signal related to the intensity of said first portion of light in the passband centered on the target wavelength. This may be used by a processor and associated laser control circuitry for wavelength locking purposes.

18 Claims, 26 Drawing Sheets

| |
|---|
| A |
| B |
| C |
| A |
| B |
| C |
| D |
| A |
| B |
| C |
| D |
| A |
| B |
| D |
| C |
| A |
| B |
| D |
| C |

| |
|---|
| A |
| B |
| D |
| C |
| A |
| B |
| C |
| D |

*FIG. 4C*

PLANAR LIGHTWAVE CIRCUIT FOR CONDITIONING TUNABLE LASER OUTPUT

CROSS-REFERENCES TO RELATED APPLICATIONS

This nonprovisional U.S. national application, filed under 35 U.S.C. § 111(a), claims, under 37 C.F.R. § 1.78(a)(3), the benefit of the filing date of provisional U.S. national application No. 60/272,623, filed under 35 U.S.C. § 111(b) and accorded a filing date of Mar. 1, 2001, the entirety of which is incorporated herein by reference.

BACKGROUND OF THE INVENTION

1. Field of the Invention

This invention relates generally to devices that emit electromagnetic radiation and, in particular, to wavelength monitoring and locking for a semiconductor laser.

2. Description of the Related Art

The following descriptions and examples are not admitted to be prior art by virtue of their inclusion within this section.

Lasers have a wide range of industrial and scientific uses. There are several types of lasers, including gas lasers, solid-state lasers, liquid (dye) lasers, and free electron lasers. Semiconductor lasers are also in use. In semiconductor lasers, electromagnetic waves are amplified in a semiconductor superlattice structure. Semiconductor lasers may be diode lasers (bipolar) or non-diode lasers such as quantum cascade (QC) lasers (unipolar). Semiconductor lasers are used for a variety of applications and can be built with different structures and semiconductor materials, such as gallium arsenide (GaAs).

The use of semiconductor lasers for forming a source of optical energy is attractive for a number of reasons. Semiconductor lasers have a relatively small volume and consume a small amount of power as compared to conventional laser devices. Further, semiconductor lasers can be fabricated as monolithic devices, which do not require a combination of a resonant cavity with external mirrors and other structures to generate a coherent output laser beam.

A semiconductor laser typically comprises an active (optical gain) region sandwiched between two mirrors (reflectors or reflective planes). There is typically a small difference in reflectivity between the two mirrors, one of which (typically, the reflective plane having lower reflectivity) serves as the "exit" mirror. The area between the reflective planes is often referred to as the resonator, or the Fabry-Perot resonance cavity in some cases. The active region is located within the resonant cavity. When the active region is pumped with an appropriate pumping energy, it produces photons, some of which resonate and build up to form coherent light in the resonant cavity formed by the two mirrors. A portion of the coherent light built up in the resonating cavity formed by the active region and top and bottom mirrors passes through the exit mirror as the output laser beam.

Various forms of pumping energy may be utilized to cause the active region to begin to emit photons and to achieve gain. For example, semiconductor lasers of various types may be electrically pumped (EP) (by a DC or alternating current), or pumped in other ways, such as by optical pumping (OP) or electron beam pumping. In an EP VCSEL, for example, an electrical potential difference is typically applied across the active region (via top and bottom electrical contacts provided above and below the active region). As a result of the potential applied, a pumping current flows through the active region, i.e. charge carriers (electrons and holes) are injected from opposite directions into the active region where recombination of electron and holes occurs. There are two kinds of recombination events, i.e. radiative and non-radiative, concurrently happening in the active region. When radiative recombination occurs, a photon is emitted with the same energy as the difference in energy between the hole and electron energy states. Some of those photons travel in a direction perpendicular to the reflectors of the laser. As a result of the ensuing reflections, the photons can travel through the active region multiple times.

Stimulated emission occurs when radiative recombination of an electron-hole pair is stimulated by interaction with a photon. In particular, stimulated emission occurs when a photon with an energy equal to the difference between an electron's energy and a lower energy interacts with the electron. In this case, the photon stimulates the electron to fall into the lower energy state, thereby emitting a second photon. The second photon will have the same energy and frequency as the original photon, and will also be in phase with the original photon. Thus, when the photons produced by spontaneous electron transition interact with other high energy state electrons, stimulated emission can occur so that two photons with identical characteristics are present. (Viewed as waves, the atom emits a wave having twice the amplitude as that of the original photon interacting with the atom.) If a sufficient amount of radiative recombinations are stimulated by photons, the number of photons traveling between the reflectors tends to increase, giving rise to amplification of light and lasing. The result is that coherent light builds up in the resonant cavity formed by the two mirrors, a portion of which passes through the exit mirror as the output laser beam.

Semiconductor lasers may be edge-emitting lasers or surface-emitting lasers (SELs). Edge-emitting semiconductor lasers output their radiation parallel to the wafer surface, while in SELs, the radiation output is perpendicular to the wafer surface. One type of SEL is the vertical-cavity surface-emitting laser (VCSEL). The "vertical" direction in a VCSEL is the direction perpendicular to the plane of the substrate on which the constituent layers are deposited or epitaxially grown, with "up" being typically defined as the direction of epitaxial growth. In some designs, the output laser beam is emitted out of the top side, in which case the top mirror is the exit mirror. In other designs, the laser beam is emitted from the bottom side, in which case the bottom mirror is the exit mirror.

VCSELs have many attractive features compared to edge-emitting lasers, such as low threshold current, single longitudinal mode, a circular output beam profile, a smaller divergence angle, and scalability to monolithic laser arrays. The shorter cavity resonator of the VCSEL provides for better longitudinal mode selectivity, and hence narrower linewidths. Additionally, because the output is perpendicular to the wafer surface, it is possible to test fabricated VCSELs on the wafer before extensive packaging is done, in contrast to edge-emitting lasers, which must be cut from the wafer to test the laser. Also, because the cavity resonator of the VCSEL is perpendicular to the layers, there is no need for the cleaving operation common to edge-emitting lasers.

The VCSEL structure usually consists of an active (optical gain) region sandwiched between two mirrors, such as distributed Bragg reflector (DBR) mirrors. Both EP and OP VCSEL designs are possible. The two mirrors may be referred to as a top DBR and a bottom DBR. Because the optical gain is low in a vertical cavity design, the reflectors require a high reflectivity in order to achieve a sufficient level of feedback for the device to laser.

DBRs are typically formed of multiple pairs of layers referred to as mirror pairs. DBRs are sometimes referred to as mirror stacks. The pairs of layers are formed of a material system generally consisting of two materials having different indices of refraction and being easily lattice matched to the other portions of the VCSEL, to permit epitaxial fabrication techniques. The layers of the DBR are quarter-wave optical-thickness (QWOT) layers of alternating high and low refractive indices, where each mirror pair contains one high and one low refractive index QWOT layer. The number of mirror pairs per stack may range from 20–40 pairs to achieve a high percentage of reflectivity, depending on the difference between the refractive indices of the layers. A larger number of mirror pairs increases the percentage of reflected light (reflectivity).

The DBR mirrors of a typical VCSEL can be constructed from dielectric (insulating) or semiconductor layers (or a combination of both, including metal mirror sections). The difference between the refractive indices of the layers of the mirror pairs can be higher in dielectric DBRs, generally imparting higher reflectivity to dielectric DBRs than to semiconductor DBRs for the same number of mirror pairs and overall thickness. Conversely, in a dielectric DBR, a smaller number of mirror pairs can achieve the same reflectivity as a larger number in a semiconductor DBR. However, it is sometimes necessary or desirable to use semiconductor DBRs, despite their lower reflectivity/greater thickness, to conduct current, for example (e.g., in an EP VCSEL). Semiconductor DBRs also have higher thermal (heat) conductivity than do dielectric DBRs, making them more desirable for heat-removal purposes, other things being equal. Semiconductor DBRs may also be preferred for manufacturing reasons (e.g., a thicker DBR may be needed for support) or fabrication reasons (e.g., an epitaxial, i.e. semiconductor, DBR may be needed if other epitaxial layers need to be grown on top of the DBR).

When properly designed, these mirror pairs will cause a desired reflectivity at the laser wavelength. Typically in a VCSEL, the mirrors are designed so that the bottom DBR mirror (i.e. the one interposed between the substrate material and the active region) has nearly 100% reflectivity, while the top (exit) DBR mirror has a reflectivity that may be 98%–99.5% (depending on the details of the laser design). The partially reflective top (exit) mirror passes a portion of the coherent light built up in the resonating cavity formed by the active region and top and bottom mirrors. Of course, as noted above, in other designs, the bottom mirror may serve as the exit mirror and the top mirror has the higher reflectivity. VCSELs, DBRs, and related matters are discussed in further detail in *Vertical-Cavity Surface-Emitting Lasers: Design, Fabrication, Characterization, and Applications*, eds. Carl W. Wilmsen, Henryk Temkin & Larry A. Coldren (Cambridge: Cambridge University Press, 1999).

In standard VCSELs, the active region and top and bottom mirrors are monolithically fabricated on a substrate. A variant on the standard VCSEL, an external cavity VCSEL, or vertical-external-cavity surface-emitting laser (VECSEL), is also in use. In this case, the active region and bottom mirror are monolithically fabricated on a substrate, while the top mirror is mounted externally, some distance (typically very small) above the active region. VECSELs are described in J. Sandusky & S. Brueck, "A CW External-Cavity Surface-emitting Laser," *IEEE Photon. Techn. Lett.* 8, 313–315 (1996). The term VCSEL may be used to refer to both standard (monolithic) VCSELs and external-cavity VCSELS (VECSELs).

VCSEL characteristics are capable of extensive modeling and manipulation. Sarzala et al., "Carrier Diffusion Inside Active Regions of Gain-Guided Vertical-Cavity Surface-Emitting Lasers," *IEEE Proc.—Optoelectonics*, vol.144, no. 6, p. 421–24, December 1997, Langley et al., "Effect of Optical Feedback on the Noise Properties of Vertical Cavity Surface Emitting Lasers," *IEEE Proc.— Optoelectonics*, vol. 144, no. 1, p. 34–38, February 1997, Ha et al., "Polarisation Anisotropy in Asymmetric Oxide Aperture VCSELs," *Electronics Letters*, vol. 34, no. 14, July 1998.

Semiconductor lasers such as VCSELs and edge-emitting lasers are used in a variety of applications. In some applications, e.g., telecommunications and spectroscopy among others, the output laser light is modulated to achieve the objective of the system. Modulation consists of modifying a characteristic of the laser output, e.g., the amplitude, frequency, or phase. In the case of telecommunications, the modulations are patterned to correspond to information. The laser may be externally modulated, or directly modulated. When the radiation of the output laser beam is detected after it has traveled to another point, the modulations indicate the information that was encoded at the transmitter/modulator end. A typical telecommunications system uses optical fiber to guide the radiation from the modulation (or emission) point to the detection point. Long wavelength (1.3 $\mu$m to 1.55 $\mu$m) VCSELs, for example, are of great interest in the optical telecommunications industry because of the minimum fiber dispersion at 1310 nm and the minimum fiber loss at 1.55 $\mu$m (1550 nm).

It is important to be able to monitor, and sometimes control, the wavelength of the emitted laser radiation in some applications. In telecommunications applications, for example, the emitted laser radiation of a given semiconductor laser has a precise wavelength, as specified, for example, by the ITU grid. For example, the ITU grid specifies lasing wavelength of 1.55 $\mu$m (and other closely spaced wavelengths). These ITU grid wavelengths are used in telecommunications applications such as coarse and dense wavelength-division multiplexing (CWDM and DWDM). In WDM, typically used in optical fiber communications, two or more optical (e.g. laser) signals having different wavelengths are simultaneously transmitted in the same direction over one fiber, and then are separated by wavelength at the distant end.

The use of wavelength-division multiplexed communications systems has led to additional equipment. For example, devices for demultiplexing the wavelengths include the disclosure of U.S. Pat. No. 5,894,535 (1999), Lemoff et al., "Optical Waveguide Device for Wavelength Demultiplexing and Waveguide Crossing." That patent discloses a device including a zigzag patterned dielectric channel waveguide structure that guides a WDM signal through a zigzag path. At particular vertices of the path optical filters selectively transmit and reflect wavelengths of light. The light output of the device separates wavelength of light by output position. As another example, U.S. Pat. No. 5,673,129 (1997), Mizrahi, "WDM Optical Communication Systems with Wavelength Stabilized Optical Selectors" discloses a system that receives a portion of a WDM signal with a Bragg grating having one high reflectivity wavelength band. Based on the signal that is reflected from the grating, a wavelength parameter of the Bragg grating is modified, resulting in a change in the high reflectivity wavelength band. A system basing feedback on the signal transmitted by the grating is also disclosed. U.S. Pat. No. 6,111,681 (2000), Mizrahi et al., "WDM Optical Communication Systems with Wavelength Stabilized Optical Selectors" contains the same disclosure as U.S. Pat. No. 5,673,129.

Systems that adjust the output wavelength of a laser have also been proposed. For example, U.S. Pat. No. 5,943,152, Mizrahi et al., "Laser Wavelength Control Device" discusses a system that couples an in-fiber Bragg grating to the output of a laser. Based on either the transmissivity or reflectance of the grating, a microprocessor continually adjusts the wavelength of the laser output. As another example, U.S. Pat. No. 5,875,273, Mizrahi et al., "Laser Wavelength Control Under Direct Modulation" discusses a system using a filter with particular transmission characteristics as a function of wavelength. In particular, the filter includes a transmissivity minimum with transmissivity maximums for both a greater and lesser wavelength, which can also be described as a high reflectivity wavelength band. The filter is coupled to a laser and a control circuit adjusts the laser's wavelength characteristics based on measurement of both reflected and transmitted light from the filter. As another example, U.S. Pat. No. 6,067,181, Mizrahi, "Laser Locking and Self Filtering Device" discusses a laser system with an optical transfer element and a Bragg grating. The entire output of the laser is coupled to the Bragg grating via the transfer element. The light reflected from the Bragg grating is outputted while the light transmitted through the Bragg grating is detected to generate a signal that is used to control the laser. U.S. Pat. No. 6,125,128 (2000), Mizrahi, "Laser Output Locking and Self Filtering Device" contains substantially the same disclosure as U.S. Pat. No. 6,067,181.

It can be difficult to ensure that a given laser is lasing at the desired wavelength, and to control or tune the laser to emit at different wavelengths. For example, VCSELs can have a wavelength significantly dependent on drive current (or some other tuning parameter), and can be thus said to be "tunable". In general, a tunable laser such as a tunable VCSEL is a laser having an output wavelength corresponding to a selectable tuning parameter. Some approaches used in attempts to tune various types of lasers are described in B. Pezeshki, "New Approaches to Laser Tuning," *Optics & Photonics News,* 34–38 (May 2001). These include, in addition to varying the pumping or drive current, temperature variation, combination of multiple lasers having different wavelengths on a single chip, and movement of micromechanical components.

However, while tunability is desired in some applications, it can give rise to undesired variation in lasing wavelength. Additionally, even lasers that initially have a fixed or stable wavelength can have wavelength drift over time, as the device ages. It can be important to be able to determine that desired wavelength, or wavelength "lock," has been lost. Information about deviation of the current wavelength from some benchmark or target wavelength can be useful for diagnostic or locking purposes, for example.

There is, therefore, a need for methods and devices to permit monitoring, stabilizing, selecting, and controlling the lasing wavelength of semiconductor lasers.

BRIEF DESCRIPTION OF THE DRAWINGS

Other features and advantages of the invention will become apparent upon study of the following description, taken in conjunction with the attached FIGS. 1–16.

FIG. 4C is a diagram of a reflector.

Figure 1:
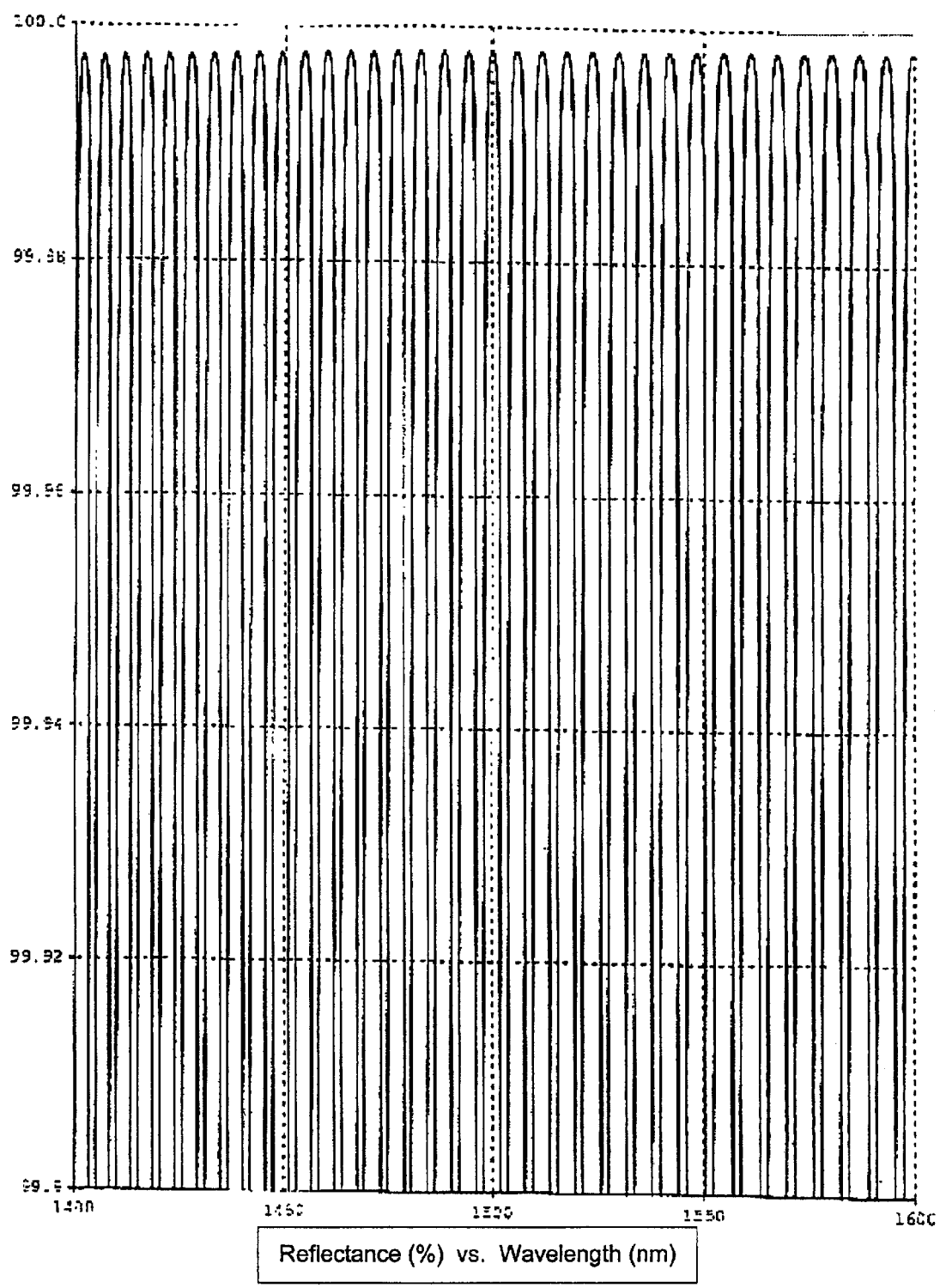
FIG. 1 is a chart of reflectance as a function of wavelength for a reflector.

While the present invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Referring now to the drawings, the details of preferred embodiments of the invention are schematically illustrated.

Multiple Reflectivity Band Reflector

A reflector is fabricated having a structure that gives rise to multiple high, and narrow, reflectivity bands. Such a reflector may be referred to as a multiple reflectivity-band reflector (MRBR). In an embodiment, the reflectivity bands of the MRBR are spaced along wavelengths of the ITU grid, e.g. around 1550 nm. In another embodiment, additional reflectivity bands of the MRBR are spaced around 1310 nm. In an embodiment, the MRBR is a distributed dielectric multilayer stack reflector.

Each reflectivity band has a peak reflectivity and an associated peak wavelength, and is separated from adjacent reflectivity bands by wavelength bands which may be referred to as "troughs". The peaks of the reflectivity bands, as well as the minima (bottom tips) of the troughs between bands (i.e. transmissivity peaks), of an MRBR, have a certain reflectivity profile (envelope). In the present application, the term "reflectivity profile" refers to the shape of the function intersecting the peaks of bands (or the trough minima of troughs between bands), for a given mirror's reflectance versus wavelength function (reflectance characteristic). The reflectivity profile of the peaks of reflectance bands may be referred to as the peak profile, while the trough profile refers to the reflectivity profile of the trough minima. The reflectivity profile may also be referred to as the "envelope function" or profile for the peaks or trough minima of a given reflectance characteristic. In some embodiments, the reflectivity profile (e.g., of the reflectivity band peaks) is substantially constant over a given wavelength range (as described in further detail below with reference to FIGS. 1–4). In other embodiments, the peak profile varies as a function of wavelength (as described in further detail below with reference to FIG. 5).

Depending on the embodiment, either all, some, or none of the reflectivity bands have a reflectivity sufficient to give rise to lasing. Reflectivity bands that do have sufficient reflectivity to permit lasing may be referred to as lasing threshold reflectivity bands.

Each reflectivity band has a peak reflectivity and a narrow wavelength band encompassing the peak, in which band all the reflectivities are above some reflectivity threshold. Between adjacent peaks or bands are troughs in which the reflectivity is below this threshold reflectivity.

In an embodiment, the reflectivity of a plurality of reflectivity bands of the MRBR is high enough to give rise to lasing in a VCSEL or two-section VECSEL configuration employing the MRBR. In this case, the reflectivity bands are lasing threshold reflectivity bands. Each lasing threshold reflectivity band has a reflectivity, in a very narrow wavelength band, above a certain minimum or lasing threshold reflectivity. This threshold reflectivity is high enough so that there is net gain at that wavelength (i.e., the gain exceeds the mirror loss). The lasing threshold reflectivity band thus denotes the narrow range of wavelengths centered about the peak reflectivity wavelength for the reflectivity band and for which the reflectivity is above some lasing threshold reflectivity.

Lasing occurs when, during a round trip of photons through the cavity, the number of photons added due to stimulated emission is at least equal to the number lost internally and at the edges. A lower reflectivity for a given reflectivity band leads to more photons being lost at the "edge" of the cavity formed by the MRBR. Thus, lasing is possible where gain (determined by the gain spectrum of the active region) is greater than loss (determined in part by the reflectivity of the DBR mirrors), and where the phase difference of a round trip of light within the optical cavity is zero. A wavelength where the phase difference of a round trip of light within the optical cavity is zero may be referred to herein as a cavity mode or a zero-phase difference wavelength. The precise cavity modes for a given laser are determined by the physical distance between the mirrors and by the reflectivity and phase shifting characteristics of the DBR mirrors, and by the indices of refraction of various layers of material within the laser structure. The cavity modes can be shifted by adjusting some indices of refraction within the laser cavity, by changing the physical cavity length, or other techniques.

This minimum reflectivity which is sufficient for lasing in a given laser structure may be referred to as the lasing threshold reflectivity and may be, for example, 99.5%. Each reflectivity peak that is above the lasing threshold reflectivity is within an associated lasing threshold reflectivity band. Between any two adjacent lasing threshold reflectivity bands the reflectivity is necessarily below the lasing threshold reflectivity. As noted above, the troughs are portions of the mirror's reflectivity profile between any two adjacent reflectivity bands. As will be appreciated, a trough between two adjacent lasing threshold reflectivity bands will have a reflectivity lower than the lasing threshold reflectivity over the entire trough, and for virtually all of the trough (except for the portion immediately adjacent the bottom portions of the adjacent reflectivity bands) lower than a second threshold reflectivity (e.g., 99.3%) which is lower than the lasing threshold reflectivity.

The reflectivity bands of the MRBR are preferably sufficiently narrow. The reflectivity band may be characterized in terms of narrowness with respect to the wavelength band covered by a given reflectivity, e.g. the first threshold reflectivity, or other specified high reflectivity (e.g., 99%). The wavelength range covered by a reflectivity band above some first threshold reflectivity may be denoted $\Delta\lambda_{TR}$ (where "TR" stands for first "threshold reflectivity"), and the range covered with greater than 99% reflectivity may be denoted $\Delta\lambda_{99}$. Where the first threshold reflectivity is a lasing threshold reflectivity (i.e., where the reflectivity band is a lasing threshold reflectivity band), the denotation $\Delta\lambda_{LT}$ may be employed instead of $\Delta\lambda_{TR}$, where "LT" stands for "lasing threshold." The reflectivity band may also described as having a certain width at a reflectivity a certain percentage (e.g., 3%) below its peak reflectivity. For example, in an embodiment, each reflectivity band has a width of less than 1 nm at a reflectivity of 3% less than its peak reflectivity. Alternatively, in an embodiment, a given reflectivity band may be described as having $\Delta\lambda_{99}$ less than or equal to some width (e.g., 1 nm, or 0.1 nm, etc.).

The particular lasing threshold reflectivity depends upon characteristics of the laser cavity such as the reflectivity of the other edge (of the cavity—whether a cleaved edge or DBR or other type of reflector, e.g.), the degree to which the active region absorbs particular wavelengths of light, and the degree to which atoms in the active region are stimulated to emit additions photons at particular wavelengths of light (i.e., the gain). For example, if the bottom mirror of a VECSEL has very high reflectivity, then lasing threshold reflectivity for the other mirror (e.g., the MRBR) is lower. Conversely, a higher lasing threshold reflectivity is needed for the top or external mirror (e.g., the MRBR) given a lower reflectivity bottom cavity mirror. Lasing can occur where there is a cavity mode, at a wavelength lying within a given reflectivity band (i.e., at a cavity mode wavelength at which the reflectivity of the reflectivity band exceeds the lasing threshold reflectivity).

FIG. 1 plots the reflectance versus wavelength characteristics for an exemplary uniform reflectivity profile MRBR in accordance with the present invention. The reflectance is determined with unpolarized light impacting the MRBR perpendicularly through air. The reference wavelength is 2000 nm. The "reference wavelength" term specifies the wavelength used to determine the QWOT for the layers of the MRBR; i.e., they have a thickness that is equal to a quarter of the reference wavelength in that material. The MRBR with the reflectance characteristics shown in FIG. 1 has a total thickness of approximately 212.4 μm, and may be fabricated on a suitable substrate, such as glass or InP. As will be appreciated, various multilayer stack structures and materials may be utilized to result in reflectivity bands of various wavelengths, spacing, and width (narrowness), and having different reflectivities for the peaks and trough minima, and various constant or varying peak and trough minima profiles.

Figure 2A:
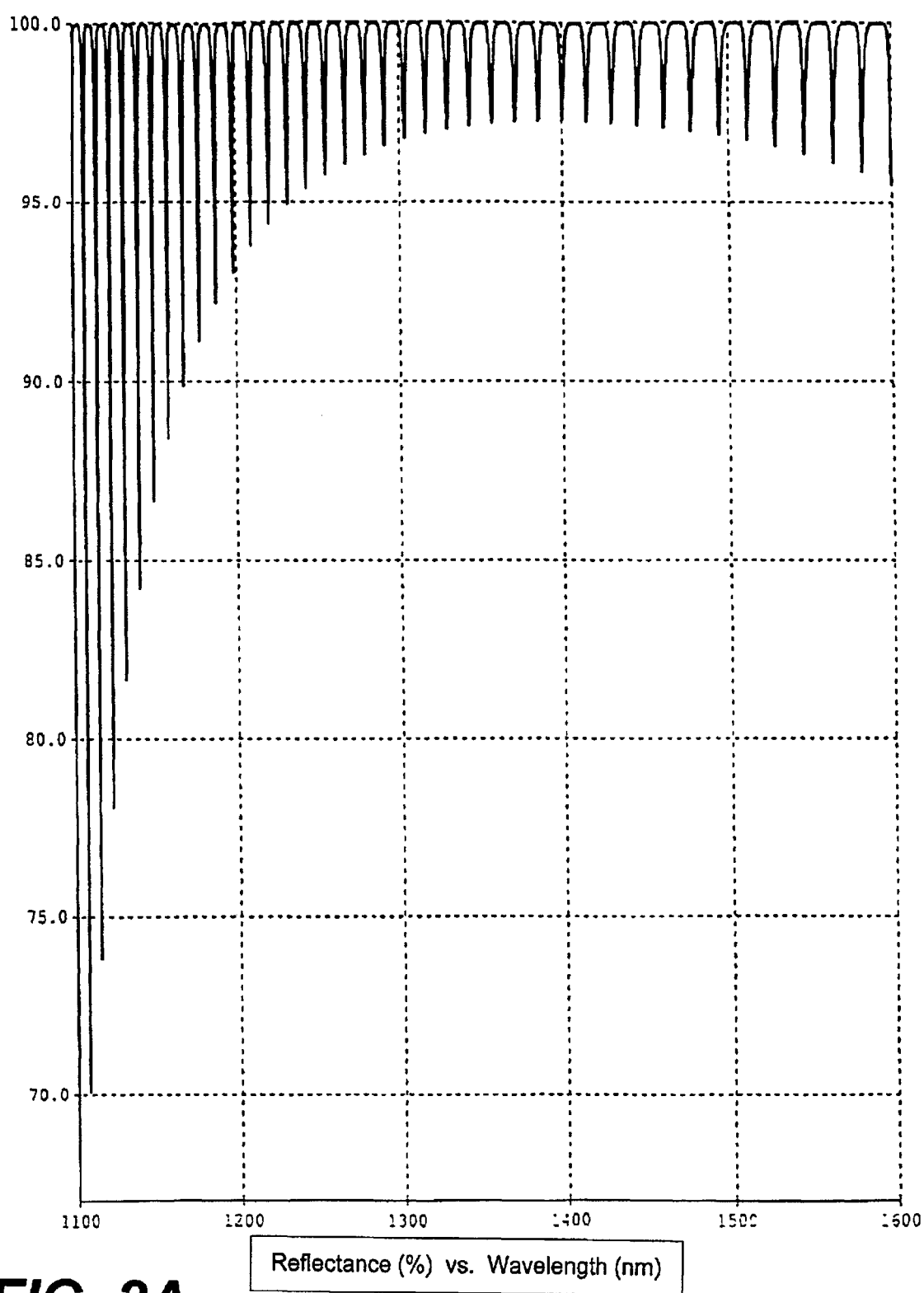
FIG. 2A is a chart of reflectance as a function of wavelength for a reflector constructed in accordance with FIG. 2C.
Figure 2B:
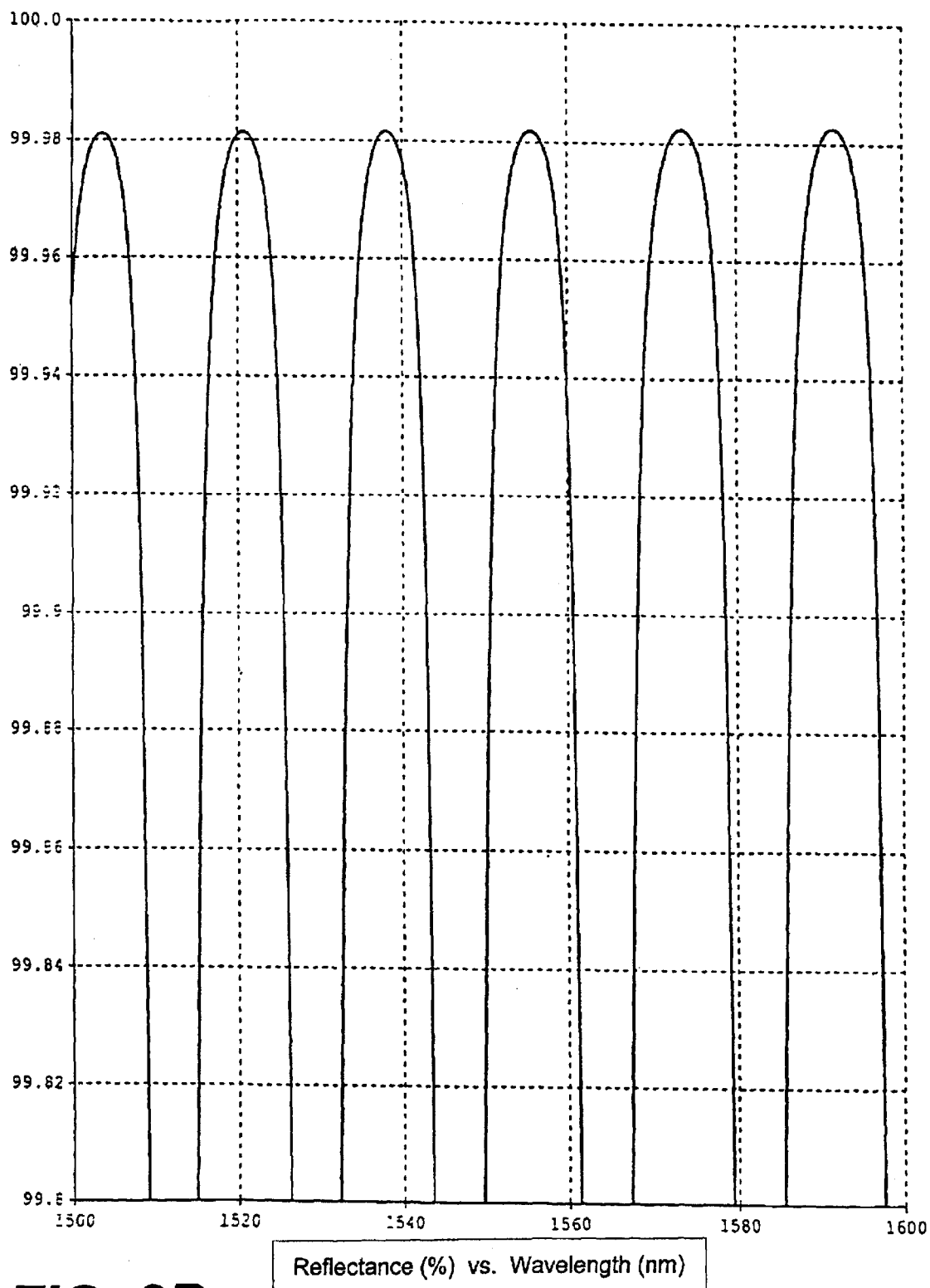
FIG. 2B is a chart of reflectance as a function of wavelength for a reflector constructed in accordance with FIG. 2C.
Figure 2C:
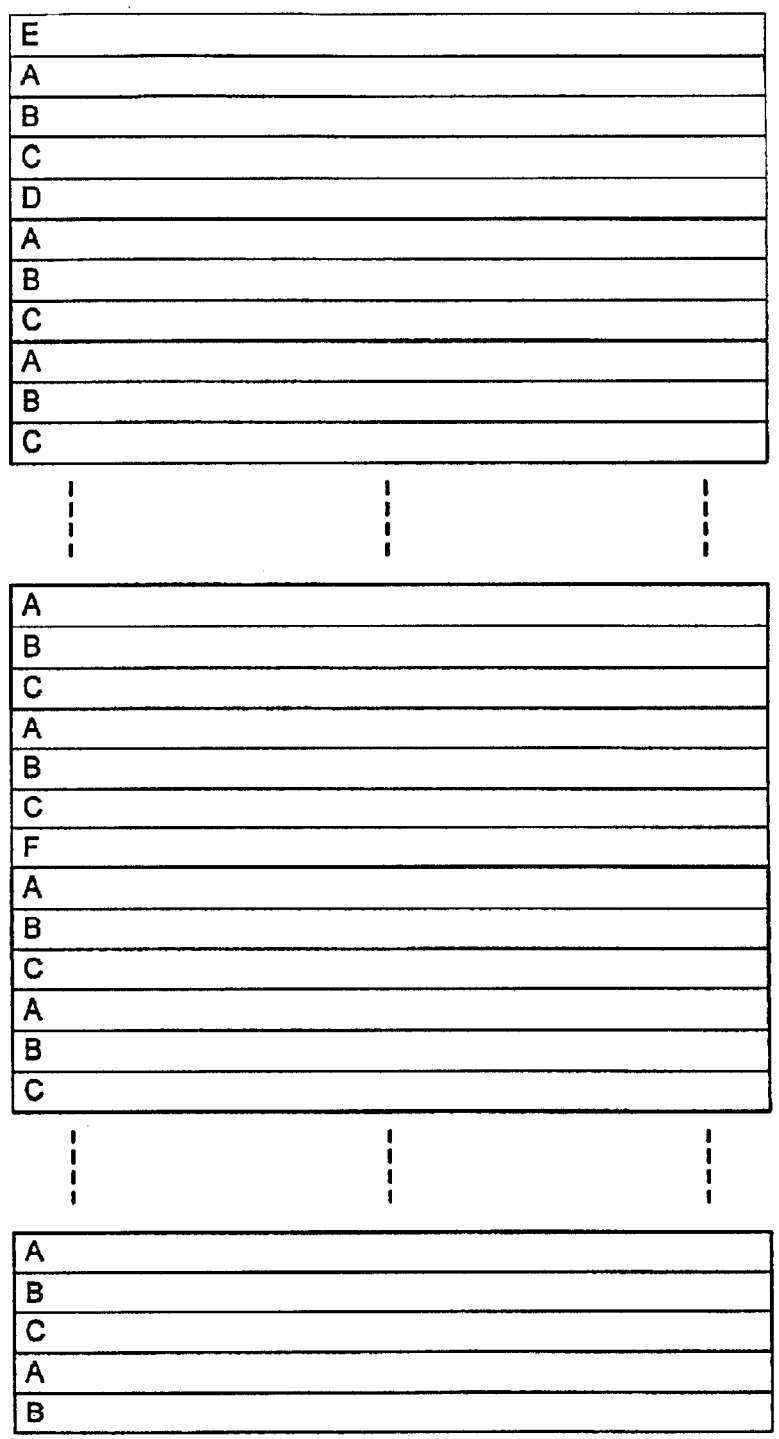
FIG. 2C is a diagram of a reflector.

Referring now to FIGS. 2A–B, there are shown plots of the reflectance versus wavelength characteristics for another exemplary MRBR in accordance with the present invention, the structure of which is shown in FIG. 2C. This MRBR also has a substantially uniform reflectivity profile for at least a plurality of peaks. FIG. 2B graphs a much smaller portion of both axes than is shown in FIG. 2A. For both FIG. 2A and FIG. 2B, the reflectance is determined with unpolarized light impacting the MRBR perpendicularly through air. The MRBR reflectance characteristics shown in FIGS. 2A–B may be achieved by employing an MRBR having a layer structure either substantially similar to or based on/derived from the structure shown in FIG. 2C and defined by the following Formula (1):

$$EABCD(ABC)^{60}ABCF(ABC)^{60}AB \quad (1)$$

where an exponent indicates that the preceding term is repeated that many times in succession, the letters "qw" denote quarter-wave optical thickness (QWOT) (for a given reference wavelength), and the layer symbols in the formula indicate the following materials and thicknesses:

| Symbol | Material | Thickness |
|--------|----------|-----------|
| A | $Al_2O_3$ | 0.7500 qw |
| B | $TiO_2$ | 0.7500 qw |
| C | $SiO_2$ | 0.7500 qw |
| D | Si | 0.7500 qw |
| E | Al | 1.2500 qw |
| F | Si | 0.7500 qw |

The reference wavelength is 1800 nm. For the simulations used to generate the plots for the MRBRs of the present invention, the qw figures were based on the following assumed indices of refraction and extinction coefficients:

| Material | Refractive Index | Extinction Coefficient |
|----------|------------------|------------------------|
| $Al_2O_3$ | 1.62 | 0 |
| $TiO_2$ | 2.3 | 0 |
| $SiO_2$ | 1.434 | 0 |
| Si | 3.4 | 0 |
| Al | 2.3 | 16.5 |

For example, the A layer has a quarter wavelength equal to the reference wavelength divided by both the refractive index of the material and by 4: (1800 mn/1.62)/4 =277.778 nm. Division by the refractive index accounts for the fact that the wavelength of light depends on the propagating medium. The A layer is therefore 0.75*qw=0.75*277.778 nm=208.33 (208) nm thick. The same calculation produces the thicknesses of the other layers:

| Symbol | Material | Thickness |
|--------|----------|-----------|
| A | $Al_2O_3$ | 208.33 nm |
| B | $TiO_2$ | 146.74 nm |
| C | $SiO_2$ | 235.36 nm |
| D | Si | 99.26 nm |
| E | Al | 244.57 nm |
| F | Si | 99.26 nm |

As noted above, to obtain the desired MRBR reflectance characteristics (e.g., those shown in FIGS. 2A–B), an MRBR may be employed having a layer structure either substantially similar to or based on/derived from the structure defined Formula (1). For example, in an embodiment, to arrive at the actual MRBR layer structure to be employed, the layer structure of Formula (1) is used as a starting point, to result in a modified layer structure similar to and/or based on the initial layer structure specified in Formula (1). For example, the reflector structure may be optimized by varying the individual layer thicknesses so as to achieve the precise reflectance characteristics desired. Thus, although Formula (1) indicates many layers having identical thickness, after optimization the reflector utilized may have layers of different thicknesses. Whether the MRBR employed has a layer structure substantially similar to, or based on/derived from a structure defined by a given formula, the MRBR may be said to have a layer structure "based on", "derived from," or "corresponding to" the layer structure defined by the formula.

In alternative embodiments or with other fabrication processes or sputtering devices, the refractive indices and extinction coefficients of the layer materials employed may vary somewhat from those assumed above. In this case, the qw figures might need to be adjusted, to take into account actual indices of refraction, to achieve a given reflectivity characteristic. The qw parameter for each of the simulated plots of FIGS. 1–7 is the QWOT for a given reference wavelength, denoted "reference" on the legend at the top of each of FIGS. 1–7. Thus, in some embodiments, due to optimization or other empirical adjustments, the formula itself may be adjusted or the implementation may be adjusted. For example, for Formula (1), layer A appears several times in the formula. Although nominally indicated as being an $Al_2O_3$ having a thickness of 0.7500 qw (or 208.33 nm), this thickness of layer A may be varied, either for all the A layers in the structure or only some of them.

Formula (1) specifies a 371-layer stack, where the leftmost symbol denotes the layer(s) closest to the substrate. The substrate is not shown in FIG. 2C. The reflector may be fabricated by any suitable technique, e.g., a dielectric coating technique such as such as ion beam assisted sputtering or magnetron sputtering on a suitable substrate, such as InP or glass. In some cases, the reflector need not use a supporting substrate, i.e. it has an "air" substrate.

The particular stack layer formula employed may be empirically determined, e.g. with the aid of a suitably programmed computer (e.g., running the TFCalc program available from Software Spectra, Inc., having a web site with a www domain name of sspectra.com) which attempts to find suitable layer structures, within certain constraints, to yield the desired reflectivity band characteristics. The qw parameter may be selected for a reference wavelength greater than or less than the actual desired wavelength range for the reflectivity bands. For example, reference wavelengths of 1800, 2000, 2200, and 795 nm were employed, in some cases, to achieve reflectivity bands in the 1550 nm range.

Figure 3A:
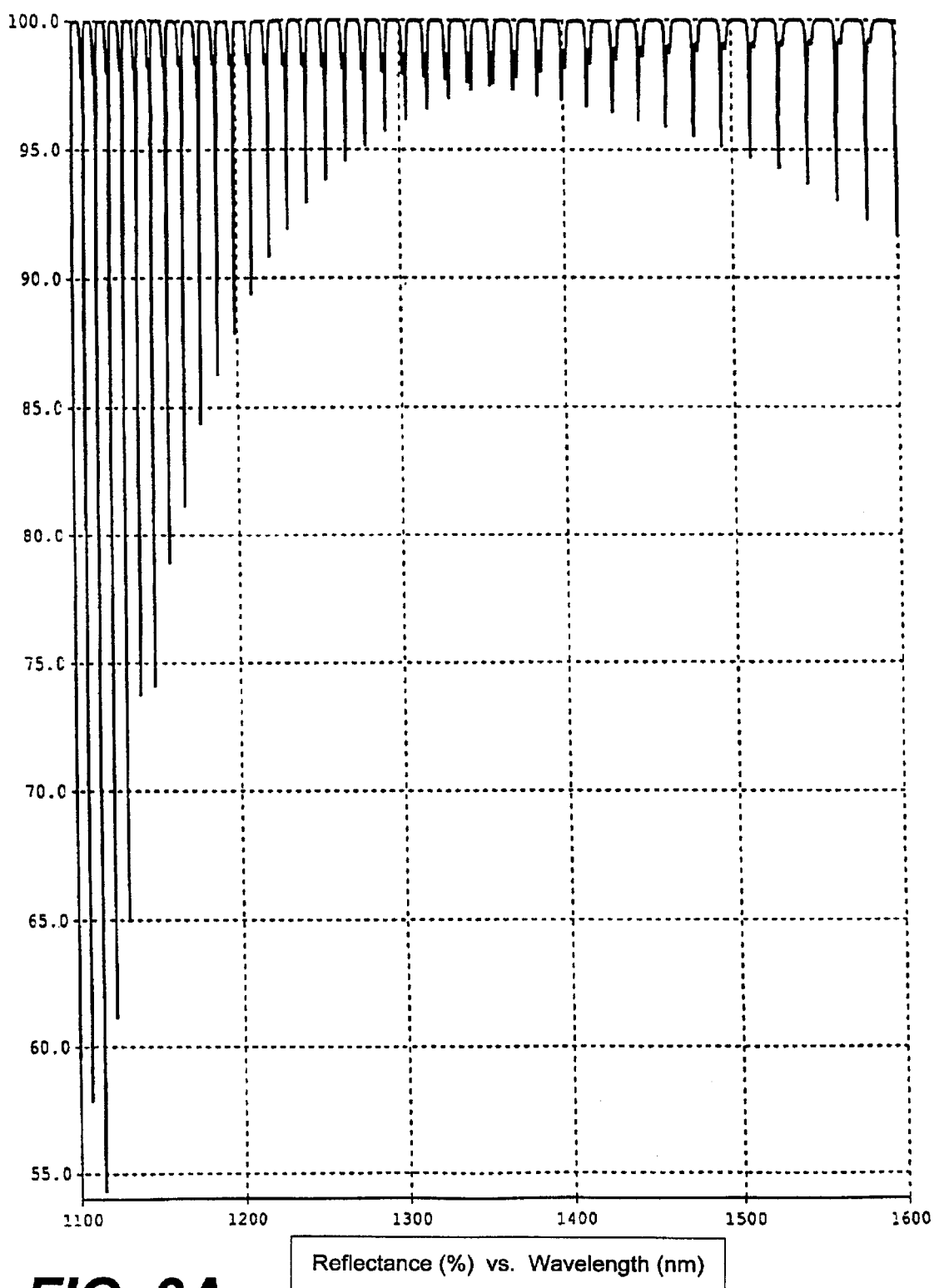
FIG. 3A is a chart of reflectance as a function of wavelength for a reflector constructed in accordance with FIG. 3C.
Figure 3B:
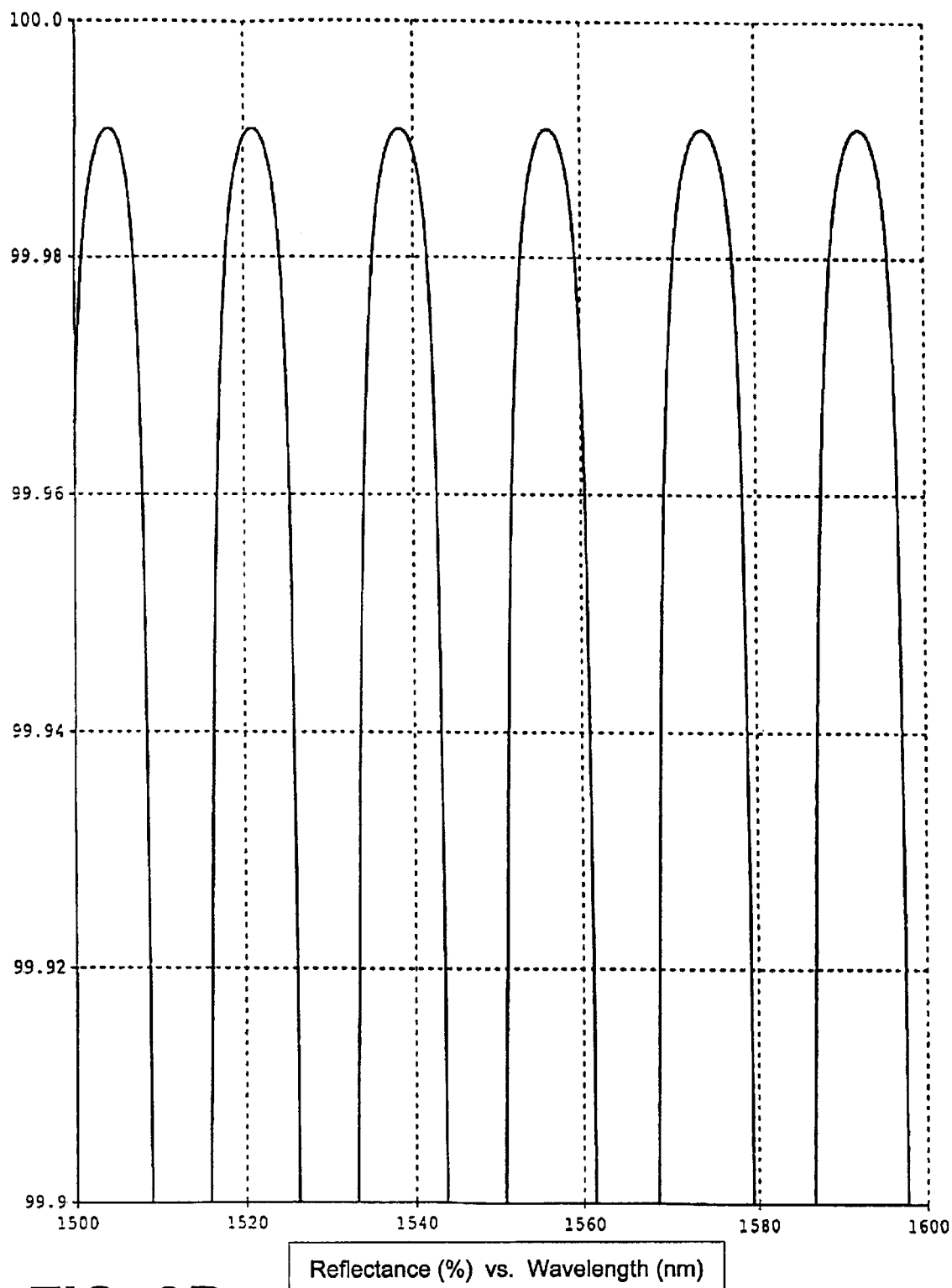
FIG. 3B is a chart of reflectance as a function of wavelength for a reflector constructed in accordance with FIG. 3C.
Figure 3C:
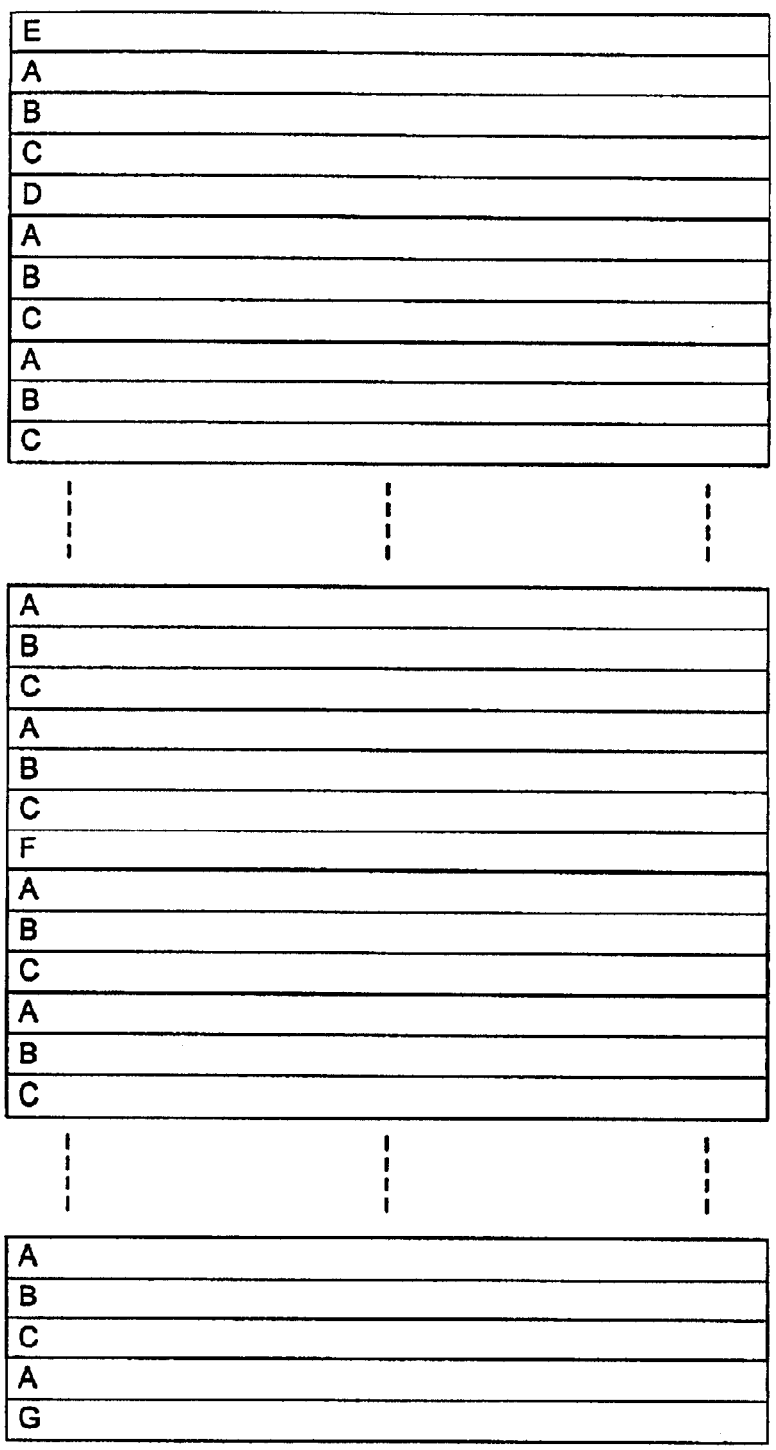
FIG. 3C is a diagram of a reflector.

As noted above, alternate layer structures may be employed to achieve desired reflectivity band characteristics. Referring now to FIGS. 3A–B, there are shown plots of the reflectance versus wavelength characteristics for another exemplary MRBR in accordance with the present invention and diagrammed in FIG. 3C. FIG. 3B graphs a much smaller portion of both axes than is shown in FIG. 3A. For both FIG. 3A and FIG. 3B, the reflectance is determined with unpolarized light impacting the MRBR perpendicularly through air. The MRBR reflectance characteristics shown in FIGS. 3A–B may be achieved by employing an MRBR having a layer structure either substantially similar to or based on/derived from the structure shown in FIG. 3C and defined by the following formula:

$$EABCD(ABC)^{60}ABCF(ABC)^{60}AG \qquad (2)$$

where the layer symbols in the formula indicate the following materials and thicknesses:

| Symbol | Material | Thickness |
| --- | --- | --- |
| A | $Al_2O_3$ | 0.7500 qw |
| B | $TiO_2$ | 0.7500 qw |
| C | $SiO_2$ | 0.7500 qw |
| D | Si | 0.7500 qw |
| E | Al | 1.0000 qw |
| F | Si | 0.7500 qw |
| G | Si | 0.7500 qw |

The reference wavelength is 1800 nm. By performing the thickness calculation, the following thicknesses are obtained:

| Symbol | Material | Thickness |
| --- | --- | --- |
| A | $Al_2O_3$ | 208.33 nm |
| B | $TiO_2$ | 146.74 nm |
| C | $SiO_2$ | 235.36 nm |
| D | Si | 99.26 nm |
| E | Al | 244.57 nm |
| F | Si | 99.26 nm |
| G | Si | 99.26 nm |

This MRBR has a total thickness of approximately 72.75 $\mu$m. In embodiments with different optical characteristics, resulting for example from different deposition techniques, different measurements will be appropriate. In one embodiment the MRBR is fabricated on an InP substrate.

As can be seen, the MRBRs of FIGS. 2 and 3 each have reflectivity bands closely spaced, around the 1550 ITU grid wavelengths, with reflectivities exceeding 99.98%. The troughs have lower reflectivities. In an embodiment, the MRBR comprises a plurality of reflectivity bands, each covering one of a contiguous set of 1550 ITU grid wavelengths, preferably where each reflectivity band has a peak reflectivity at or very close to the particular ITU grid wavelength covered by that reflectivity band. In other embodiments, the MRBR reflectivity bands may cover non-contiguous ITU grid wavelengths over a certain wavelength range (i.e., there are some ITU grid wavelengths not covered by a reflectivity band, in which lasing/monitoring is possible only for those ITU grid wavelengths for which there is a reflectivity band). In still other embodiments, over a given wavelength range, there may be some reflectivity bands that lie between ITU grid-covering reflectivity bands, i.e. there are more reflectivity bands than necessary to cover the ITU grid wavelengths in the range, in which case the "extra" reflectivity bands may be ignored or unused, depending on the application.

Figure 4A:
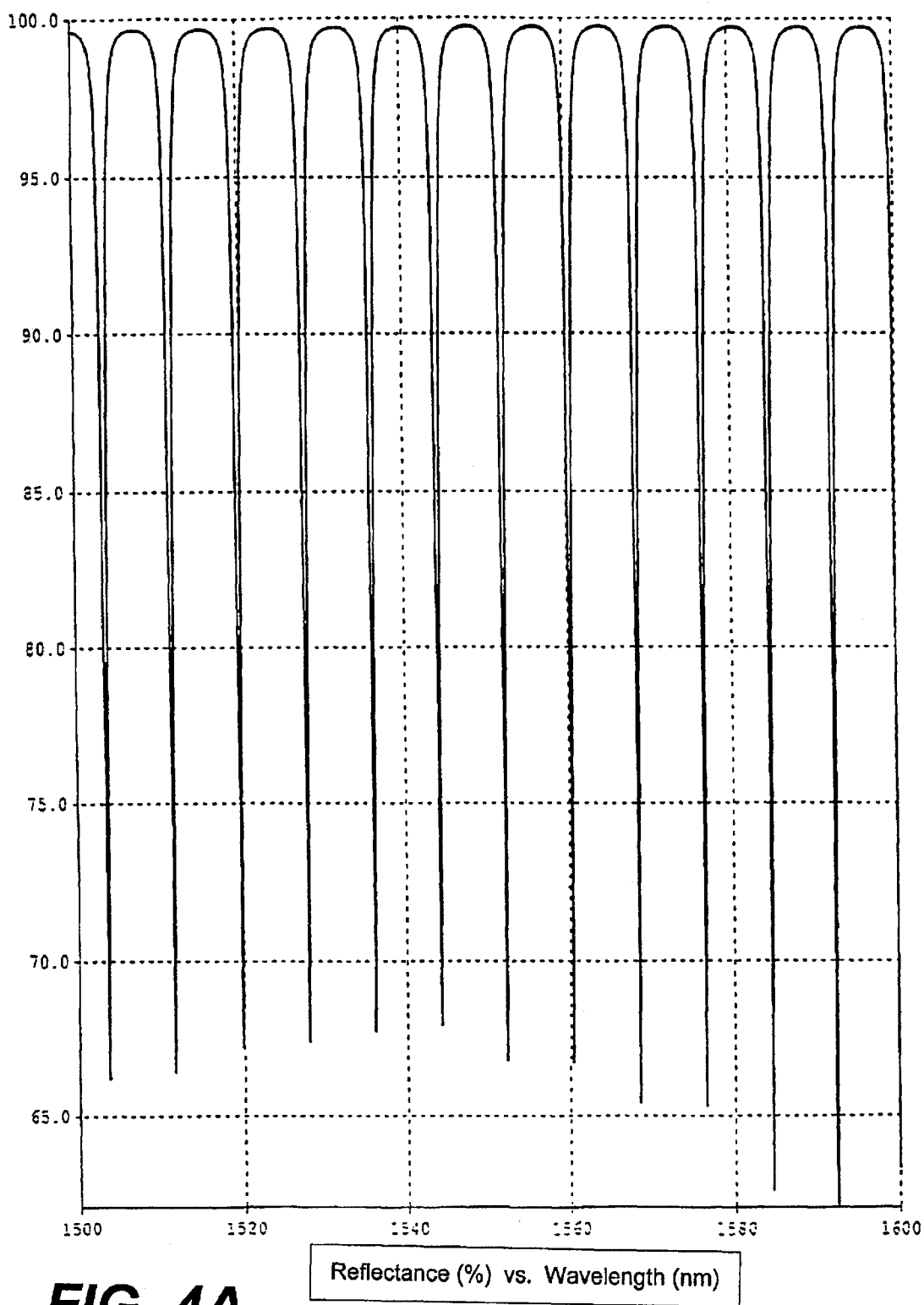
FIG. 4A is a chart of reflectance as a function of wavelength for a reflector constructed in accordance with FIG. 4C.
Figure 4B:
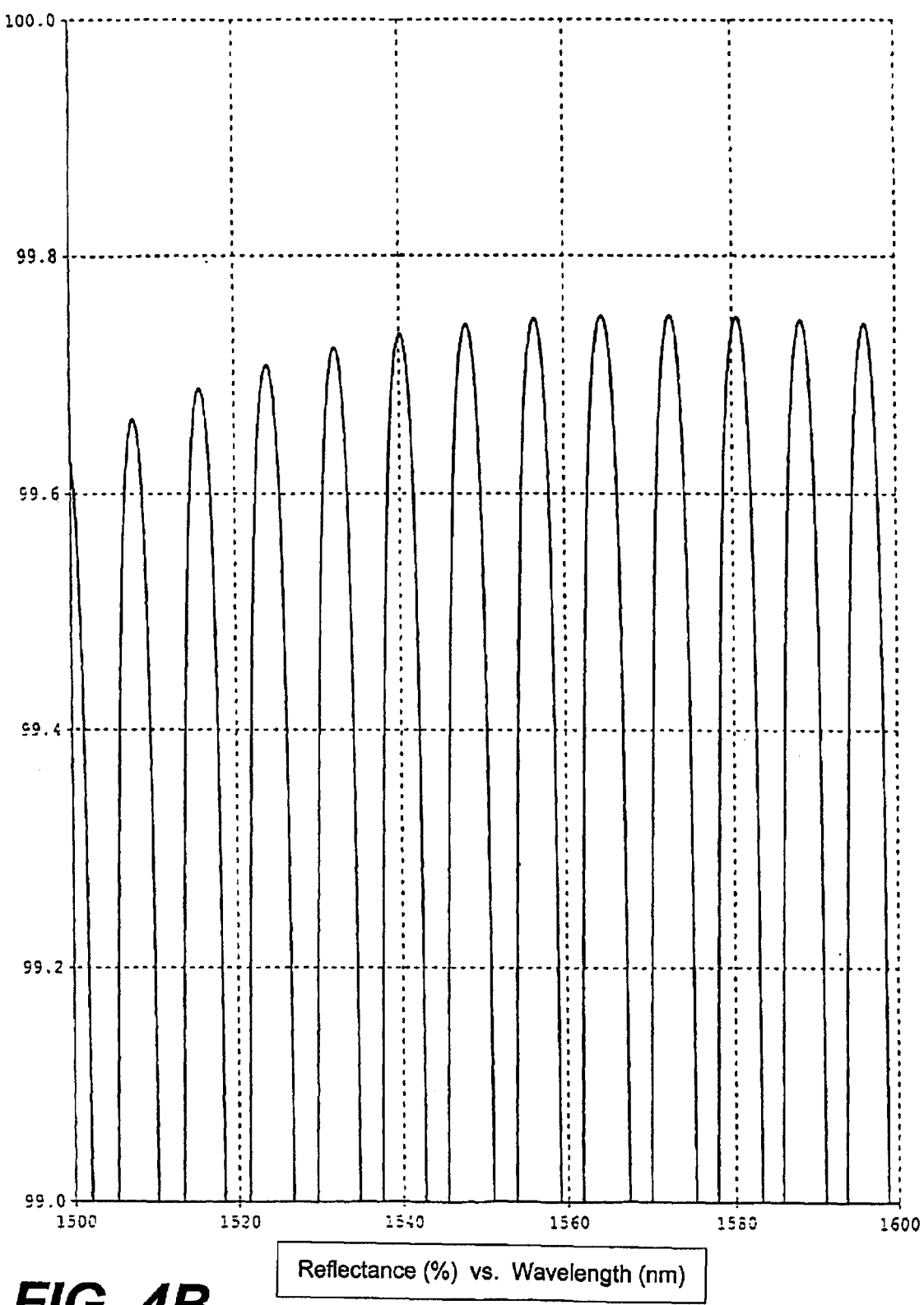
FIG. 4B is a chart of reflectance as a function of wavelength for a reflector constructed in accordance with FIG. 4C.
Figure 4C:
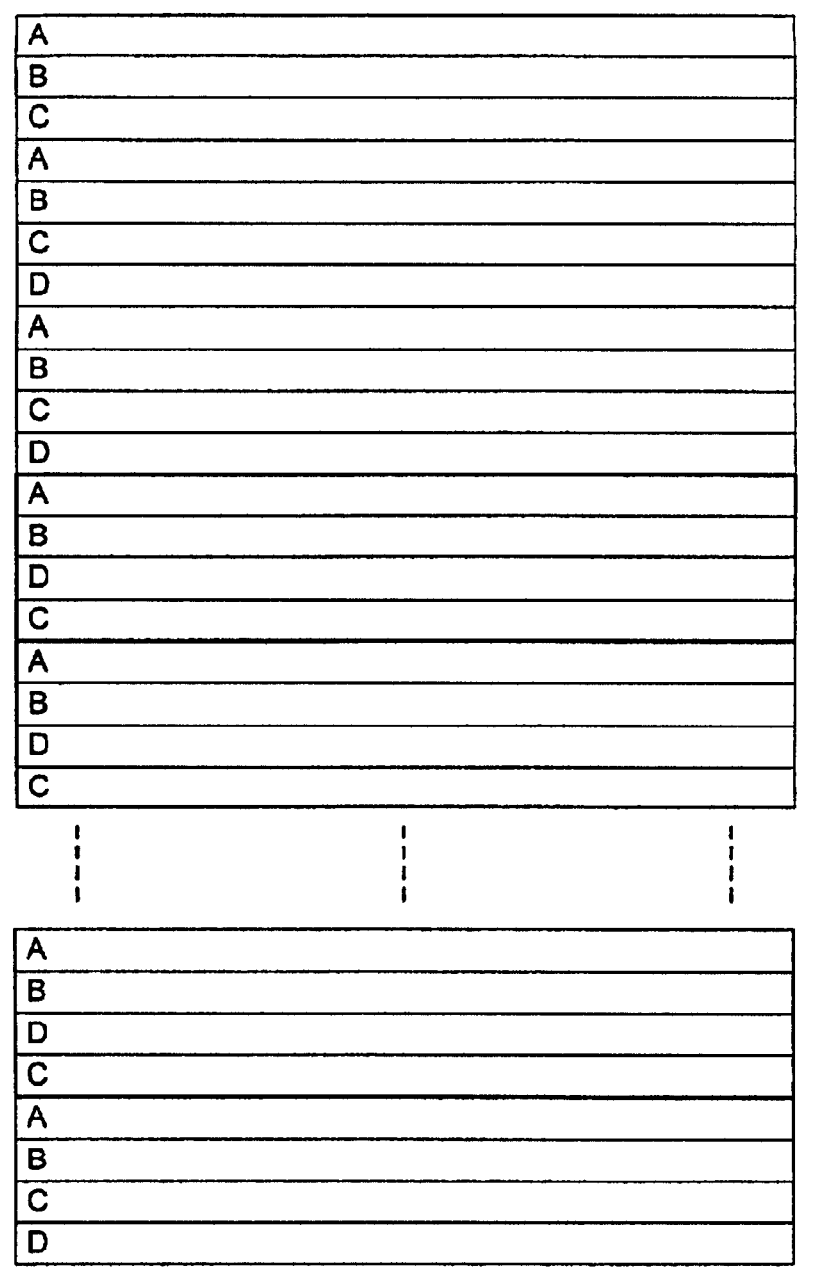

Referring now to FIGS. 4A–B, there are shown plots of the reflectance versus wavelength characteristics for another exemplary MRBR in accordance with the present invention and shown in FIG. 4C. FIG. 4B graphs a much smaller portion of the reflectivity axis than is shown in FIG. 4A. For both FIG. 4A and FIG. 4B, the reflectance is determined with unpolarized light impacting the MRBR perpendicularly through air. The MRBR reflectance characteristics achieved by the MRBR shown in FIGS. 4A–B may be achieved by employing an MRBR having a layer structure either substantially similar to or based on/derived from the structure shown in FIG. 4C and defined by the following formula:

$$ABC(ABCD)^2(ABDC)^{68}(ABCD) \qquad (3)$$

where the layer symbols in the formula indicate the following materials and thicknesses:

| Symbol | Material | Thickness |
| --- | --- | --- |
| A | $Al_2O_3$ | 0.7500 qw |
| B | $TiO_2$ | 0.7500 qw |
| C | $SiO_2$ | 0.7500 qw |
| D | Si | 1.0000 qw |

The reference wavelength is 2200 nm. By performing the thickness calculation, the following thicknesses are obtained:

| Symbol | Material | Thickness |
| --- | --- | --- |
| A | $Al_2O_3$ | 254.63 nm |
| B | $TiO_2$ | 179.35 nm |
| C | $SiO_2$ | 287.66 nm |
| D | Si | 161.75 nm |

This MRBR may be fabricated on an InP substrate, in an embodiment.

As will be appreciated from the Figures, the MRBRs of FIGS. 1–4 have multiple, relatively uniformly spaced reflectivity bands and peaks, where each reflectivity band has a reflectivity above the lasing threshold reflectivity, separated by reflectivity troughs, in which the reflectivity for all wavelengths in the wavelength band of the trough are lower than the lasing threshold reflectivity. As noted above, the particular lasing threshold reflectivity depends upon characteristics of the laser cavity such as the reflectivity of the other edge, the degree to which the active region absorbs particular wavelengths of light, and the degree to which atoms in the active region are stimulated to emit additions photons at particular wavelengths of light (gain). These characteristics can be modified under some circumstances. For example, the degree to which the active region is electrically pumped affects the optical gain (gain spectrum). In an embodiment, the lasing threshold reflectivity for a plurality of reflectivity bands may be the lasing threshold reflectivity with respect to the gain at or near its maximum, e.g., assuming a gain of full-width half-maximum (FWHM) or greater.

In the MRBR embodiments of FIGS. 1–4, the reflectivity peaks have a substantially uniform reflectivity profile (envelope), i.e. the reflectivities of the peaks (and thus of the reflectivity bands) are substantially the same, for at least a plurality of contiguous reflectivity bands. However, the reflectivity trough minima may vary with wavelength over the wavelength range of interest, in some embodiments, as illustrated in FIGS. 2A, 3A, and 4A, meaning that the envelope function or profile for the reflectivity trough minima varies with wavelength. For example, the profile for the reflectivity peaks shown in FIGS. 2A, 3A, 4A is substantially uniform over wavelength, while the profile for the reflectivity trough minima vary over wavelength in accordance with some function.

As will be appreciated, the MRBR of the present invention may have a variety of uses, including wavelength monitoring, selecting, and locking, as described below. In an alternative embodiment, the MRBR of the present invention may be designed with a reflectivity band profile which is substantially constant, but in which the reflectivity bands have a reflectivity not necessarily above any lasing threshold. Such an MRBR may be employed for wavelength monitoring and locking purposes, as described below. When the reflectivity bands of interest have a reflectivity above the lasing threshold reflectivity, the MRBR may also be employed as one of the mirrors of the laser cavity itself, as described below.

Multiple Reflectivity Band Reflector with Varying Reflectivity Band Profile

In an alternative embodiment, there is provided a reflector with a reflectivity band profile that varies as a function of wavelength in a known manner over a given wavelength range. For example, in an embodiment, the reflectivity band profile may vary monotonically over a tuning range, so that each reflectivity band has a unique reflectivity peak within the tuning range. In such an embodiment, the reflectivity bands need not all be above the lasing threshold reflectivity. For example, the reflectivity bands may have peak reflectances from 70% down to 10%, decreasing in appreciable increments (e.g., 2%, 5%, 10%) from band to band. Such a varying profile reflector may be utilized for laser wavelength monitoring of wavelengths within a given wavelength range of interest (e.g., a tuning range of a tunable laser). In other embodiments, the trough minima (tranmissivity peaks) may be used instead of the reflectivity peaks. Moreover, because each reflectivity peak (or trough minima/transmissivity peak, depending on the embodiment) of the MRBR within the wavelength range of interest has a unique reflectivity (at least with respect to its neighboring reflectivity peaks/trough minima), the current lasing wavelength can be determined without counting, as described in further detail below.

In an etalon, two flat, partially reflective parallel reflectors are typically separated by a parallel spacer. This gives rise to a Fabry-Perot interferometer type effect in which the interference of multiple beams in the reflective cavity results in constructive and destructive interference at certain wavelengths. The condition for constructive interference is that the light forms a standing wave between the two mirrors, i.e. the optical distance between the two mirrors must equal an integral number of half wavelengths of the incident light. There will be transmission (a transmissivity peak or reflectivity trough minima) where there is constructive interference, and reflection otherwise. Thus, the interference in the cavity gives rise to a series of equally-spaced transmission/reflection peaks. The distance (in wavelength) between adjacent peaks is known as the free spectral range (FSR) or channel separation. The FSR is a function of the physical mirror separation, i.e. the distance between the two reflectors of the etalon.

In an embodiment, a varying reflectivity band profile reflector in accordance with the invention is provided by a modified etalon type reflector having a pair of parallel reflectors, at least one of which has a reflectance that varies over the wavelength range of interest (e.g., the tuning range). The reflectors are separated by a spacer layer or air gap of a given thickness (cavity distance). The cavity distance between the reflectors determines the FSR and thus the channel spacing, and the combined reflectance characteristic of the reflectors provide an envelope function for the reflectivity and/or transmissivity peaks. Preferably, the reflectors are substantially symmetrical and have similar reflectivity profiles over the tuning range, preferably a monotonically varying reflectance over the tuning range. Thus, a varying reflectivity band profile reflector in accordance with an embodiment of the present invention will have a series of reflectivity bands within the tuning range, spaced in accordance with the distance between the reflectors, where the reflectivity peaks of these bands monotonically vary over this tuning range.

In an embodiment, the two reflectors of the varying reflectivity band profile reflector are quarter-wave stacks, e.g. dielectric DBR type stacks, separated by an intervening spacer layer. In an embodiment, a suitably adapted MRBR may of the present invention may be designed having a first quarter-wave reflector section, an intervening spacer layer, and a second quarter-wave reflector section, where the thickness of the spacer layer is selected to achieve the desired FSR, and the layer thicknesses, materials, and number of mirror pairs of the two reflectors are selected to achieve an overall reflectance envelope that varies in a desired manner (e.g., monotonically) over the a given tuning range. For example, the thickness of the qw layers of a qw stack may be selected based on a given reference wavelength to have a substantially high and constant reflectance over a wavelength range encompassing the reference wavelength, but which gradually tapers off at the end of this wavelength range. The reference wavelength may be selected so that this gradual tapering section occurs over the tuning range. For example, for a tuning range around 1550 nm (e.g., from 1540 to 1580 nm), a reference wavelength of about 800 nm may be selected for a given material system, to result in two qw mirrors each having substantially high and constant reflectance at 800 nm, but already gradually decreasing in the 1540–1580 nm range. The combined effect of such a varying reflectivity profile for the two reflectors of the etalon will be to bound or form a monotonically decreasing envelope around the reflectivity bands in the 1540–1580 nm range.

Figure 5A:
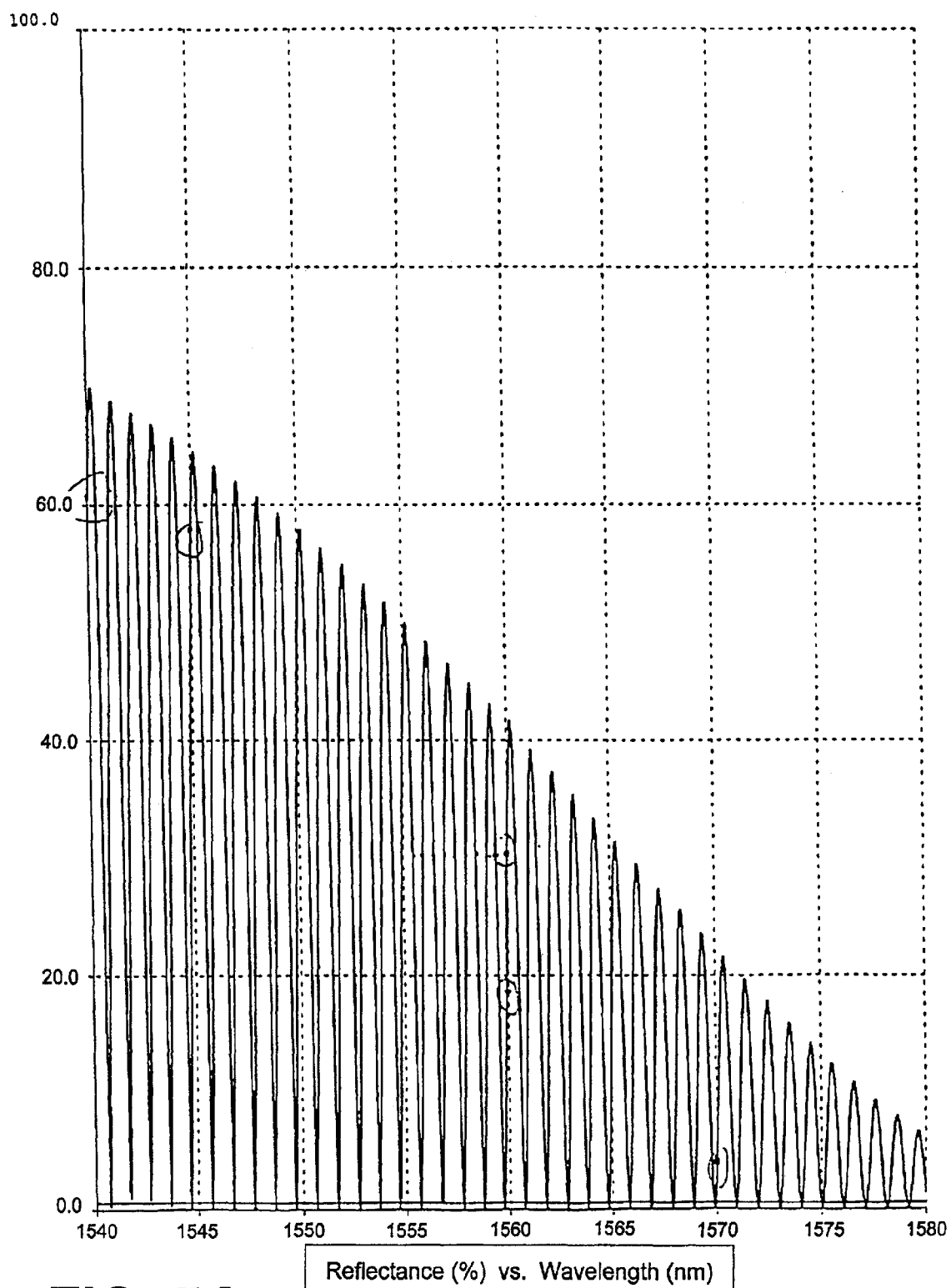
FIG. 5A is a chart of reflectance as a function of wavelength for a reflector constructed in accordance with FIG. 5B.
Figure 5B:
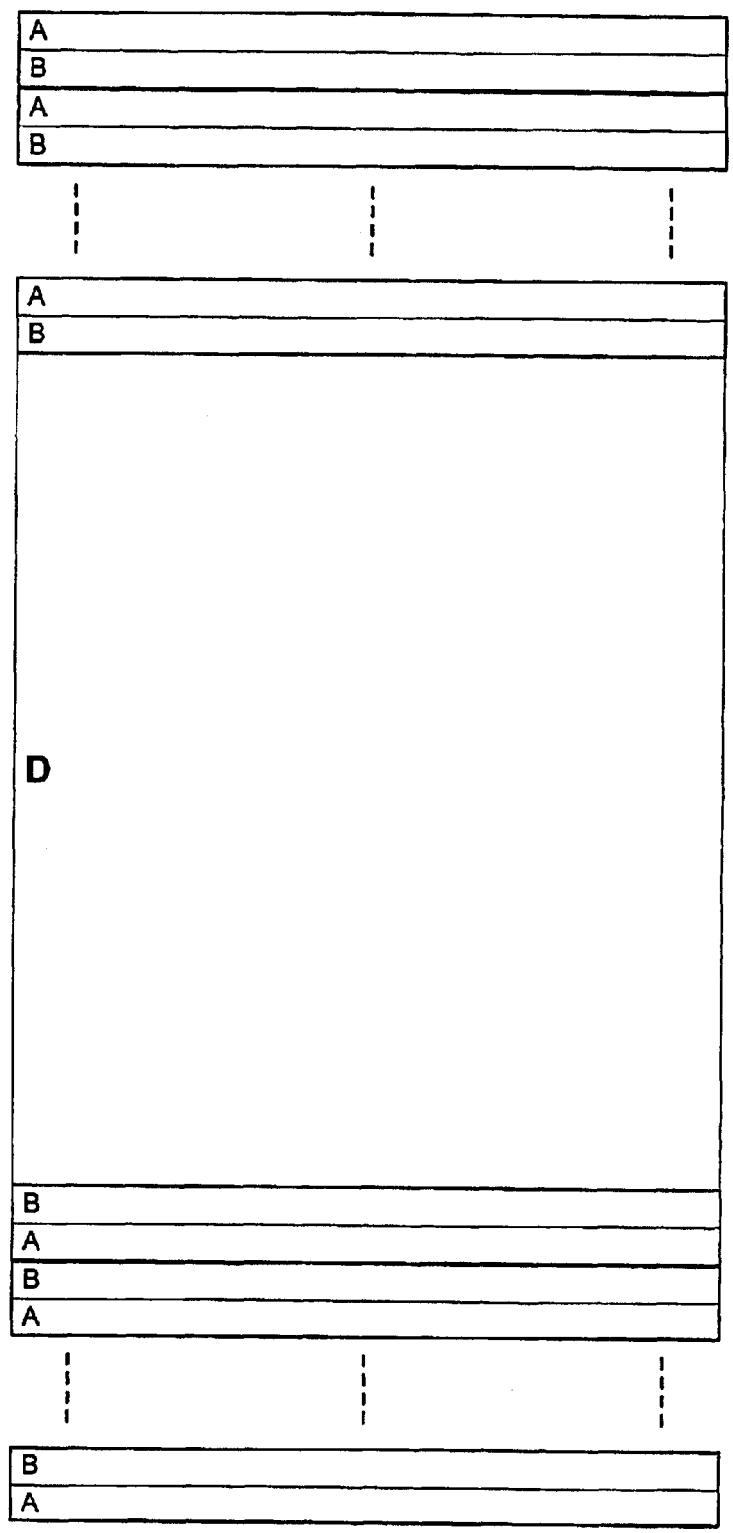
FIG. 5B is a diagram of a reflector.

Referring now to FIG. 5A, there is shown a plot of the reflectance versus wavelength characteristics for an exemplary MRBR with varying reflectivity band profile in accordance with the present invention and diagrammed in FIG. 5B. For FIG. 5A the reflectance is determined with unpolarized light impacting the MRBR perpendicularly through air. The MRBR reflectance characteristics shown in FIG. 5A may be achieved by employing an MRBR having a layer structure either substantially similar to or based on/derived from the structure shown in FIG. 5B and defined by the following formula:

$$(AB)^{10}D(BA)^{10} \quad (4)$$

where the layer symbols in the formula indicate the following materials and thicknesses:

| Symbol | Material | Thickness |
| --- | --- | --- |
| A | Al$_2$O$_3$ | 1.5000 qw |
| B | TiO$_2$ | 1.5000 qw |
| D | Si | 6000.0 qw |

The reference wavelength is 795 nm. By performing the thickness calculation, the following thicknesses are obtained:

| Symbol | Material | Thickness |
| --- | --- | --- |
| A | Al$_2$O$_3$ | 184.03 nm |
| B | TiO$_2$ | 129.62 nm |
| D | Si | 350.74 µm |

This MRBR may be fabricated with air on both sides, because the Si layer (D) is thick and strong enough to support the MRBR without an external substrate. As can be seen in FIG. 5A, over a wavelength range of 1540 to 1580 nm, the reflectivity bands (which are spaced substantially uniformly about 1 nm apart) monotonically decrease in reflectivity from about 70% to less than 10%. Layer D is a thick layer that separates the symmetric qw reflectors $(AB)^{10}$ and $(BA)^{10}$, thus giving rise to the etalon type effect and its associated reflectance characteristic. In particular, the thickness of layer D controls the peak separation or FSR. Changing the thickness of layer D therefore changes the channel spacing, and thus may be used to achieve a narrower or wider channel spacing, depending on the application. In an embodiment, the MRBR comprises two substantially symmetric reflectors, which may be quarter-wave stacks, separated by a distance, e.g. the thickness of layer D, which may be a material such as silicon, or air in other embodiments.

As will be appreciated, the MRBR with varying reflectivity band profile of the present invention may have a variety of applications, including wavelength monitoring, selecting, and locking, as described below.

Single Lasing-Reflectivity Peak Reflector

In an alternative embodiment, a reflector may be designed with a single, narrow, high-reflectivity band which is above the lasing threshold reflectivity. This single reflectivity band reflector may be referred to as an SRBR, or as a single lasing-reflectivity peak reflector. Like the MRBR, the SRBR is a distributed dielectric multilayer stack reflector. All other reflectivities outside the single reflectivity band, including other peaks and trough minima, are below this threshold. In an embodiment, this band is narrow and covers a single defined wavelength of a defined ITU grid set of wavelengths (e.g., around 1.55 µm). The lasing threshold reflectivity is the reflectivity required for one of the mirrors of a VCSEL or VECSEL employing the SRBR as one of its mirrors, i.e. the reflectivity required of the mirror when it forms part of the laser cavity of a VCSEL, e.g. at least 99.5%. Outside the single reflectivity band, all other reflectivities of the reflector are less than the lasing threshold, preferably less than some second threshold below the first one, e.g. less than 97%.

Figure 6A:
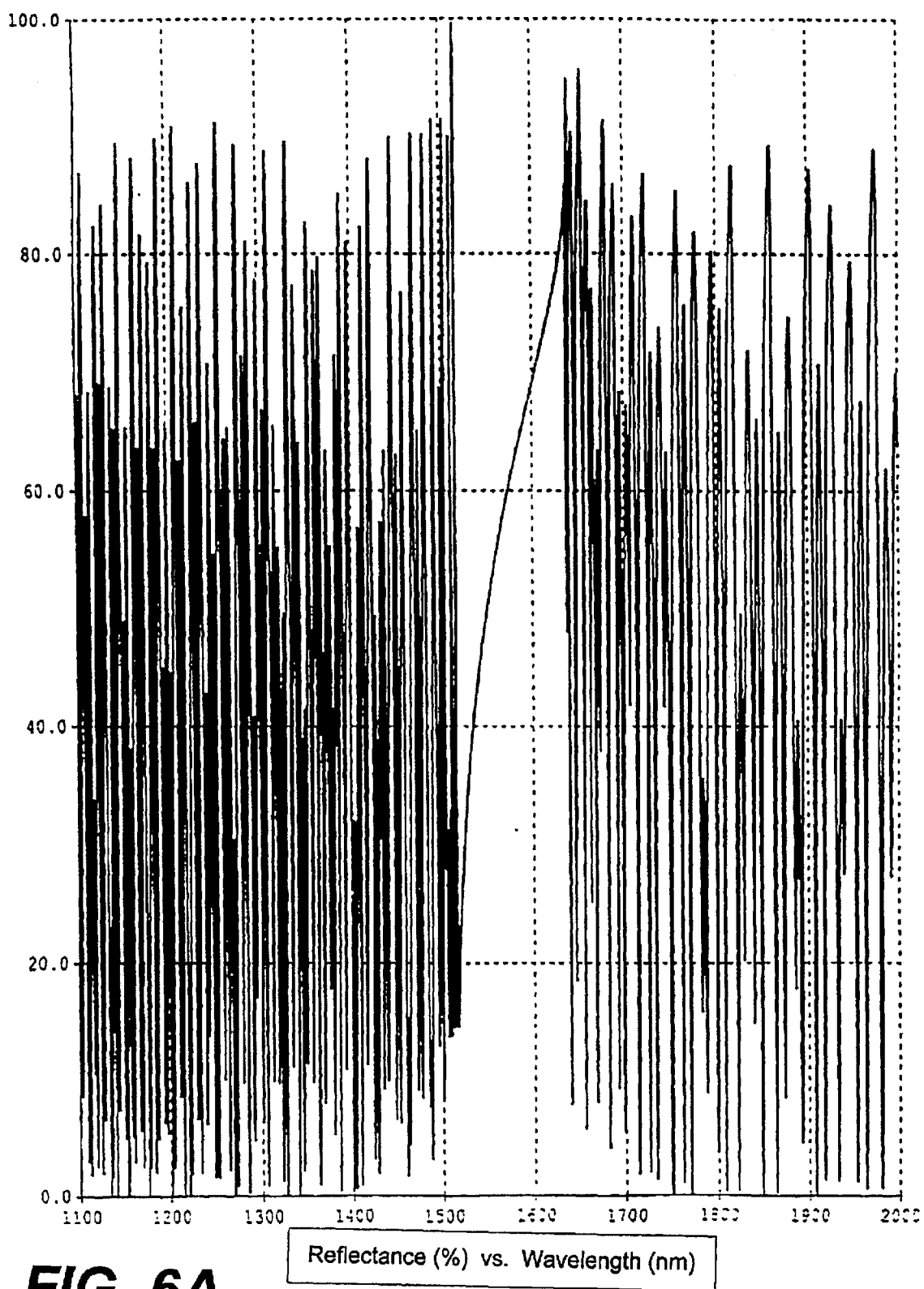
FIG. 6A is a chart of reflectance as a function of wavelength for a reflector constructed in accordance with FIG. 6D.
Figure 6B:
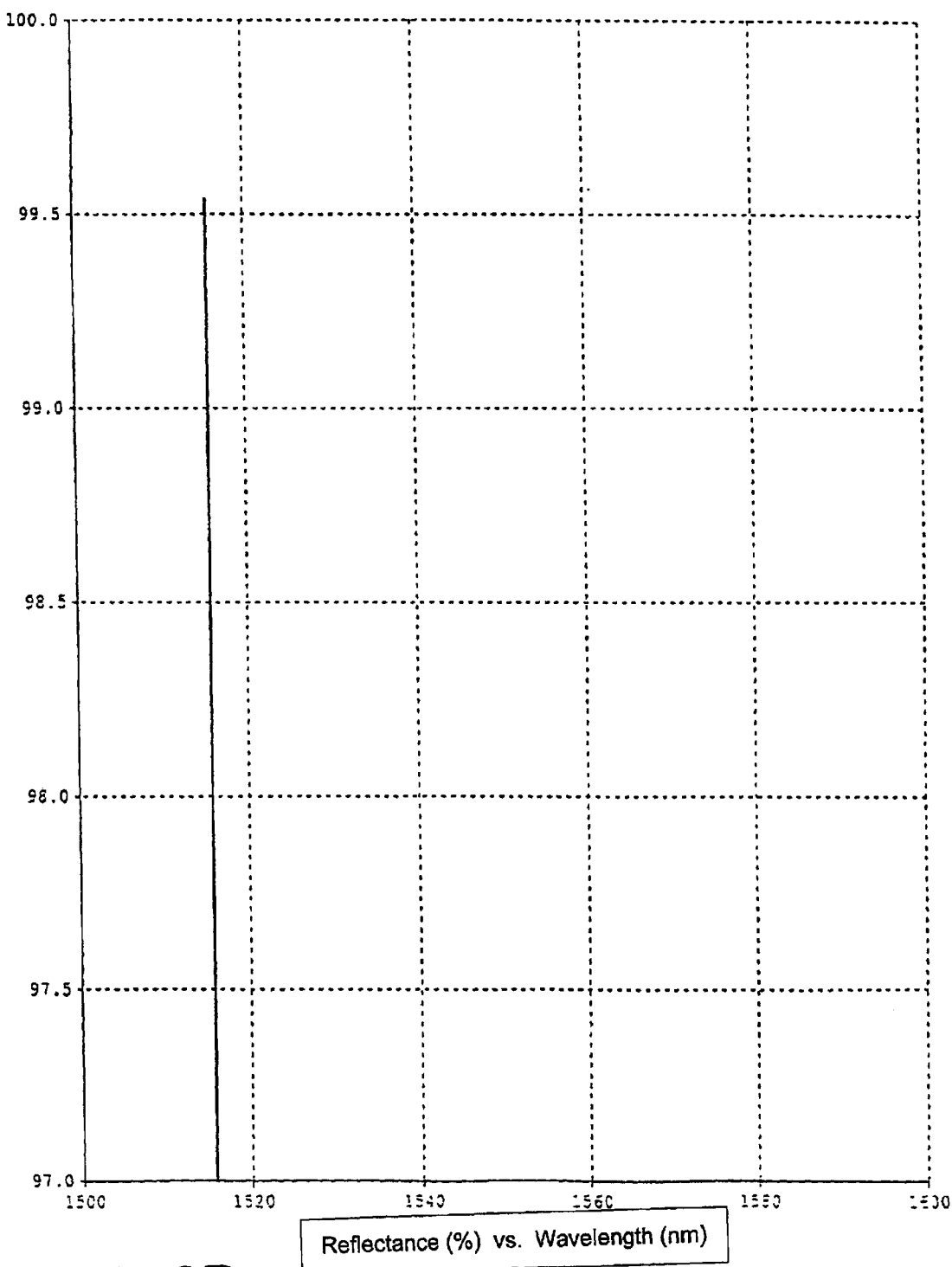
FIG. 6B is a chart of reflectance as a function of wavelength for a first implementation of a reflector constructed in accordance with FIG. 6D.
Figure 6C:
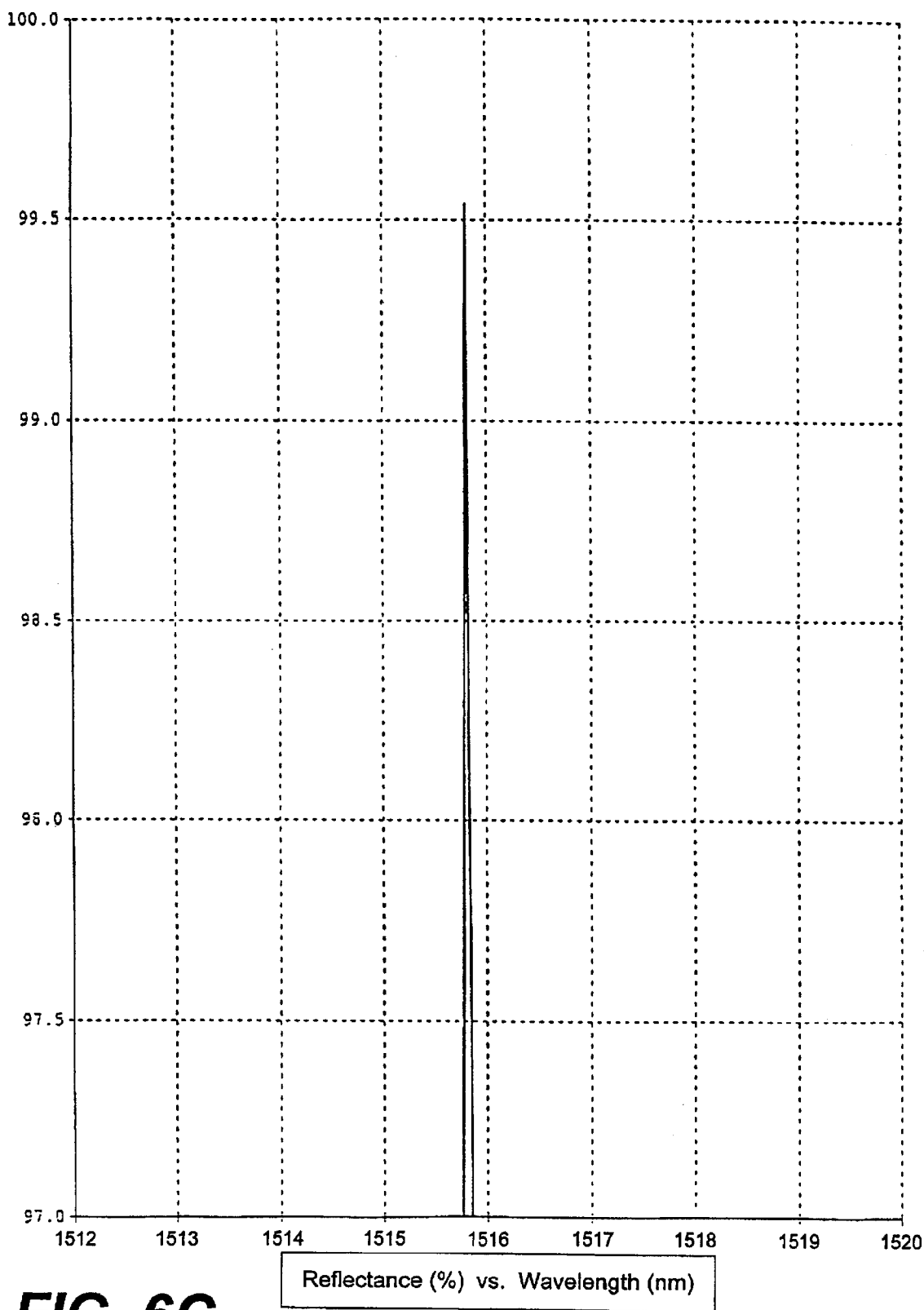
FIG. 6C is a chart of reflectance as a function of wavelength for a first implementation of a reflector constructed in accordance with FIG. 6D.
Figure 6D:
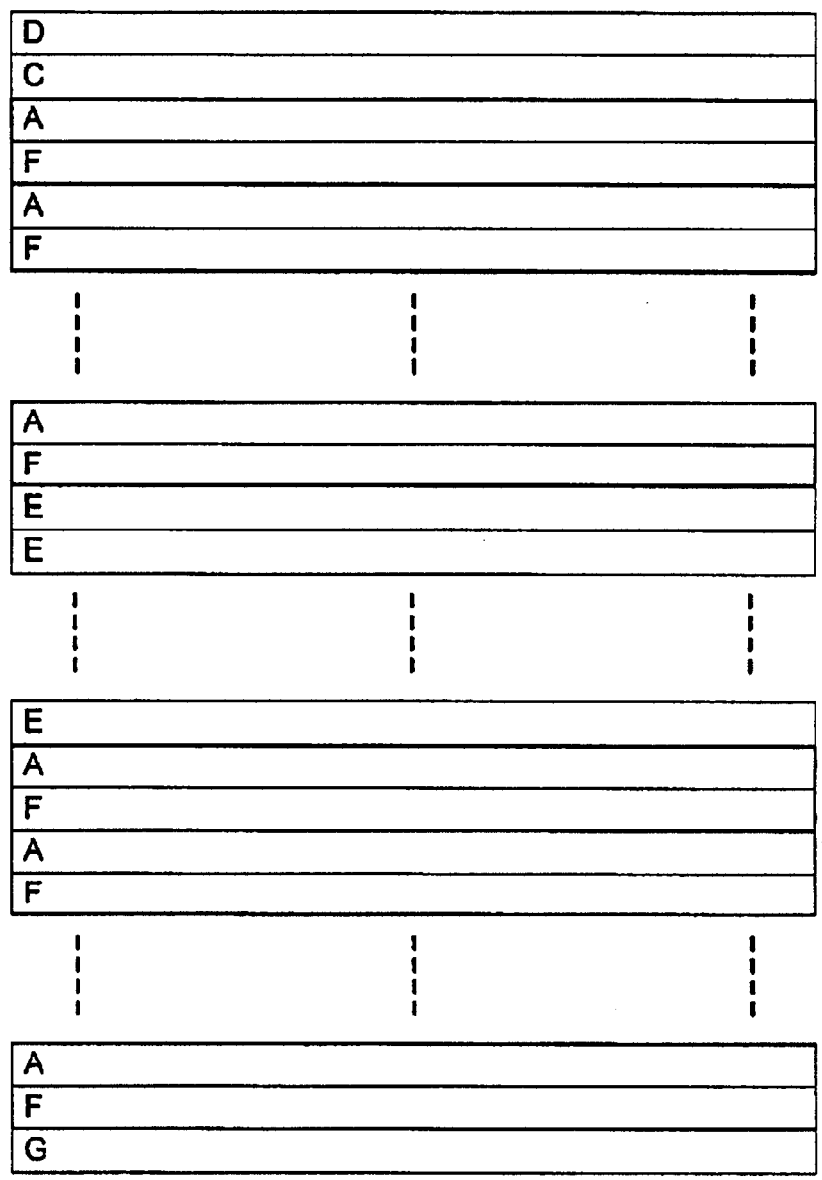
FIG. 6D is a diagram of a reflector.

Referring now to FIGS. 6A–C, there are shown plots of the reflectance versus wavelength characteristics for an exemplary SRBR, in accordance with the present invention and diagrammed in FIG. 6D. For FIGS. 6A–C the reflectance is determined with unpolarized light impacting the MRBR perpendicularly through air. The reflectance characteristics shown in FIGS. 6A–C may be achieved by employing an SRBR having a layer structure either substantially similar to or based on/derived from the structure shown in FIG. 6D and defined by the following formula:

$$DC(AF)^{40}(E)^{100}(AF)^{100}G \qquad (5)$$

where the layer symbols in the formula indicate the following materials and thicknesses:

| Symbol | Material | Thickness |
| --- | --- | --- |
| A | Al$_2$O$_3$ | 1.0000 qw |
| C | SiO$_2$ | 0.7500 qw |
| D | Si | 0.7500 qw |
| E | Si | 1.0000 qw |
| F | SiO$_2$ | 0.7500 qw |
| G | Al | 0.0100 qw |

The reference wavelength is 1800 nm. By performing the thickness calculation, the following thicknesses are obtained:

| Symbol | Material | Thickness |
| --- | --- | --- |
| A | Al$_2$O$_3$ | 277.78 nm |
| C | SiO$_2$ | 235.36 nm |
| D | Si | 99.26 nm |
| E | Si | 132.35 nm |
| F | SiO$_2$ | 235.36 nm |
| G | Al | 1.96 nm |

In one embodiment, this SRBR is fabricated on a suitable substrate, such as glass or InP. As can be seen, e.g. in FIG. 6C, a single reflectivity band is achieved having a peak reflectivity at approximately 1515.8 nm, which is very narrow (i.e., its peak is about 99.5% reflectivity and it covers, at 99% reflectivity, about 0.02 nm in wavelength, i.e. $\Delta\lambda_{99}$=0.02 nm). All other reflectivities of any other peaks (and therefore all trough minima) of the SRBR of FIG. 6 are less than 97%, i.e. less than a second threshold (97%) which is itself less than the lasing reflectivity threshold or reflectivity threshold (e.g., 99%) for the primary reflectivity band. In this case, if 99% is taken to be the lasing threshold reflectivity, then $\Delta\lambda_{99}=\Delta\lambda_{LT}$ =0.02 nm, and this mirror has a single, narrow reflectivity band above the lasing threshold, i.e. a lasing threshold reflectivity band encompassing a single with that reflectivity peak. In this case, the SRBR has a lasing threshold reflectivity band of about 0.02 nm in width, with a reflectivity peak wavelength of about 1515.8 nm. Lasing is thus possible at wavelengths approximately within this narrow lasing threshold reflectivity band, if other conditions are met (e.g., the laser is adequately powered, the lasing threshold reflectivity band includes a cavity mode, etc.). In this case, the reflectivity band can also be described as having a width of 0.02 nm at a reflectivity 0.5% below its peak reflectivity (99% is about 0.5% below 99.5%); or a width of far less than 1 nm at a reflectivity a 3% below its peak reflectivity (i.e., at about 96.5%).

Figure 7A:
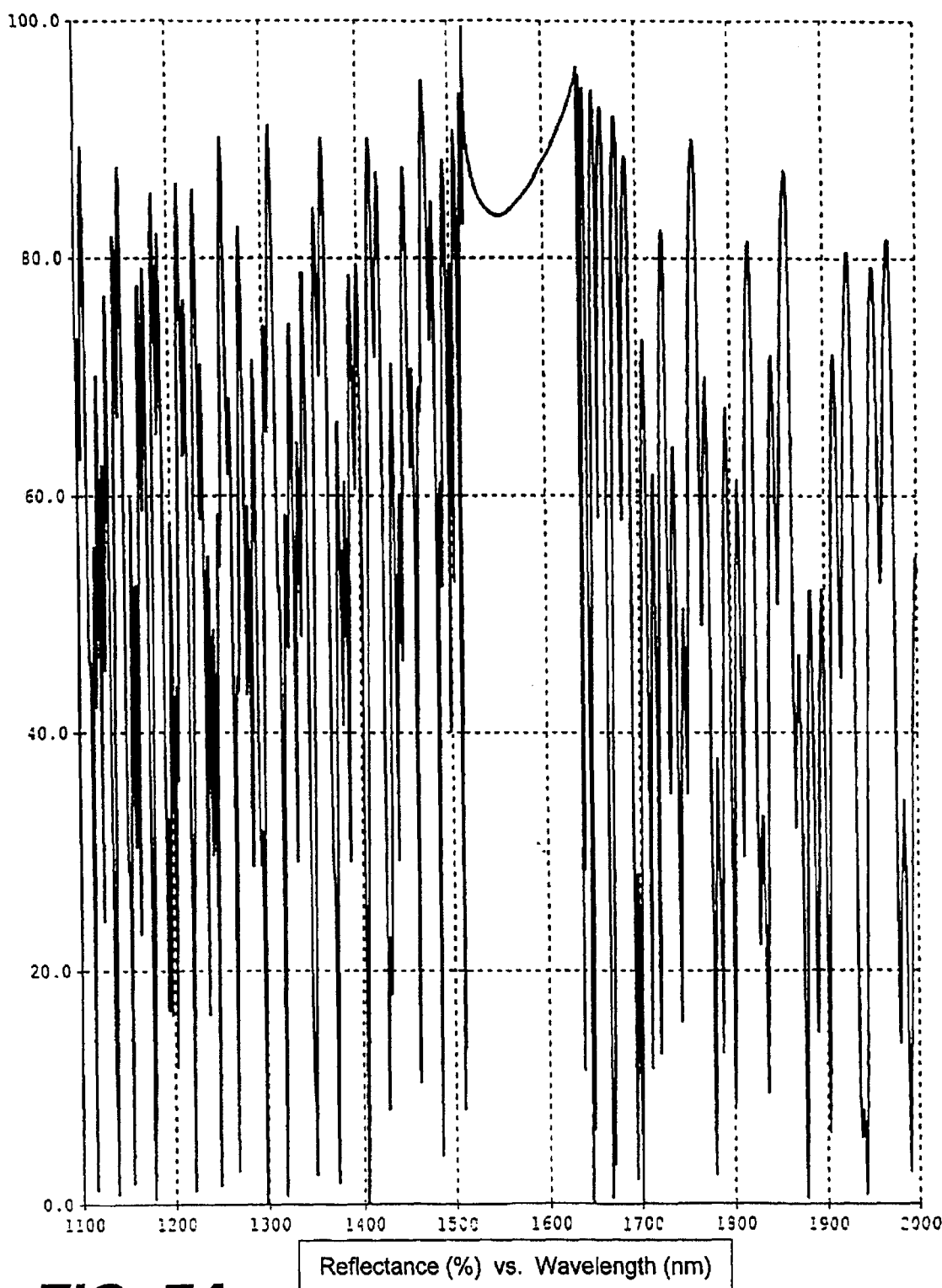
FIG. 7A is a chart of reflectance as a function of wavelength for a second implementation of a reflector constructed in accordance with FIG. 6D.
Figure 7B:
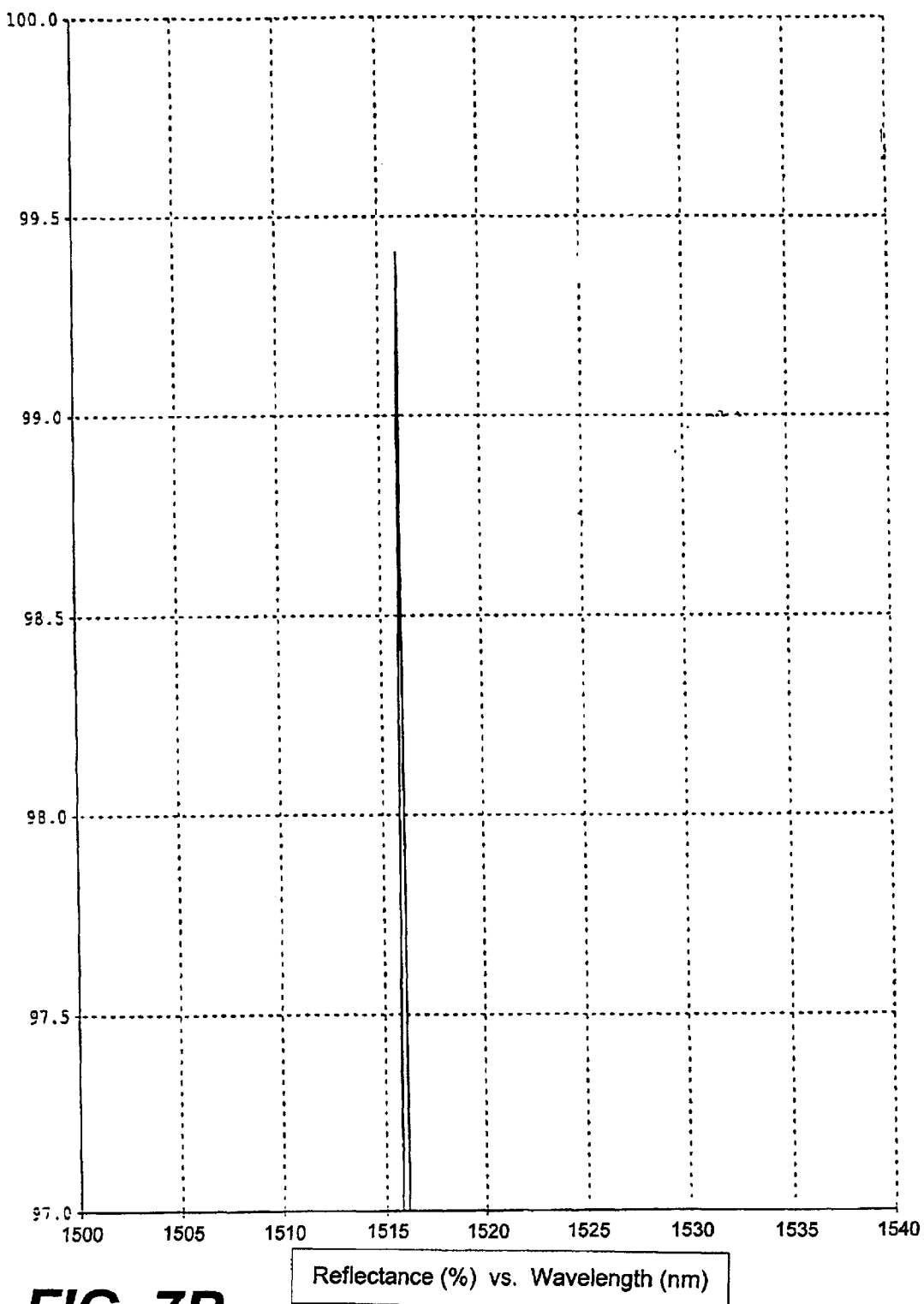
FIG. 7B is a chart of reflectance as a function of wavelength for a second implementation of a reflector constructed in accordance with FIG. 6D.

Referring now to FIGS. 7A–B, there are shown plots of the reflectance versus wavelength characteristics for an exemplary SRBR, in accordance with the present invention. For FIGS. 7A–B the reflectance is determined with unpolarized light impacting the MRBR perpendicularly through air. The reflectance characteristics shown in FIGS. 7A–B may be achieved by employing an SRBR having a layer structure either substantially similar to or based on/derived from the structure shown in FIG. 6D and defined by Formula (6), though different from the layer structure that results in the reflectance characteristics of FIGS. 6A–C in that the fewer quarter wavelength silicon layers, layer E, are included. FIG. 6D does not indicate the specific number of quarter wavelength silicon layers, layer E, other than indicating that there are more than three. Formula (6) is shown below:

$$(DC)^1(AF)^{40}(E)^{40}(AF)^{100}G \qquad (6)$$

where the layer symbols in the formula indicate the following materials and thicknesses:

| Symbol | Material | Thickness |
|---|---|---|
| A | $Al_2O_3$ | 1.0000 qw |
| C | $SiO_2$ | 0.7500 qw |
| D | Si | 0.7500 qw |
| E | Si | 1.0000 qw |
| F | $SiO_2$ | 0.7500 qw |
| G | Al | 0.0010 qw |

The reference wavelength is 1800 nm. By performing the thickness calculation, the following thicknesses are obtained:

| Symbol | Material | Thickness |
|---|---|---|
| A | $Al_2O_3$ | 277.78 nm |
| C | $SiO_2$ | 235.36 nm |
| D | Si | 99.26 nm |
| E | Si | 132.35 nm |
| F | $SiO_2$ | 235.36 nm |
| G | Al | 1.96 nm |

This SRBR may be fabricated on a suitable substrate, such as glass or InP. As can be seen, e.g. in FIG. 7B, a single reflectivity band is achieved with a peak reflectivity wavelength of approximately 1517 nm, which is highly reflective and very narrow (i.e., its peak is about 99.4% reflectivity and $\Delta\lambda_{99}$ is about 0.12 nm). All other reflectivities of the SRBR are less than 97%.

As will be appreciated, in various embodiments the SRBR of the present invention has a variety of uses, including wavelength monitoring, selecting, and locking, as described below.

In an alternative embodiment, the SRBR has one primary reflectivity band and peak, having a reflectivity which is higher than any other reflectivity peaks or troughs of the SRBR outside that reflectivity band, but which is not above the lasing threshold reflectivity. Such a reflector can be employed, for example, for wavelength monitoring purposes, but would preferably not be employed as one of the mirrors of a VCSEL laser cavity.

In the embodiments described above, the SRBR and MRBR of the present invention are distributed dielectric multilayer stack structures, i.e. they are reflectors that comprise a plurality of layers of dielectric material arranged in parallel so as to provide the desired reflectivity profile. In alternative embodiments, other materials may be employed for some or all of the layers, such as semiconductor materials.

Multiple Reflectivity Band Reflector for Laser Wavelength Monitoring

In an embodiment, the MRBR of the present invention (e.g., the embodiments illustrated in FIGS. 1–5 above) is employed in a laser apparatus for laser wavelength monitoring purposes, in accordance with an embodiment of the invention. As used herein, "monitoring" includes monitoring, controlling, tuning, selecting, and locking the output lasing wavelength of a given semiconductor laser with the use of the reflectors of the present invention. The MRBR is part of the laser cavity itself, in some embodiments, or is used outside the cavity for monitoring and locking purposes in other embodiments.

Figure 8:
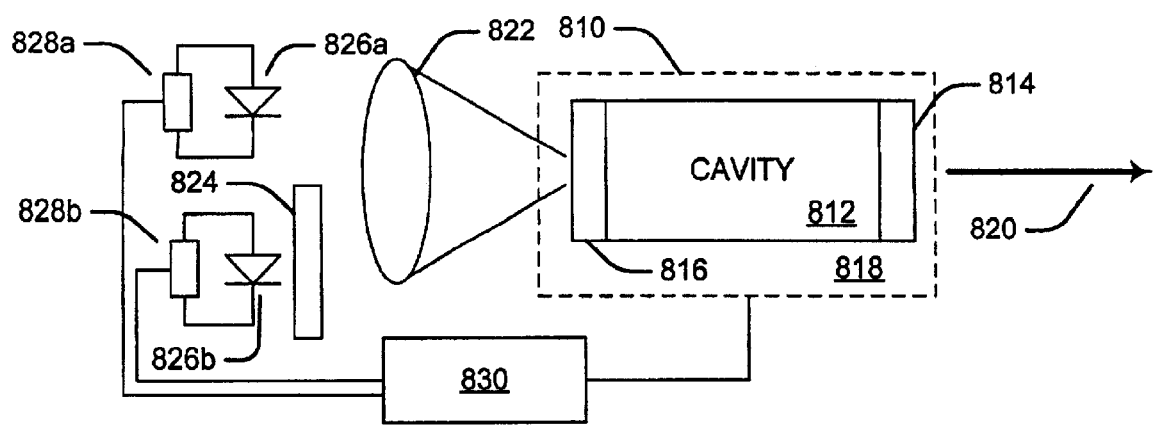
FIG. 8 is a diagram of a system for monitoring a laser.

Referring now to FIG. 8, there is shown an embodiment of the semiconductor laser with MRBR wavelength monitoring of the present invention. As illustrated in FIG. 8, a tunable edge-emitting laser 810 has an exit mirror 814 (with AR coating) and an HR (high reflectivity, but less than 100%) mirror 816, which define the laser cavity 812. In an embodiment, the laser 810 can emit over a wavelength range covering several ITU wavelengths, under the control of a variable tuning parameter (e.g. temperature, gain, current, etc.). One or more monitoring photodiodes, e.g. 826a, 826b, detect some of the cavity light 822 passing through the HR mirror 816.

An MRBR 824 covering the tuning range of the laser is used as a filter, to monitor the lasing wavelength and channel. In an embodiment, the MRBR 824 is a coating on a light-receiving surface of one of the photodiodes 826b, so that the photodiode 826b receives light filtered by the MRBR 824. In another embodiment, the MRBR 824 is not coated on the photodiode 826b, but is in the path of light 822 from the laser 810 to the photodiode 826b. The MRBR 824 preferably has a plurality of narrow reflectivity bands, preferably closely and substantially evenly spaced, over the tuning range of a given laser 810 whose wavelength is to be monitored, with each discrete target wavelength of the laser 810 corresponding to one of the MRBR 824 reflectivity bands' center wavelength.

Each of the photodiodes 826a, 826b is monitored by a corresponding circuit 828a, 828b. The amount of the light 822 transmitted through the HR mirror 816 that reaches the photodiodes 826a, 826b corresponds to a change in electrical characteristics of the photodiodes 826a, 826b. In one embodiment, the current flowing through photodiodes 826a, 826b changes in response to the amount of light 822 received. The circuits 828a, 828b detect the change in electrical characteristics and report that change to a processor 830. In on embodiment, a single circuit performs the functions of 828a, 828b, and 830.

In an embodiment, there is a one-to-one correspondence between the MRBR 824 reflectivity bands and the desired selectable (tunable) wavelengths of the laser 810. In other embodiments, the MRBR 824 can have other reflectivity bands between the target wavelengths, so long as the locking algorithm is sophisticated enough to take the "extra" reflectivity bands into account when locking and changing wavelengths.

Monitoring photodiode 826a is of the type typically used to monitor for power, in a feedback loop which controls current powering the laser 810 (to maintain a constant output power). However, light reaching 826b is first filtered by passing through the MRBR 824, which is coated onto the surface of the photodiode 826b. The reflectivity bands of the MRBR 824 may have approximately 99% reflectivity, at the center wavelength thereof, and 97% or less reflectivity between the bands (troughs). The HR mirror 816 may have, for example, 99% reflectivity. Thus, the HR mirror 816 transmits out the "back side" of the laser 810 about 1% of the light lasing in the cavity 812. This 1% light 822 impinges on both photodiode 826a and the MRBR 824. Of the light reaching the coated photodiode 826b, the light is either 99% reflected by a band reflectance, or reflected to a lesser degree if the laser 810 is off band. In another embodiment (e.g., in a preferred embodiment for the embodiment described with reference to FIG. 5A), the photodiode 826b is not coated, but the path of light 822 is through the MRBR 824. If the laser 810 is off band, more light reaches photodiode 826b, than is the case when the laser 810 is on band (locked) because the reflectance of the MRBR 824 decreases as the wavelength varies from the on band frequency for small amounts of variance.

Thus, when the laser 810 is properly tuned to emit at one of the desired wavelengths (e.g., one of the ITU wavelengths), only about 1% of the light 822 impinging on the MRBR 824 will be transmitted and reach photodiode 826b. If the wavelength starts to drift out of the reflectivity band, a larger fraction of the light 822 will be passed through the reflector/filter 824. The increase in light detected by photodiode 826b can permit the monitoring circuit/algorithm to determine that wavelength drift has occurred, and to adjust the tuning parameter (e.g., temperature, gain, and/or current) to get back into wavelength lock.

As will be appreciated, non-coated (or unblocked) photodiode 826a can be used as a reference photodiode to monitor power, and to provide a reference for photodiode 826b. Photodiode 826a is preferably disposed next to photodiode 826b, where possible, e.g. when an edge-emitting laser 810 is used, because the edge-emitting beam 822 disperses widely. It is not necessary, though, for photodiode 826a to be disposed next to photodiode 826b. The reference photodiode 826a can be used as a reference and to maintain power across channels (power equalizer). Photodiode 826b, normalized to photodiode 826a, can be used by suitable circuitry or algorithm, see for example FIGS. 14–15, programmed into a digital signal processor (DSP) 830 to determine when wavelength lock is being lost. This feedback can be used to tune the laser 810 so as to regain wavelength lock. For example, a temperature controller may be used to change the temperature of the laser interior 818, to adjust the lasing wavelength. In an embodiment, the temperature controller is located in the laser interior 818. In another embodiment, the temperature controller is proximate to the laser 810.

In an embodiment, a sufficiently sophisticated algorithm (e.g., an algorithm run by a microprocessor or DSP 830 that controls current injected into the gain region of the laser 810) may be employed to distinguish power decreases due to aging from changes in light detected due to wavelength drift. For example, if the laser 810 is at a proper wavelength (on band) then most of the light 822 is reflected by the mirror because it is in the reflectivity band. However, if the wavelength drifts, the light detected by photodiode 826b will increase. If the laser 810 loses power, however, due to aging, then the photodiode 826b will detect a gradual decrease in light. By contrast, loss of wavelength lock increases the light detected by photodiode 826b because less is reflected by the MRBR 824. Thus, if the wavelength is locked into a given channel, a measured increase in light means wavelength drift, and a decrease in light means aging-related power decreases. In an embodiment, this technique may be used even in the absence of photodiode 826a. In embodiments employing a separate, power-monitoring reference photodiode 826a, however, the algorithm can take this into account, by normalizing the measurement of photodiode 826b to those of photodiode 826a.

In alternative embodiments, other techniques, e.g. current injection or other techniques for changing the gain (and thus the wavelength), may be employed to tune the laser's wavelength. In a VECSEL (see FIGS. 10A–B) the effective length of the cavity can be modified resulting in a change in the wavelength of the laser output.

In an embodiment, as described above, the MRBR 824 is physically separated from the HR mirror 816. It may be stand-alone or part of (a coating on) the photodiode 826b. In an embodiment, the MRBR 824 may be tilted at a slight angle ("off angle") to minimize reflection (interference) back into the laser cavity 812.

Figure 9:
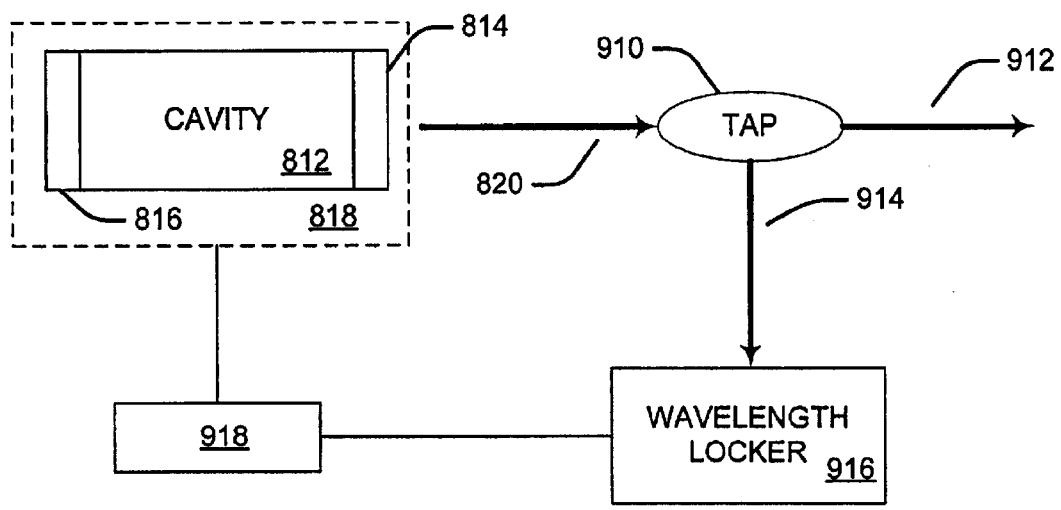
FIG. 9 is a diagram of a system for monitoring a laser.

In an alternative embodiment, only photodiode 826b is employed; photodiode 826a is absent. However, this approach may make it more complicated or difficult to monitor power independently of monitoring for wavelength lock. In another embodiment, for example where only photodiode 826b is employed, the MRBR 824 is not coated on the photodiode 826b, but is instead part of the HR mirror 816 (or coated thereon). Alternatively, other tapping techniques may be employed, e.g. a tap coupler 910, as illustrated in FIG. 9. In the system shown in FIG. 9, the wavelength locker 916 contains the photodiodes 826a, 826b, an MRBR coating photodiode 826b, and suitable circuitry to provide feedback for wavelength locking to the temperature controller 918.

In some applications, for higher frequency or more closely spaced tunable wavelengths, the reflectivity bands of the MRBR 824 need to be extremely close together. One way to achieve this is to design the appropriate MRBR layer structure (typically, a larger number of layers) to provide more closely-spaced reflectivity bands. However, it may be undesirable or impossible to fabricate a thick or complex enough layer stack structure to achieve very close reflectivity band spacing. An alternative technique is to combine an MRBR 824 having a smaller number of bands, in combination with an air-gap/etalon effect with the HR mirror 816. That is, MRBR 824 combines with HR mirror 816 and the air-gap therebetween, to form an etalon reflector which itself has a series of reflectivity bands. In this embodiment, the MRBR 824 is parallel to the HR mirror 816 and is separated by a small air distance sufficient to narrow the band spacing. Alternatively, instead of MRBR 824, a standard DBR may be employed instead, to combine with HR mirror 816 and an air gap to provide an etalon reflector with the desired spaced reflectivity bands.

In other embodiments, VCSELs (including VECSELs) may be employed instead of edge-emitting lasers. In such embodiments, the MRBR 824 may be used to filter tapped laser light before it reaches photodiode 826b.

In alternative embodiments (as described in further detail below), the MRBR may serve as one of the two cavity mirrors of a VCSEL (i.e., either the top or bottom mirror), or, it may serve as the external mirror of a VECSEL. In these cases, it can be more important that the reflectivity bands have a substantially constant reflectivity profile, and that is also above the lasing threshold reflectivity. This is because power should not change too much from selected wavelength to wavelength. It may be more expensive and/or difficult to fabricate sufficiently constant reflectivity band profile MRBRs, than to fabricate MRBRs with more variation in reflectivity from band to band. However, the latter type MRBR, with more unevenness in the band reflectivity from wavelength to wavelength, which may be cheaper and easier to fabricate, may be sufficient for use as an external wavelength monitor/locker, as shown in FIGS. 8 or 9.

When the MRBR is not used as one of the cavity mirrors of a VCSEL, it is more important that the reflectivity bands be sufficiently narrow and precisely spaced, than that they have uniform reflectivity from band to band, or even that the reflectivity of the bands be above the lasing threshold reflectivity mentioned above. So long as there is a reflectivity band covering each target wavelength, locking photodiode 826b will detect an increase in detected intensity when lock starts to be lost. In particular, photodiode 826b will see a change from whatever the detected intensity is while in lock, to a higher amount (for wavelength shift) or lower amount (for aging-cased decrease in power). This happens even if there is an uneven reflectivity peak profile. Alternatively, the rate of change may be measured; and/or the reflectivity peak profile may be known and taken into account by a suitable algorithm.

In an embodiment, a coarse tuning parameter (e.g. temperature, current) is used to adjust the wavelength of the laser. By monitoring the lasing wavelength with the MRBR of the present invention, a suitable algorithm can be employed to lock onto any of the center wavelengths of the target reflectivity band. For example, a given MRBR may have reflectivity bands centered at several substantially evenly-spaced wavelengths, $\lambda_1, \lambda_2, \ldots \lambda_N$. Initial calibration of a given laser can be done to correlate a given tuning parameter with a given wavelength window associated with one of the MRBR's reflectivity band wavelengths. Where an MRBR as shown in FIGS. 1–4 is employed, with a substantially unchanging reflectivity band profile, the coarse tuning parameter is expected to achieve a wavelength near the center wavelength of the corresponding reflectivity band. The tuning parameter can be varied under the control of a suitable algorithm, to reach the center wavelength of the reflectivity band (e.g., by minimizing the light detected by photodiode 826b, because maximum reflectivity, and thus minimum transmission, occurs when the laser is lasing at the center wavelength of a given reflectivity band as described in FIG. 14). Once it is known, e.g. by calibration, that the laser is locked onto a given wavelength, the coarse tuning parameter(s) can be varied to quickly select another wavelength corresponding to the center wavelength of another reflectivity band, see FIG. 15.

Figure 15:
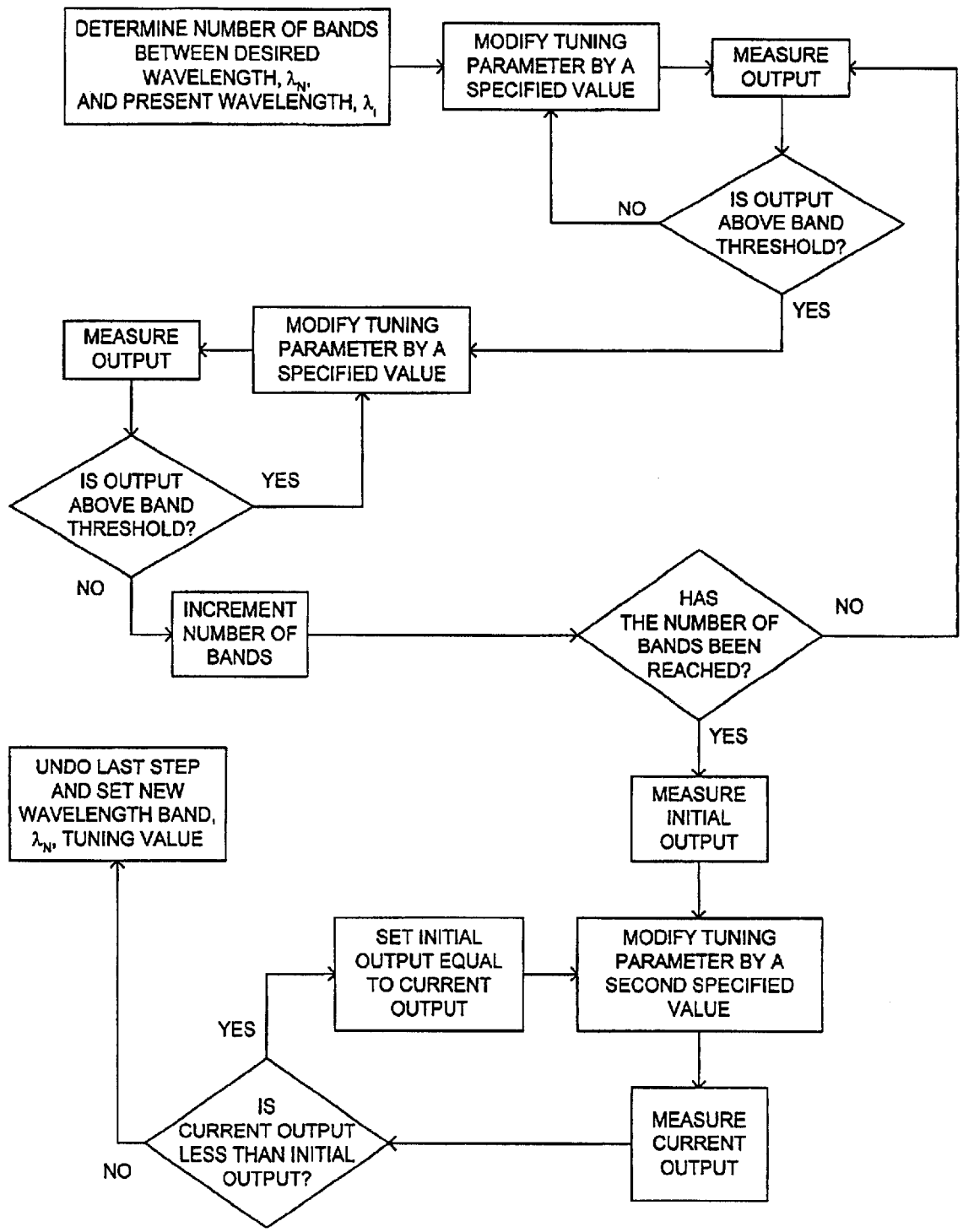
FIG. 15 is a flowchart depicting a method of changing wavelength band in a tunable laser.

Additionally, because the difference in light measured will be substantially greater in the troughs than at the peaks, simple integer counting can be used to know exactly which channel the laser is operating at, and, e.g., to quickly change channels (e.g., from channel 2 to channel 7, by counting 5 pulses). I.e., by use of a suitable algorithm, transitions over reflectivity bands can be counted, to precisely select another discrete wavelength. Such counting is shown in FIG. 15.

As with the embodiments described above with reference to FIGS. 8–9, the MRBR may be either part of the laser 810 or part of the monitoring module, e.g. coated on photodiode 826b, between photodiode 826b and the HR mirror 816, or it may form the HR mirror 816 itself (assuming, for the last embodiment, that it has sufficient reflectivity to permit lasing to occur).

Although an MRBR may be employed having a substantially constant reflectivity band profile for wavelength monitoring (whether or not the reflectivity bands have a reflectivity above or below a lasing threshold reflectivity), an MRBR may be employed which has a substantially varying reflectivity profile (i.e., a varying peak profile and/or trough profile) over the wavelength range of interest (e.g., tuning range). For example, an MRBR may be employed having a plurality of reflectivity peaks which have a monotonically varying reflectivity band peak profile over the tuning range. Alternatively, the trough minima may be utilized for monitoring/locking, where the trough minima have a known, varying trough profile. In the former case, each reflectivity peak has a unique reflectivity with respect to its neighbors, thereby establishing a unique reference for each discrete wavelength and thus permitting determination of the current lasing wavelength without counting.

Figure 14:
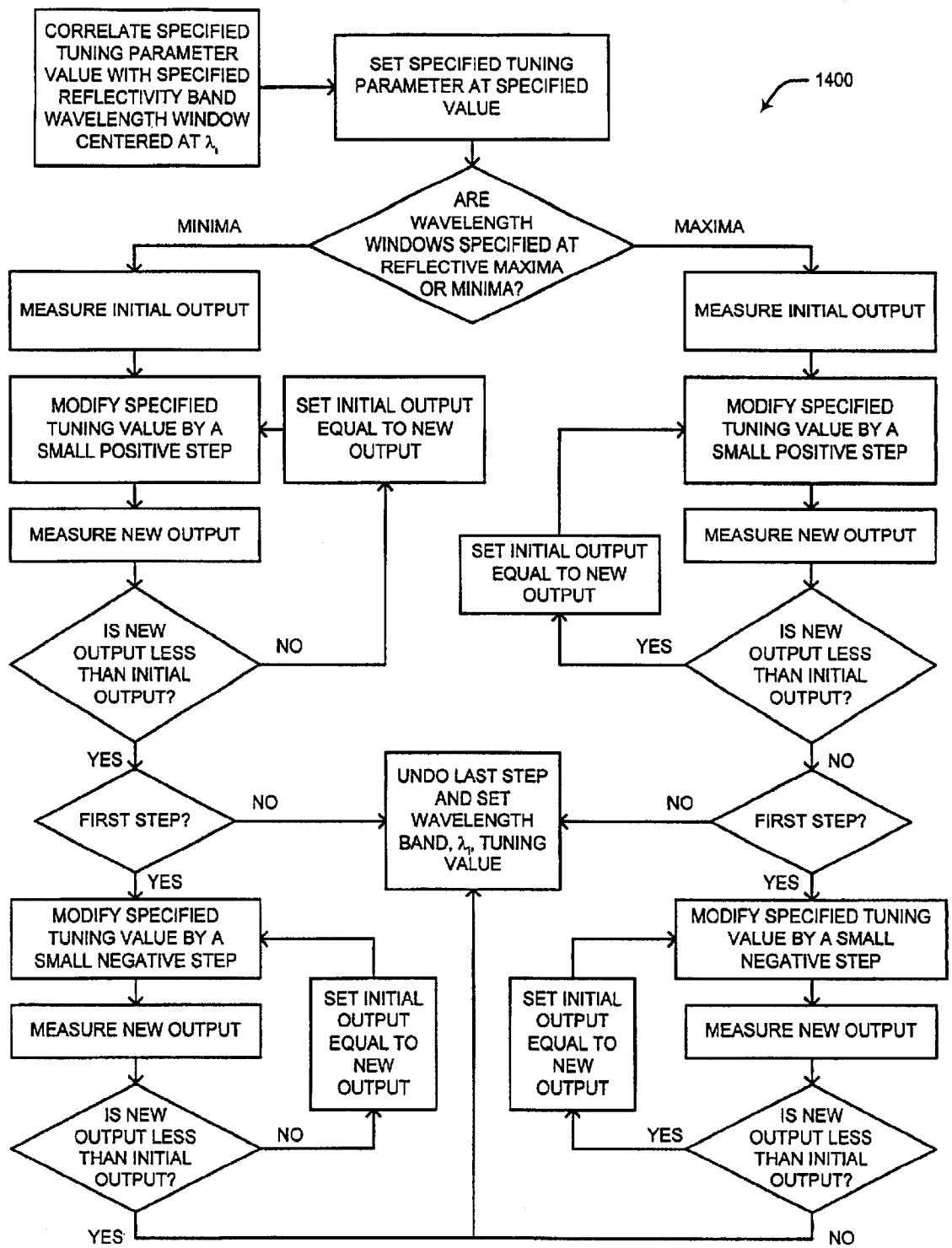
FIG. 14 is a flowchart depicting a method of configuring a tunable laser.

The MRBR of FIGS. 5A–B, for example, may be employed as the MRBR of the laser system of FIG. 8, or of a similar system not having photodiode 826a. In this embodiment, the MRBR has a monotonically varying amplitude profile over the tuning range of the laser. The MRBR has both reflectivity peaks and troughs (corresponding to transmissivity troughs and peaks, respectively). Either or both the reflectivity peaks and trough minima may be used to lock onto a selected wavelength, and also to determine which wavelength the laser is currently locked onto. In an embodiment, due to the unique reflectivity of each (or adjacent) reflectivity bands in the tuning range, the current lasing wavelength can be determined without counting. FIG. 14 shows this method of locking onto a wavelength of either a peak or a trough minima.

In alternative embodiments, an MRBR 824 may be employed which has a varying reflectivity trough profile as well, or instead of, a varying peak profile. For example, the MRBRs of FIGS. 2–4 have varying trough profiles. In this case, the reflectivity trough minima (e.g., transmissivity peak) may be used to achieve lock. The reflectivity trough minima may be much narrower than are the reflectivity band peaks, and thus may provide more precise wavelength monitoring and locking.

In further embodiments, the peak (or trough) profile need not vary monotonically. As long as each neighboring (adjacent) peak (or trough minima) varies from its neighbors in a known way, and to a great enough degree to permit differences in measured intensity to be adequately distinguished, an appropriate locking algorithm can determine the current lasing wavelength, without counting in some embodiments, and provide for wavelength locking as described hereinabove.

Thus, in some embodiments, an MRBR is employed which has a varying reflectivity profile (i.e., a varying peak profile and/or trough profile), in which neighboring reflectivity peaks (or trough minima, depending on which are used for locking) vary from each other in reflectivity substantially enough, and in a known way, so that an appropriate locking algorithm can determine the current lasing wavelength without counting. That is, the reflectivity profile is a non-constant function that varies sufficiently to permit the differences in reflectivity of the peaks (or trough minima) to provide useful information to the locking algorithm. The reflectivity profile may vary monotonically, for example substantially linearly, over the tuning/monitoring range, as in the MRBR of FIGS. 5A–B. As noted above, this MRBR has over a wavelength range of 1540 to 1580 nm, reflectivity band peaks spaced substantially uniformly about 1 nm apart which monotonically and substantially linearly decrease in reflectivity from about 70% to less than 10%. In particular, as illustrated in FIG. 5A, this MRBR has at least at least fourteen reflectivity (wavelength) bands over a certain range, where the reflectivity peaks vary in reflectivity by more than 20%, but each deviates by less than 5% reflectivity from a linear relationship of length of wavelength to percentage of reflectance.

In other embodiments, other MRBRs having substantially varying reflectivity profiles may be employed. For example, other structures may be employed for the MRBR to give rise to a substantially linear reflectivity profile in which each reflectivity peak within the tuning range varies in reflectivity by at least a minimum threshold amount (e.g., 5% or 10%) from its neighboring peaks, and deviates by less than a maximum tolerance (e.g., 5%) from a linear relationship of wavelength to percentage of reflectance. In other embodiments, the reflectivity profile may be monotonic but non-linear, where the peaks deviate from this function by less than some maximum tolerance. Or, the reflectivity profile function may be non-monotonic, such as the shape of the trough profile of the MRBR shown in FIG. 3A.

In an embodiment, the reflectivity peaks each correspond to one of the target lasing wavelengths of laser 810. In one embodiment, the peak of each reflectivity band (i.e., its center wavelength) corresponds to the target wavelength. In this embodiment, if an MRBR having a varying reflectivity band profile is employed, then each selectable wavelength corresponds to a unique reflectivity (peak or trough minimum), and thus to a unique detected intensity upon lock (normalizing for age- or power-related changes in intensity). Thus, a locking algorithm may be employed, which can keep the laser locked onto the desired wavelength (by adjusting the laser's tuning parameter to prevent wavelength drift), and which can also determine which wavelength the laser is currently locked onto, without the necessity of the counting described above for MRBRs having substantially constant reflectivity band profiles.

Wavelength drift in either direction will result in an increase in light detected by photodiode 826b. Therefore, a sufficiently sophisticated locking algorithm is preferably employed, which can determine in which direction the drift is occurring and correct it. For example, historical data or other data may be consulted to make a best guess as to which direction the wavelength is drifting, in cases of increased light detection by photodiode 826b. Or, an arbitrary guess may be made. In either case, the algorithm adjusts the laser wavelength, hopefully in the appropriate direction, through the use of negative feedback, until lock is regained. If the adjustment exacerbates wavelength drift, it can be assumed that the wrong assumption was made and corrections in the appropriate direction can be made. See FIG. 14.

In another embodiment, a specified reflectivity point on the "side" of the band, less than the maximum reflectivity, is selected to correspond to the target wavelength. In such an embodiment, the direction of wavelength drift is unambiguous. In this case, the locking algorithm constantly controls the tuning parameter to maintain the specified point on the corresponding reflectivity band. In an embodiment, a reference photodiode 826a may be used to correct for changes in intensity caused by factors other than wavelength drift, e.g. aging. Another advantage of this approach is that it is not as critical to design and fabricate an MRBR 824 where each band has its center wavelength precisely matched with the target wavelengths. Instead, it is sufficient that there be at least one reflectivity band (or side) per target wavelength, with a known profile, so that the exact target wavelength can be correlated with a given percentage reflectivity of the peak reflectivity of the corresponding band. For example, this is indicated by the exemplary solid dots on the sides of some of the reflectivity bands of FIG. 5A. (In an alternative embodiment, multiple target wavelengths can correspond to different reflectivities on the same side of a given reflectivity band.) In such an embodiment, the monitoring algorithm is still able to quickly determine the current lasing wavelength without counting, by finding the peak of the current reflectivity band (e.g., during an initialization period) and correlating its reflectivity (or its proxy, the lasing intensity measured by photodiode 826b) with the appropriate band. Thereafter, the algorithm can back off of the center of the band to find the appropriate place on its side that corresponds with the target wavelength desired.

The varying-profile MRBR 824 may be employed either in conjunction with power-monitoring photodiode 826a, or in an embodiment in which only photodiode 826b is employed. Preferably, photodiode 826a is used to stabilize power, and photodiode 826b (normalized to photodiode 826a) is used to detect wavelength.

VECSEL Employing Single Lasing-Reflectivity Peak Reflector

The SRBR of FIG. 7 is a distributed (multilayer stack) reflector with a structure that gives rise to a single, narrow, high-reflectivity peak or band, somewhere within a given wavelength range of interest, as described above. In an embodiment, the single reflectivity band is a narrow lasing threshold reflectivity band (having reflectivity above a lasing threshold reflectivity of, e.g., 99%) covering a single wavelength of an ITU grid set of wavelengths (e.g., one of those around 1.55 $\mu$m). I.e., $\Delta\lambda_{99}$ for the SRBR covers one of the ITU grid wavelengths. The high reflectivity figure corresponds to the lasing threshold reflectivity for a VECSEL (e.g., typically 99% to 99.5%), at or near the gain spectrum maximum. Outside the single high-reflectivity band all other reflectivities of the SRBR in the wavelength range of interest are less than some second reflectivity threshold below the lasing threshold reflectivity, e.g. less than 97%.

For a given set of parameters, $\Delta\lambda_{99}$ encompasses a single wavelength of the ITU grid, but the parameters can be changed to adjust $\Delta\lambda_{99}$ to cover another ITU grid wavelength. For example, for a given distributed dielectric multilayer stack structure, changing the refractive index of one or more layers of the multilayer stack can shift the wavelength peak, i.e. the $\Delta\lambda_{99}$. This may be done by changing the temperature of the SRBR, although this can be a slower way to change the reflectance spectrum of the SRBR than other techniques, such as piezoelectric techniques. For example, some of the layers of an SRBR can consist of piezoelectric or electrooptic material, in which case a voltage source can be used to provide a voltage (electric field) across the piezoelectric layers of the SRBR to vary the refractive index, which can shift the reflectivity spectrum of the SRBR.

An SRBR may be utilized for a variety of applications, including use for wavelength locking onto a fixed wavelength or for use as the tuning element in a tunable VECSEL.

Figure 10A:
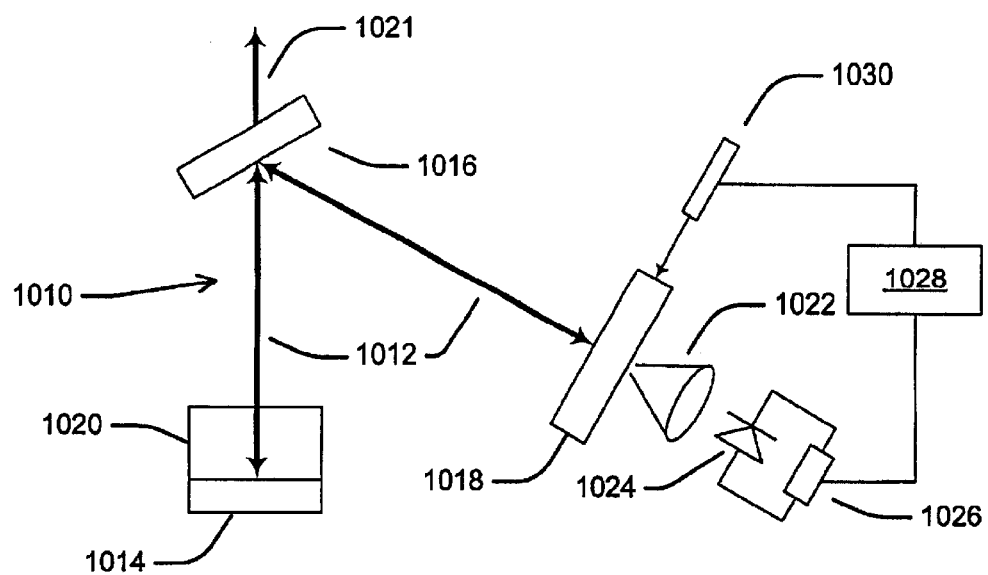
FIG. 10A is a diagram of a system for monitoring an external cavity laser.

In an embodiment shown in FIG. 10A, an SRBR 1018 is used as the third reflector of a VECSEL 1010. Its reflectivity spectrum may be changed by changing its refractive index (or of some of its layers), for example to provide a tunable laser system. Its refractive index may be changed by, for example, wavelength tuning device 1030. In an embodiment, wavelength tuning device 1030 may be an optical pump laser, a voltage source, or a heating source. An optical pump laser, for example, may work well if the SRBR has semiconductor layers for some or all of its layers, instead of only dielectric layers. However, it may be difficult, impractical, or otherwise undesirable to fabricate an SRBR using semiconductor layers. Thus, in an embodiment, device 1030 provides a means for changing other parameters of SRBR 1018 such as temperature or voltage. For example, some of the layers of SRBR 1018 can consist of piezoelectric or electrooptic material, in which case device 1030 is a voltage source which provides a voltage (electric field) across the piezoelectric layers of the SRBR to vary the refractive index, which can shift the reflectivity spectrum, and thus the wavelength covered by the single reflectivity peak, of the SRBR.

Figure 10B:
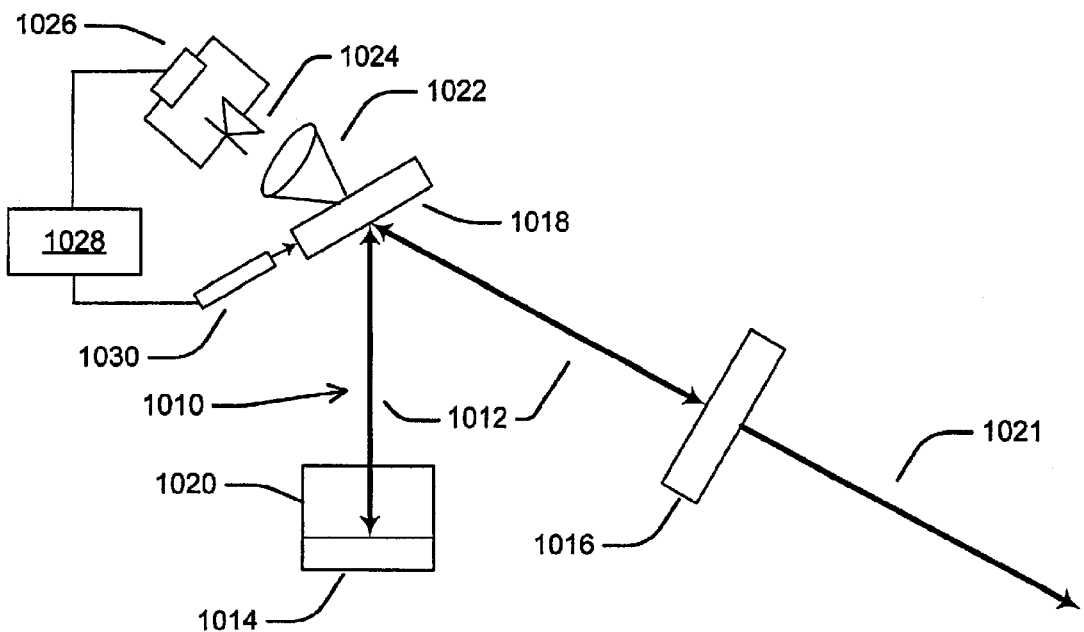
FIG. 10B is a diagram of an external cavity laser.

As shown in FIG. 10, a VECSEL 1010 has a two-section cavity 1012, with bottom mirror 1014, exit mirror 1016, and third mirror 1018 formed by the SRBR. The output 1021 of the VECSEL 1010 is through the exit mirror 1021. The presence of output at both angles of the two-section external cavity can decrease efficiency compared to the implementation of FIG. 10B. The VECSEL 1010 comprises an active region 1020, and a power source for electrically or optically pumping the active region. For an OP laser, the power source may be an external pumping laser (not shown); for an EP laser, the power source may be a current and/or voltage source. In either case, the power source is functionally coupled to the active region when the pumping energy may be applied thereto by the power source.

A given laser, such as VECSEL 1010, has a certain gain spectrum. The gain spectrum typically has a maximum at a particular wavelength. The gain spectrum, including its maximum, can be shifted with respect to wavelength, e.g. by changing the temperature or pumping energy. Also, because the mirrors are not 100% reflective, a loss is introduced. Lasing is possible where there is sufficient reflectivity (i.e., where the gain exceeds the loss, i.e. where there is a net gain) and where there is a cavity mode. Typically a broad reflectivity spectrum is provided by DBR cavity mirrors, so that there is a small loss over a wide wavelength range which usually includes the gain spectrum maximum. There can be several cavity modes within the wavelength range where lasing is possible, i.e. where there is net gain. Typically, the mode closest to the net gain maximum will be selected and will win out through mode competition, although multi-mode operation and mode hopping can occur if too many cavity modes exist close together, close to the net gain maximum.

In the present invention, the SRBR provides a narrow reflectivity band above the lasing threshold, so that the laser has net loss (loss exceeds gain) for all but a narrow lasing threshold reflectivity band covered by the peak of the single reflectivity band. Thus there is a smaller wavelength range over which lasing is possible, namely the narrow lasing threshold reflectivity band encompassing the single peak of the SRBR, assuming it intersects the gain spectrum at a high enough gain (e.g., at or near the gain maximum) so that the net gain is high enough to permit lasing to occur. In addition, lasing can only occur if the narrow lasing wavelength band of the single peak includes a cavity mode. The VECSEL 1010 will provide single-mode lasing at a cavity mode wavelength within the single lasing threshold reflectivity band of the SRBR 1018 if it intersects the gain spectrum at a high enough gain. Because the lasing threshold reflectivity band is very narrow, there will likely be only one cavity mode in the lasing threshold reflectivity band. Also, because of the narrowness of the lasing threshold reflectivity band, the lasing wavelength will be approximately the center or peak wavelength of the single lasing threshold reflectivity band.

As an example, if the single lasing threshold reflectivity band of SRBR 1018 covers an ITU grid wavelength and a cavity mode wavelength, and if the lasing threshold reflectivity band intersects the gain spectrum near the gain maximum, there can be a large net gain and stable lasing at the cavity mode wavelength, which is approximately the desired ITU grid wavelength. For comparison purposes, if the third mirror 1018 instead had an MRBR with many closely-spaced reflectivity bands, changes in the gain spectrum could select one or more of the reflectivity bands for lasing; and mode hopping could occur in some applications. However, in an embodiment illustrated in FIG. 10A, third mirror 1018 comprises an SRBR, which, because of the single peak, can have superior mode-hopping rejection characteristics. Also, the gain can be adjusted without affecting the lasing wavelength, because lasing is only possible at the single peak wavelength.

Thus, by utilizing an SRBR as one of the mirrors in the three-mirror, two-section cavity of a VECSEL, the reflectivity peak wavelength of the SRBR helps the laser lock onto that wavelength, and the gain of the active region may be adjusted to some degree independently of the lasing wavelength.

The reflectivity peak of the SRBR can either be fixed or it can be tunable. In the latter case, an MRBR or other type of filter may be employed along with a wavelength locking circuit to tune the SRBR peak to the desired wavelength. Power monitoring elements and circuitry can be used to adjust the gain independently.

It is often possible to independently tune or adjust gain and the cavity modes. For example, changing the pumping power shifts the gain spectrum, but only has relatively minor, secondary effects on the cavity modes. By contrast, more changing the index of refraction of various layers of the cavity can shift the cavity mode. This may be done by adjusting the temperature of the laser. Thus, for example, assume a VECSEL or VCSEL employing an SRBR, which has a fixed wavelength single peak at the desired ITU grid lasing wavelength. When first using or calibrating the laser, the pumping power and temperature are set at initial levels. If there is no lasing, it can be assumed that the single reflectivity peak does not intersect a cavity mode, i.e. the cavity mode is slightly "off". Thus, the temperature can be adjusted by a controller under control of a suitable algorithm, to adjust the cavity modes, until lasing occurs, at which point the cavity mode has been calibrated to be sufficiently close to the single reflectivity band and the desired lasing wavelength. Preferably, the temperature (and thus wavelength of the cavity mode) is adjusted until the output power is maximized; at this point, the cavity mode is precisely located at the peak of the single reflectivity band. Then, if the power needs to be higher or lower, the pumping power can be adjusted to adjust the gain spectrum. If only minor power adjustments are needed, the cavity mode may not change appreciably. However, if adjusting the gain spectrum to change the output power results in an appreciable shift in the cavity mode, the temperature can again be adjusted to counter the second-order cavity-mode shifting effect of the gain adjustment.

In an embodiment, SRBR is tunable to provide a tunable VECSEL. In this case, as illustrated in FIGS. 10A–B, a monitor photodiode 1024 and accompanying measurement circuit 1026 measure the amount of light transmitted through the SRBR 1018. The light 1022 may be passed through an MRBR or other wavelength-sensitive filter first, as described with reference to the wavelength locking function of FIG. 8. That measurement is then used by a processor 1028 to calculate a change in operation of a reflectivity wavelength tuning device 1030 to obtain a particular peak wavelength for SRBR 1018. As discussed with respect to FIG. 8, monitor photodiode 1024 can include an MRBR coating to assist in segregating particular desired wavelengths, or an MRBR or other type of wavelength filter placed between reflector 1018 and the monitor photodiode 1024. The same types of feedback algorithms discussed with respect to FIG. 8 can also be used to modify SRBR 1018 in response to measurements of the monitor photodiode 1018.

Monitor photodiode 1024 can also be used independent of wavelength to provide feedback indicative of the laser output power. That feedback can then be used to determine in part the proper pumping level provided by the power source coupled to the active region 1020 as disclosed with respect to FIG. 8. Alternatively, other taps or monitor photodiodes may be employed to monitor the output intensity to adjust the gain, independent of the lasing wavelength.

Thus, in an embodiment, as shown in FIG. 10A, the effective wavelength of the single peak of the SRBR 1018 is changed, to tune the lasing wavelength of the VECSEL 1010. In an embodiment, the wavelength tuning device 1030 is used to shift the single lasing threshold reflectivity band of SRBR 1018 (and its peak reflectivity wavelength) up or down in wavelength, thereby adjusting the overall lasing wavelength of the VECSEL 1010. As noted, device 1030 may use any suitable technique to change the reflectivity profile of the SRBR 1018, such as temperature or piezoelectric techniques.

In another embodiment, the monitor photodiode 1024 is employed, e.g. with a tap as shown in FIG. 9, to monitor the actual lasing wavelength, and to provide feedback to the optical pump 1030 or other adjustment device, to lock onto a desired wavelength. In this embodiment, an external MRBR may be employed with the monitor photodiode 1024, as described above, for the wavelength monitoring and locking function. In yet another embodiment, a separate monitor may be employed to monitor the power of laser 1030, to ensure that it is supplying the desired optical pumping to the SRBR 1018, which is calculated to achieve a desired change in wavelength, under certain conditions. For example, the SRBR 1018 may be temperature controlled so that varying the optical pump power in a known way changes the wavelength of the single peak in a known way.

The various embodiments discussed above can also be implemented with the cavity 1012 arranged around the SRBR 1018 with the exit mirror 1016, and thus the output 1021, at one end of the cavity 1012, as shown in FIG. 10B.

In an alternative embodiment of the implementation illustrated in FIG. 10B, mirror 1018 is an SRBR and the exit mirror is an MRBR so that the laser only produces desired wavelengths and the particular wavelength produced depends upon the parameters (e.g., optical pumping, temperature, or voltage) applied to the SRBR.

In an alternative embodiment, an appropriately designed MRBR may be used as an SRBR. For example, an MRBR that has sufficiently spread-out reflectivity peaks can function as an SRBR if only one of its reflectivity peaks lies within the wavelength range of interest, i.e. those wavelengths at which lasing might be desired. Such a reflector may be referred to as an MRBR-type SRBR, or MRBR-SRBR. For example, the wavelength range of interest may be a set or subset of ITU grid wavelengths for which the gain spectrum of the active region is designed to operate; or it may be the wavelength range which can be covered by a sufficiently high gain, e.g. within the range of wavelengths covered by the FWHM of the gain spectrum, including wavelengths covered when the gain spectrum is shifted by adjusting its power source. In such a case, within the wavelength range of interest, the MRBR provides only a single peak; all other reflectivity peaks of the MRBR fall outside the wavelength range of interest. For example, the MRBR has a single peak in the wavelength range of interest, which intersects the gain spectrum at a sufficiently high gain so that there is net gain; and all other peaks intersect the gain spectrum at a much lower gain so that there is very low, or negative, net gain, in which case there will be single-mode lasing at only the single peak's wavelength. Thus, for such an SRBR/MRBR, within the gain spectrum range of interest, there is only a single reflectivity peak; and all other reflectivities outside the single peak or band, in the wavelength range of interest, are below this threshold. That is, within the wavelength range of interest (i.e., the wavelength range covered by the gain spectrum range), there is only a single reflectivity peak of the MRBR that is above the lasing threshold; all other reflectivities of the MRBR in the spectrum of interest are less than some second threshold below the first one, e.g. less than 97%.

As described below, in alternative embodiments an SRBR may be employed for wavelength locking with an integrated, monolithic VCSEL, and with a one-section VECSEL.

Wavelength-locked Laser with Multiple Reflectivity Band Reflector

In an embodiment, similar to the configuration shown in FIG. 10A or 10B (where the third mirror 1018 is an MRBR instead of an SRBR), a VECSEL 1010 employs a bottom mirror 1014, an exit mirror 1016, and an external "top" reflector 1018 to complete the two-section cavity 1012. One of the three mirrors of the VECSEL 1010, preferably the external, "top" reflector 1018, is an MRBR in accordance with the present invention, having reflectivity bands which are spaced along target selectable lasing wavelengths (preferably along the ITU grid). The VECSEL structure, including cavity length and phase-matching layers, is preferably also designed so that cavity modes fall along each of the target selectable lasing wavelengths.

If the MRBR is the third mirror 1018, the reflectivities of the reflectivity bands need to be above the lasing threshold reflectivity, e.g. 99.5%. This permits sufficient reflection in the lasing cavity 1012 at one of the desired wavelengths. For example, the MRBRs of FIGS. 1–4 can be used for this purpose.

The active region 1020 of the VECSEL 1010 can be either electrically or optically pumped. By adjusting the electrical or optical pumping power, the gain spectrum of the VECSEL 1010 can be shifted. As the gain spectrum shifts, it overlaps with different reflectivity bands of the MRBR, causing discrete "jumping" from one lasing wavelength to another. The bands are preferably far enough apart (e.g., a CWDM type spacing) to prevent mode hopping and to achieve single mode operation. Thus, as long as the coarse gain spectrum tuning of the active region 1020 selects close to the desired wavelength range covered by the target reflectivity band, a stable lasing wavelength at the narrow wavelength of the reflectivity band will be achieved. This can avoid or reduce the need for feedback that is often required in continuously tunable lasers. In another embodiment, feedback can be implemented to fine tune to peaks of the MRBR 1018, adjusting the MRBR band positioning through optical pumping, temperature control, or piezoelectric voltage control as discussed above.

In other alternative embodiments, either bottom mirror 1014 or exit mirror 1016 may comprise an MRBR. If bottom mirror 1014 is the MRBR, then as for top mirror 1018, the reflectivity bands need to have reflectivity above the lasing threshold reflectivity. If exit mirror 1016 is the MRBR, the reflectivity bands cannot have 100% or too high reflectivity (e.g., it should be somewhat smaller than the reflectivity of the bottom mirror 1014, which typically has a reflectivity >99.8%), because some light must be transmitted as output 1021.

In still further alternative embodiments, two of the mirrors 1014,1018 of the VECSEL 1010 may have MRBRs, which can combine in a "vernier effect" to provide further wavelength selectability.

As described below, in alternative embodiments an MRBR may be employed with an integrated, monolithic VCSEL, and with a one-section VECSEL.

Figure 11:
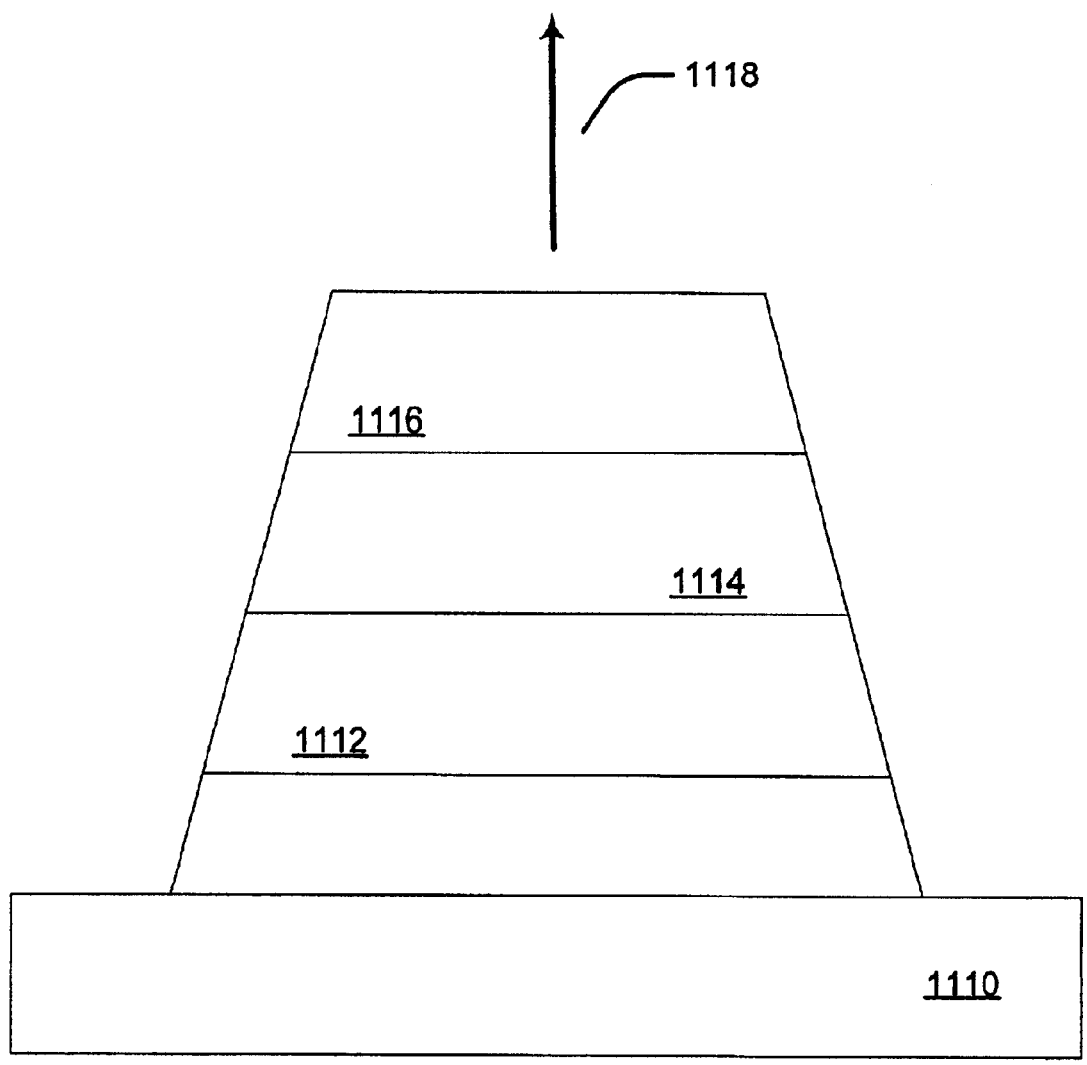
FIG. 11 is a diagram of a vertical cavity surface emitting laser.

Integrated Wavelength-locked VCSEL with Multiple or Single Reflectivity Band Reflector In an embodiment, as illustrated in FIG. 11, an integrated VCSEL employs a bottom mirror 1112 and a top exit mirror 1116 to complete the laser cavity. The structure is supported by a substrate 1110 with the laser output 1118 perpendicular to the substrate 1110. One of the two mirrors of the VCSEL, preferably the bottom reflector 1112, is an MRBR in accordance with the present invention, having reflectivity bands which are spaced along target selectable lasing wavelengths (preferably along the ITU grid). The VCSEL operates similarly to the wavelength-locked VECSEL with MRBR as described above. The active region 1114 of the VCSEL is preferably electrically pumped and tunable by electrically changing its gain spectrum. In this embodiment, the reflectivity band profile of the MRBR (e.g. 1112) is fixed. Target wavelengths are selected by changing the gain spectrum of the VCSEL, and/or by making any changes in the cavity modes by appropriate temperature tuning. In an alternative embodiment, the MRBR forms exit mirror 1116, instead of bottom mirror 1112.

In another embodiment, an SRBR is used to form either exit mirror 1116 or bottom mirror 1112. In this case, the lasing wavelength can be fixed, while permitting gain to be adjusted. Alternatively, if tuning is desired, bottom mirror 1112, for example, can be an SRBR, suitable techniques (e.g., piezoelectric) may be employed to change the reflectivity profile of the SRBR, and thus to change the lasing wavelength. In such a case, for example, extra terminals may need to be provided to permit piezoelectric tuning of the SRBR, independent from providing electrical pumping to the gain region 1114.

One-Section External Cavity Wavelength-locked VECSEL with Multiple or Single Reflectivity Band Reflector In an alternative embodiment, there is provided a one-section cavity, non-integrated VECSEL, in which the top (exit) mirror is externally mounted above an integrated bottom laser portion having the active region and bottom mirror. One of the mirrors, either the top or bottom mirror, is either an SRBR or MRBR, to provide for wavelength locking on the wavelengths associated with reflectivity peak(s) of the SRBR or MRBR of the VECSEL. The VECSEL operates similarly to the wavelength-locked VECSEL with MRBR or SRBR as described above.

Reflectively Coupled Zigzag Waveguide Device for Wavelength Locking

As noted above, U.S. Pat. No. 5,894,535 and Brian E. Lemoff et al., "A Compact, Low-Cost WDM Transceiver for the LAN," 2000 *Proceedings, 50$^{th}$ Electronic Components & Technology Conf.* (IEEE 2000) disclose a reflectively coupled zigzag waveguide device which is used for wavelength demultiplexing. The '535 patent, for example, discloses a device including a dielectric waveguide that guides a WDM signal through a zigzag path. The WDM signal contains multiple light signals at several discrete wavelengths of light, e.g. $\lambda_1, \lambda_2, \ldots \lambda_N$. At particular vertices of the path optical filters selectively transmit and reflect wavelengths of light. Each of the filters has a unique passband centered on (having a transmissivity maximum at) one of the plurality of wavelengths $\lambda_1, \lambda_2, \ldots \lambda_N$. Each filter (relatively) passes light in the passband centered on its respective wavelength $\lambda_i$, and relatively reflects light outside this passband. Each filter may therefore be referred to as a mirror/filter. The zigzag waveguide device of the '535 patent outputs, at each of the plurality of mirror/filters, different wavelengths of light, $\lambda_1, \lambda_2, \ldots \lambda_N$, thus demultiplexing the WDM signal to extract individual signals at each of the discrete wavelengths making up the WDM signal.

Figure 16:
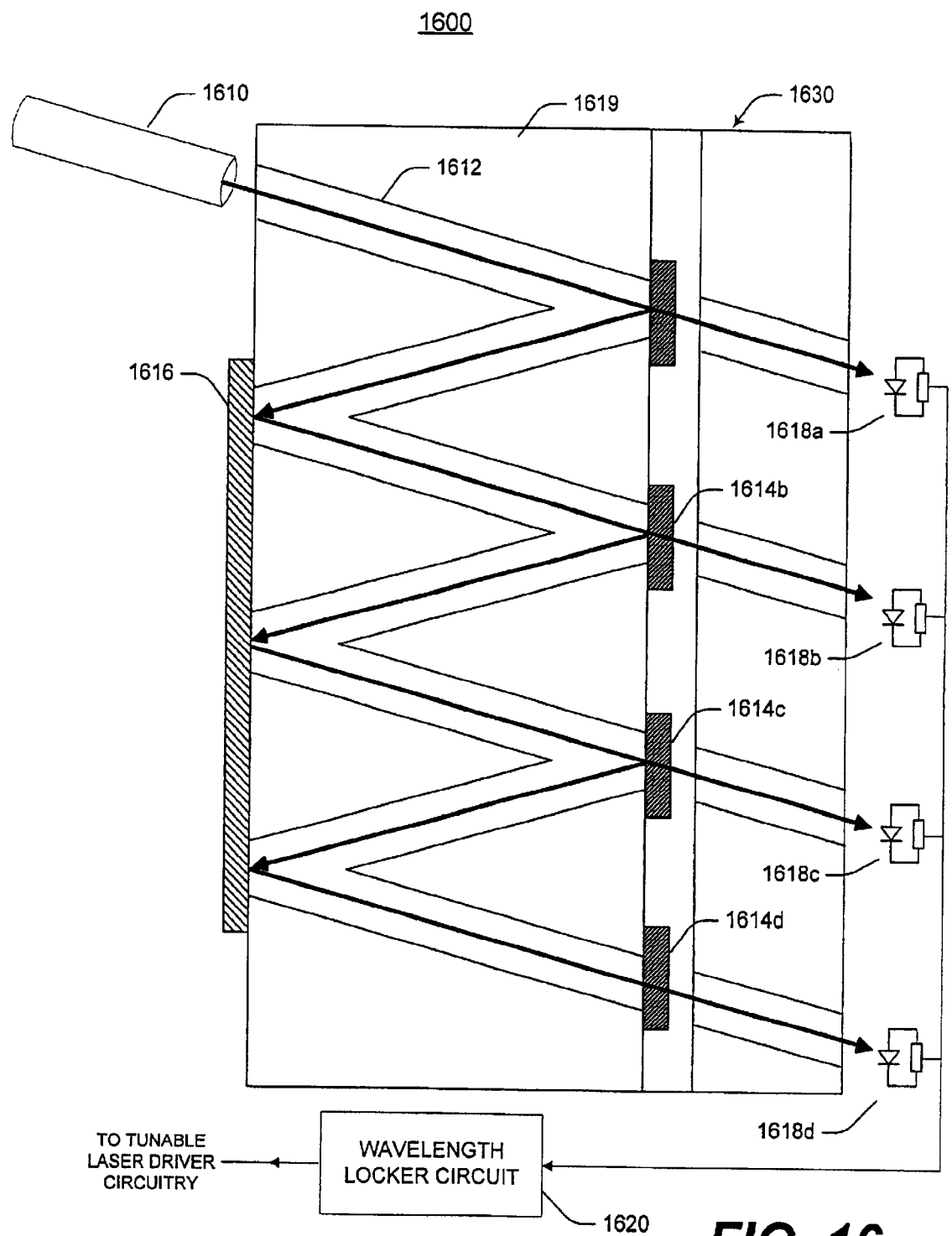
FIG. 16 is a diagram of zigzag waveguide device-based wavelength locking apparatus.

In the present invention, a reflectively coupled zigzag waveguide device is implemented as a wavelength locker instead of as a demultiplexer. Referring now to FIG. 16, there is shown a zigzag waveguide device-based wavelength locking apparatus 1600, in accordance with an embodiment of the present invention. Apparatus 1600 comprises zigzag waveguide device 1630, coupled to fiber 1610 to receive a tap of lasing light from an external tunable laser (not shown). Zigzag waveguide device 1630 is a zigzag patterned dielectric channel waveguide structure that guides a light signal through a zigzag path. At particular vertices of the path optical filters selectively transmit and reflect wavelengths of light. Zigzag waveguide device 1630 may also be referred to as a reflectively coupled optical waveguide structure, which is embedded in a substrate. Such a structure is a planar optical device that includes two or more optical channel waveguides oriented such that two adjacent waveguides converge at a vertex.

The tap of laser light received is at a current actual wavelength $\lambda_A$, which may or may not be substantially equal to the desired or target lasing wavelength $\lambda_L$. The desired lasing wavelength $\lambda_L$ is a particular one of a plurality of discrete lasing wavelengths $\lambda_1, \lambda_2, \ldots \lambda_N$, i.e. L=1, 2, 3, ... or N. If $\lambda_A=\lambda_L$, laser lock has been achieved. If not, the laser's lasing wavelength needs to be adjusted to move $\lambda_A$ in the direction of $\lambda_L$, until they are equal or sufficiently equal (i.e., the difference $\lambda_A$ and $\lambda_L$ is less than some predetermined threshold difference). The purpose of wavelength locking apparatus 1600 is to generate control signals to perform this adjusting, so as to achieve and/or maintain laser lock on the desired lasing wavelength $\lambda_L$.

Zigzag waveguide device 1630 comprises a plurality N of optical filters/reflectors 1614, each filter 1614$_i$ having a passband at a respective wavelength $\lambda_i$ which is a corresponding one of the N discrete wavelengths $\lambda_1, \lambda_2, \ldots \lambda_N$. In an embodiment, the filters 1614 are substantially identical except that their structures are adapted to provide different passbands. Filter 1614 may be distributed dielectric multilayer stack reflectors, for example.

As noted above, each filter 1614$_i$ (relatively) passes light in the passband centered on its respective wavelength $\lambda_i$, and relatively reflects light outside this passband. Further, because the passband is not ideal, light at exactly the center wavelength is transmitted at a higher degree than is light not exactly at the center wavelength $\lambda_i$ but still close to wavelength $\lambda_i$ and within the passband. Each filter 1614$_i$ therefore produces a respective filtered output signal, related to the intensity of light impinging thereon as well as the wavelength of such light. Light within the passband produces a larger output signal the greater its intensity and also the closer it is to the center wavelength $\lambda_i$. Apparatus 1600 also comprises a corresponding plurality N of photosensors, e.g. photodiodes, and measuring circuit 1618, arranged so that a photodiode and measuring circuit 1618$_i$ is positioned to received the filtered output of the corresponding filter 1614$_i$. In the illustrated embodiment, N=4.

The input optical signal at actual lasing wavelength $\lambda_A$ propagates through a waveguide 1612 of zigzag device 1630 until it reaches a first filter 1614a at a vertex of the zigzag patterned waveguide structure 1612. In an embodiment, each vertex of the zigzag waveguide structure 1612 has a vertex angle of approximately 12°, but may be at other angles in other embodiments, e.g. within a range of 3° to 45°. Zigzag waveguide structure 1612 is formed by a number of dielectric channel waveguides, comprised of dielectric layers embedded in a cladding region 1619 of the substrate. The cladding region can be a dielectric layer on the substrate or it can be the substrate itself. In either case the waveguides may be said to be embedded and/or patterned in a substrate. The cladding region 1619 has a cladding refractive index, and the dielectric channel waveguides of structure 1612 have a waveguide refractive index, which is higher than the cladding refractive index such that light is confined within the waveguide structure. Waveguide structure 1612 is embedded in the substrate using known means and methods.

In an embodiment, each waveguide of the zigzag waveguide structure 1612 is substantially rectangular in cross section and is approximately 70 microns high by 100 microns wide. Other dimensions and shapes can also be employed for the waveguides.

The first optical filter 1614a includes layers with the optical property of transmitting a wavelength band (passband) centered on a particular wavelength, e.g. $\lambda_1$, but reflecting other wavelengths at least relative to the transmittance of wavelengths within the passband. Thus, the optical filter transmits light in a particular wavelength range (passband) out of the waveguide structure and reflects light in other wavelength ranges into the subsequent waveguide.

The reflected light continues to travel through the waveguide until it reaches a full spectrum reflector 1616. Substantially all the light is reflected from the full spectrum reflector 1616 and continues to the next vertex at which is located second reflector/filter 1614b, which is similar to the first reflector 1614a with a different wavelength band, namely one centered on $\lambda_2$. The third reflector 1614c and fourth reflector 1614d are also configured to have higher transmittance for light in their corresponding wavelength bands centered on wavelengths $\lambda_3$ and $\lambda_4$. The light transmitted by each of the reflectors 1614a–d is detected by a corresponding photodiode and measuring circuit 1618a–d.

Wavelength locking apparatus 1600 comprises a wavelength locker circuit 1620, which may be, or comprise, a processor. Wavelength locker circuit 1620 receives the signals generated by the N photodiode and measuring circuits 1618. That is, wavelength locker circuit 1620 receives N signals, each signal corresponding to the intensity of light within a respective passband. It may also receive the output from a power monitoring photodiode (not shown), for use as a reference, as described below with reference to FIG. 12. Wavelength locker circuit 1620 is presumed to have knowledge of the desired lasing wavelength, i.e. it knows which of the possible lasing wavelengths $(\lambda_1, \lambda_2, \ldots \lambda_N)$ is the desired wavelength $\lambda_L$.

Wavelength locker circuit 1620 analyzes the signals with a suitable algorithm and controls the transmitting laser in accordance therewith. In particular, based on the photodiodes' signals, wavelength locker circuit 1620 determines whether the laser is lasing at the desired lasing wavelength $\lambda_L$, that is, whether $\lambda_A = \lambda_L$. If not, circuit 1620 generates control signals to provide to driver control circuitry coupled to the tunable laser, to adjust the lasing wavelength of the laser so as to achieve lock on the desired lasing wavelength $\lambda_L$. If $\lambda_L$ is $\lambda_2$, for example, then circuit 1620 makes sure that the output signal from photodiode and measuring circuit 1618b is at a maximum.

As an example, if $\lambda_2$ is selected to be the desired lasing wavelength, then circuit 1620 (or some other circuit) sends control signals predetermined to achieve this lasing wavelength to the laser. This might not achieve the exact wavelength $\lambda_2$, however, due to slight mismatches in calibration or aging. For example, the laser may be lasing at actual wavelength $\lambda_A$ which is close to, but not exactly equal to, $\lambda_2$. In this case, the outputs of photodiode and measuring circuits 1618a, 1618c, and 1618d (corresponding to wavelength passbands at $\lambda_1$, $\lambda_3$, and $\lambda_4$, respectively) will have zero or very low outputs, since actual wavelength $\lambda_A$ is not equal or even close to any of these wavelengths, and thus nothing will be passed by reflectors/filters 1614a, 1614c, and 1614d, respectively. However, $\lambda_A$ will be still within the passband of reflector/filter 1614b, because it is close to $\lambda_2$. Because $\lambda_A$ is not exactly equal to $\lambda_2$, less light will be passed through filter 1614b than light at $\lambda_2$ would, because $\lambda_A$ is not at the center of the passband. In this case, circuit 1620 will be able to determine that exact lock has not been achieved, because the signal from photodiode and measuring circuit 1618b will not be maximized and/or will not be as high as a "lock threshold" (which may be determined with reference to a power monitoring photodiode signal). In another case, the initial actual lasing wavelength $\lambda_A$ may be closer or equal to the wrong discrete lasing wavelength $\lambda_1$, $\lambda_3$, or $\lambda_4$, than to target wavelength at $\lambda_2$. In this case circuit 1620 can determine this by an appropriate algorithm to vary the lasing wavelength and analyzing the resulting signals output from all four photodiode and measuring circuits 1618a, 1618b, 1618c, and 1618d. Other tuning and locking algorithms are described below with reference to FIGS. 14 and 15. As will be appreciated, these and other wavelength locking algorithms can be used to achieve, and also to maintain, wavelength lock.

Wavelength locker circuit 1620 can also take into account expected or predetermined losses occurring due to reflection losses at the vertices. For example, there may be more loss to the signal traveling in waveguide structure 1612 by the time it reaches the last filter 1614d than when it impinged on the first filter 1614a. Thus, circuit 1620 may take this into account when analyzing the signal received from each filter, i.e. it may employ a lower lock threshold for outputs further down the waveguide structure 1612.

Thus, instead of extracting individual wavelength signals of the WDM signal for further transmission or routing, the zigzag waveguide device of the present invention produces a plurality N of signals based on a (preferably single-wavelength) input signal having an unknown and/or potentially variable wavelength $\lambda_A$, where each of the N signals is related in a known manner to the intensity of light in the input signal at a particular discrete wavelength $\lambda_i$ of a plurality N of discrete wavelengths $\lambda_1, \lambda_2, \ldots \lambda_N$. In an embodiment of the present invention, a photosensor, such as a photodiode, is placed at the output of each filter, to monitor the intensity of light at the wavelength $\lambda_i$ of the corresponding filter i. In this manner, as in the wavelength monitoring and locking techniques described above, e.g. with reference to FIG. 8, wavelength locking may be achieved using a zigzag waveguide device.

PLC Module for Conditioning Tunable Laser Output

Planar lightwave circuits (PLCs) are used as waveguides in various optical applications. A PLC typically comprises a slab (substrate) of dielectric material (e.g., silica or silicon) into which one or more waveguides are formed or "buried". The waveguides are usually simple and well-defined waveguide structures, typically having a substantially rectangular cross section. The waveguides serve as dielectric propagation media, for which the principle of operation is the same as that for optical fibers that are circular in cross section. Various parameters such as width, thickness, and refractive indices determine the operating wavelength and the modes a PLC waveguide will support. For example, the PLC may be designed to have single-mode waveguides. Also, waveguides may be tapered or shaped at their ends to match the mode profile of the fibers or other devices to which the waveguide end is to be optically coupled.

PLCs using silica-based optical waveguides are fabricated on (embedded or patterned in) a silicon or silica substrate by various techniques, typically a combination of flame hydrolysis deposition (FHD) and reactive ion etching (RIE). First, fine glass particles are produced in an oxy-hydrogen flame and deposited on a host substrate (Si or $SiO_2$). After depositing the undercladding and core glass layers, the wafer is heated to a high temperature for consolidation. The circuit (waveguide) pattern is fabricated by means of photolithography and reactive ion etching (RIE). The core ridge structures are covered with an overcladding layer and consolidated again. Various kinds of waveguides are in use, such as N×N star couplers, N×N arrayed-waveguide grating (AWG) multiplexers and other types of AWGs, optical add/drop multiplexers (ADMs), and N×N matrix switches. Also, the silica-based waveguide on a Si substrate may be used as an optical hybrid integrating platform, since Si has highly stable mechanical and thermal properties that make it suitable as an optical bench. This permits optoelectronic devices to be formed on the PLC using precise Si "terrace" alignment features, which helps to precisely align the device with respect to the waveguides, to minimize optical coupling losses. Further information on PLCs may be found in Katsunari Okamoto, *Fundamentals of Optical Waveguides* (Academic Press, 2000), chapter 9, "Planar Lightwave Circuits," pp. 341–400 et pass.

Figure 12:
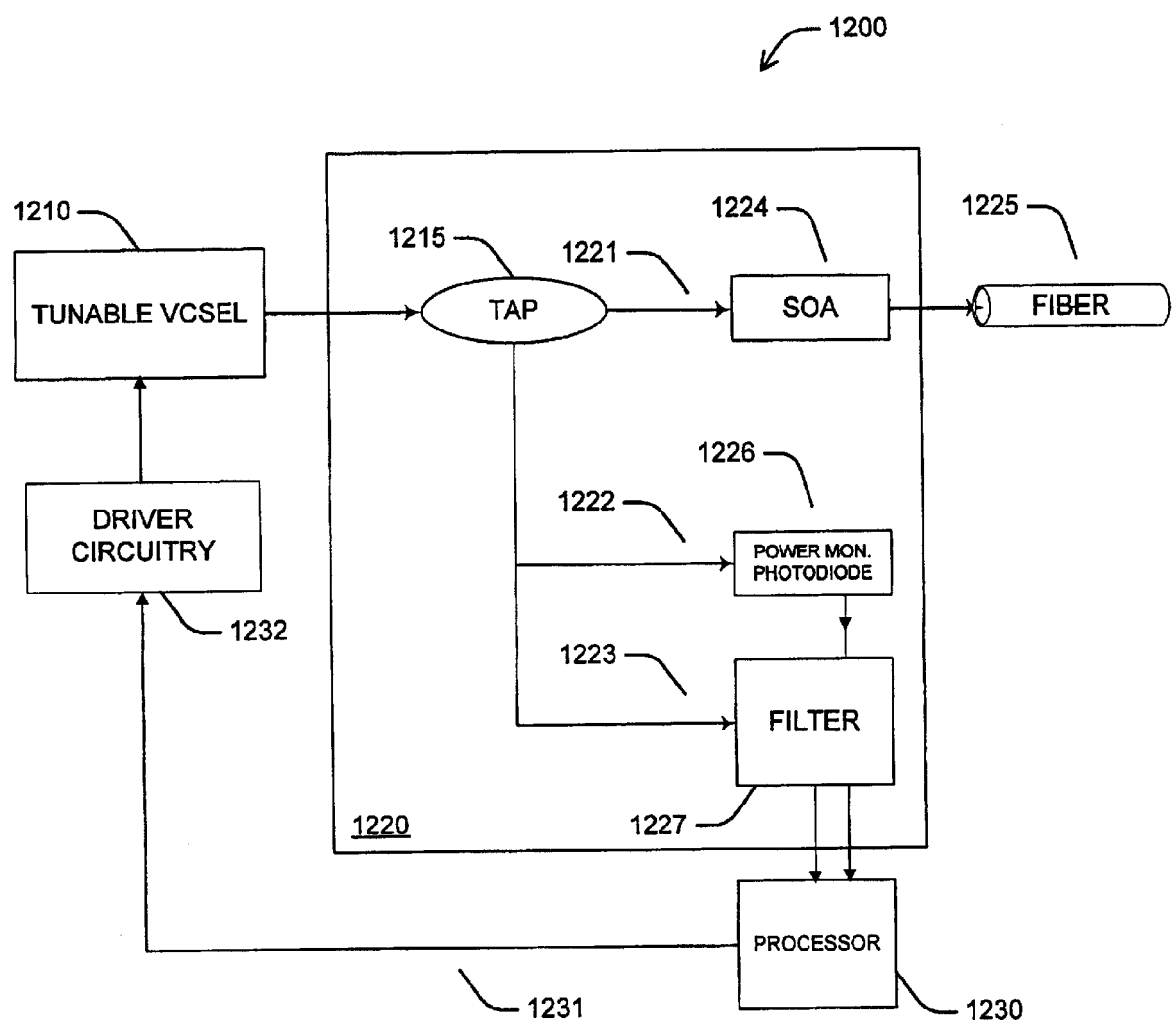
FIG. 12 is a diagram of a system for monitoring a vertical cavity surface emitting laser.

A PLC module having a plurality of waveguides is used in an embodiment of the invention to condition a tunable laser output. Referring now to FIG. 12, in an embodiment 1200, a PLC module 1220 is used to condition the output of a semiconductor laser, preferably a tunable laser, such as the VCSEL 1210 shown in FIG. 12. The output of the VCSEL 1210 may be coupled to the PLC 1220 by a fiber or other suitable means. PLC module 1220 contains a plurality of patterned silicon oxide waveguides 1221, 1222, 1223 patterned into a silica or silicon slab via standard PLC fabrication techniques. In general, the waveguides 1221, 1222, 1223 may be said to be embedded and/or patterned in a substrate. In embodiments in which the substrate is a silicon or silica substrate, the substrate may be referred to as a silicon-based substrate.

The plurality of waveguides include a primary or main waveguide 1221 for coupling the laser output to some conditioning device 1224 such as an SOA (semiconductor optical amplifier) and/or modulator (not shown) and then to a fiber 1225. The waveguides also comprise a plurality of secondary or "splitter" waveguides 1222, 1223 for transmitting small portions of light tapped from the main waveguide 1221. The secondary waveguides comprise first secondary or splitter waveguide 1223 and second secondary or splitter waveguide 1222.

Primary waveguide 1221 has an input end input receiving light from the tunable laser 1210 and an output end for outputting said light, e.g., to a fiber 1225 for further transmission, preferably after conditioning the light by some device in the waveguide, between its input and output ends, such as SOA 1224. Thus, the primary waveguide comprises a conditioning device between its input and output ends for conditioning light received from the tunable laser so that the primary waveguide provides, at its output end, light from the tunable laser conditioned by the conditioning device.

Secondary or splitter waveguides 1222 and 1223 provide a portion of light tapped from primary waveguide 1221 and apply it to other components, such as a power monitoring photodiode 1226 and a filter 1227. In an alternative embodiment, PLC 1220 comprises primary waveguide 1221, secondary waveguide 1223, and filter 1227, but may not include secondary waveguide 1222 and photodiode 1226.

FIG. 12 shows the functional relationship between the main waveguide 1221 and the splitter waveguides 1222, 1223. Several structures can be used to couple portions of the VCSEL output from the main waveguide 1221 to the splitter waveguides 1222, 1223. In an embodiment, the splitter waveguides use evanescent coupling to tap off a portion of light from the main waveguide 1221 or another of the splitter waveguides which is itself directly or indirectly coupled to the main waveguide. In this embodiment, the waveguides are arranged so that a portion of each of the splitter waveguides is located in close proximity and parallel to a portion of the main waveguide. This proximity allows for evanescent waves corresponding to the VCSEL output in the main waveguide to propagate through the splitter waveguides. Thus, in this embodiment, each secondary waveguide receives a respective portion of light, from the primary waveguide, by either direct or indirect evanescent coupling from said primary waveguide. A secondary waveguide receives its respective portion of light from the primary waveguide by direct evanescent coupling if it is directly adjacent said primary waveguide so that there is evanescent coupling between the two. If a secondary waveguide receives a portion of light from another secondary waveguide (which is itself either directly or indirectly evanescently coupled to the main waveguide), by either evanescent or other coupling, it may be said to be indirectly evanescently coupled to the main waveguide.

In another embodiment, at least one of the splitter waveguides taps off some light from the main waveguide 1221 by evanescent splitting and the next taps light from this last splitter waveguide, and so forth. For example, second splitter waveguide 1222 taps off a portion of light from main waveguide 1221, and first splitter waveguide 1223 taps off a portion of the light from first splitter waveguide 1222. In another embodiment, instead of evanescent splitting an optical tap 1215 is used to direct portions of the VCSEL output into the splitter waveguides.

In an embodiment, the second splitter waveguide 1222 applies the tapped light (a "first portion" of light from the main waveguide) to a power monitoring photodiode 1226 for power monitoring purposes, and the first splitter waveguide 1223 applies a second portion of tapped light to a wavelength filter 1227 for wavelength locking purposes. A processor 1230 employs an algorithm that responds to output from the filter 1227 (and also photodiode 1226 in an embodiment) to generate control signals which are fed to driver circuitry 1232 by control line 1231. This may be any a suitable algorithm such as described above with reference to FIG. 16, or other types of algorithms such as ones based on or similar to aspects of the algorithms of FIGS. 14–15. Control line 1231 in an embodiment carries digital signals instructing the driver circuitry how much to change the wavelength and drive current provided to tunable VCSEL 1210. In response to these digital control signals, driver circuitry 1232 generates the appropriate analog voltage and/or current signals to effect the desired changes in tunable VCSEL 1210.

In an embodiment, filter 1227 provides at least a signal related to the intensity of light at the desired lasing wavelength $\lambda_L$ which is impinging on filter 1227 from first splitter waveguide 1223. Thus, for example, if tunable laser 1210 is designed to emit at one of four selectable wavelengths $\lambda_1$, $\lambda_2$, $\lambda_3$, $\lambda_4$, and at a given time is supposed to be emitting at wavelength $\lambda_L = \lambda_1$, filter 1227 will output a signal corresponding to the intensity of light at wavelength $\lambda_1$. If this reading is at a maximum and/or above a certain threshold (determined using the output of power monitoring photodiode 1226 as a reference, in an embodiment) then there is laser lock; if not, then processor 1230 sends an appropriate control signal to VCSEL 1210 to adjust its lasing wavelength, until the desired wavelength is achieved.

As noted above with respect to the discussion of FIG. 16, in an embodiment processor 1230 is supplied with information as to which of the possible target lasing wavelengths ($\lambda_1$, $\lambda_2$, $\lambda_3$, $\lambda_4$) is the current target lasing wavelength $\lambda_L$. In an embodiment the filter 1227 is a tunable filter, in which any of wavelengths $\lambda_1$, $\lambda_2$, $\lambda_3$, $\lambda_4$ can be selected by an appropriate control signal to be the center wavelength for the filter's passband. In this case, filter 1227 is tuned to filter pass light at a passband centered on the target lasing wavelength $\lambda_L$. It may do this in response to a control signal provided to it from processor 1230, or other device, to select this passband.

In an alternative embodiment, filter 1227 is not tunable but is a multiple-output filter providing a plurality N of signals related respectively to the intensity of light at each of a plurality of discrete wavelengths $\lambda_1$, $\lambda_2$, . . . $\lambda_N$ which impinge on filter 1227 from first splitter waveguide 1223. In this embodiment, filter 1227 has a plurality of dedicated filters, each having a passband corresponding to one of the N discrete wavelengths at which lasing may be desired. Thus, for example, if tunable laser 1210 is designed to emit at one of four selectable wavelengths $\lambda_1$, $\lambda_2$, $\lambda_3$, $\lambda_4$, and at a given time is actually emitting at wavelength $\lambda_1$, filter 1227 will output a maximum intensity reading for wavelength $\lambda_1$ and minimal readings for the other wavelengths $\lambda_2$, $\lambda_3$, $\lambda_4$.

In one implementation of the multiple-output filter embodiment, the filter is formed from a reflectively coupled zigzag waveguide device as described above with respect to FIG. 16.

Figure 13:
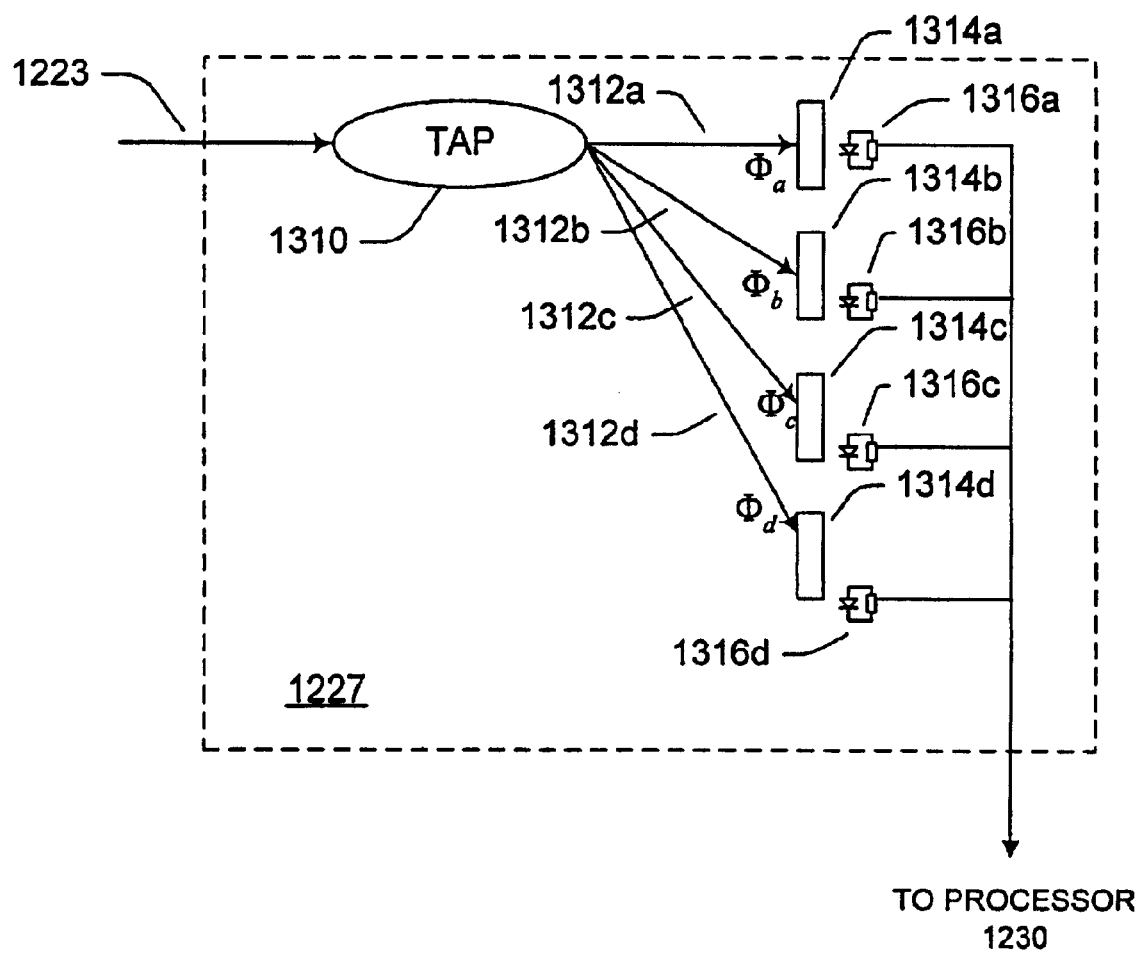
FIG. 13 is a diagram of a system for monitoring a laser.

In another implementation of the multiple-output filter embodiment, the filter is formed from the filter shown in FIG. 13. As shown in FIG. 13, the filter portion 1227 may comprise a plurality of identical filters 1314*a–d* (instead of filters each having a different wavelength, corresponding to $\lambda_1$, $\lambda_2$, . . . $\lambda_N$, as in the zigzag waveguide device 1630 of FIG. 16). These filters may be distributed dielectric multilayer stack reflectors, for example, having the desired reflectance/transmissivity characteristic. The angle at which light impinges on such a filter affects the wavelength passband of the filter, for example because it affects the effective layer thickness seen by the light. In the embodiment of filter 1227 illustrated in FIG. 13, filter 1227 receives the portion of light via splitter waveguide 1223 and further splits this light into N=4 further secondary or splitter waveguides 1312*a–d*, via tap 1310. Tap 1310 may be similar to tap 1215 of FIG. 12. Each of the splitter waveguides 1312*a–d* are patterned to terminate at a unique angle $\Phi_i$ with respect to a filter 1314*a–d*, so that the identical filter 1314*a–d* combined with the angle results in a specified wavelength passband for the filter, for wavelength locking purposes. That is, the angle $\Phi_i$ for each filter 1314*i* is selected so that the filter 1314*i*, given its multilayer stack configuration, will yield the desired passband center wavelength $\lambda_i$. In an embodiment, angle $\Phi_i$ may be regarded as the angle from normal to the parallel surface of the reflector 1314*i*.

In particular, each filter 1314*a–d* has an identical dielectric multilayer stack configuration, which provides transmission passbands centered at $\lambda_1$, $\lambda_2$, . . . $\lambda_N$, when light impinges on the reflector at angles of $\Phi_a$, $\Phi_b$, $\Phi_c$, and $\Phi_d$, respectively. In the embodiment illustrated, for example, $\Phi_a$ (0°) <$\Phi_b$<$\Phi_c$<$\Phi_d$<90°. In an alternative embodiment, all the angles, including $\Phi_a$, are greater than 0° to avoid backreflection into the source. The light transmitted through the specified passband of each filter is detected by photodiode and measuring circuit 1316*a–d*, and the signals transmitted to processor 1230 of FIG. 12.

Wavelength Locking Algorithms for Tunable Lasers Employing an SRBR or MRBR

Algorithms are used to lock a light source onto the peak or trough of a filter in accordance with an embodiment of the present invention. FIG. 14 depicts a flowchart of a method 1400 for locking onto a peak or trough. If $\lambda_i$ is the desired wavelength, a particular tuning parameter of the light source is initially specified to correlate with the wavelength band of the filter (whether it is a SRBR or MRBR) that has a peak or trough at $\lambda_i$. The tuning value could be, for example, temperature of the laser or the degree of pumping whether electrical or optical. In an alternate embodiment, a separate wavelength measurement method can be used to tune the light source to the wavelength band. Once the light source is producing a wavelength within the band, the method 1400 is different depending on whether $\lambda_i$ is the peak or trough of the band. (A peak of a band depicted by reflectance v. wavelength is a reflective maxima, while the trough of such an inverse band has a reflective minima.)

For a reflective minima, the output of the filter at the initial tuning parameter specification is measured and the tuning value is then changed by a small positive step. A new output is measured at the changed tuning value. The new output is compared to the initial output and the new output becomes the initial output if it is the greater. Once one successful positive step has occurred and the new output has become the initial output at least once, the first unsuccessful positive step thereafter indicates that the reflective minima has been over stepped by one and will result in the setting of the tuning value at the previous value. If no successful positive steps occur, i.e., new output is less than initial output for the first positive step, negative steps are attempted. The first negative step that is unsuccessful results in the setting of the tuning value at the previous value. Thus, the algorithm tries both directions in the tuning value in an attempt to find the reflective minima and stops changing the tuning value once it has been found. The method for finding a reflective maxima is the same except that the result of comparing the initial output and the new output is inverted. A new output that is less than the initial output is considered successful so that the new output replaces the initial output and further steps in the same direction of the tuning value are attempted until a reflective maxima has been overstepped by one. In an embodiment, the method of FIG. 14 to reattain the reflective maxima or minima is periodically employed to correct any wavelength drift that has occurred since the last setting. In an alternative embodiment, other algorithms may be employed, e.g. a predictive algorithm may be employed when the current lasing wavelength is far away from the target wavelength.

Algorithms are also used to move from one peak or trough minima of a filter in accordance with an embodiment of the present invention to another such peak or trough minima. FIG. 15 depicts a flowchart of a method for moving a laser from a present wavelength, $\lambda_i$, to a desired wavelength, $\lambda_N$. The method of FIG. 15 assumes that filter wavelengths are defined by reflectivity maxima or peaks, though wavelengths defined by reflectivity minima or troughs could be changed by inverting the comparison steps as in FIG. 14. As in FIG. 14, the tuning parameter can be any laser parameter that corresponds to the wavelength of light output by the laser, e.g., laser temperature or pumping level. The algorithm determines the number of bands between $\lambda_i$ and $\lambda_N$. The tuning parameter is changed by a specified value and the output is measured. The output is then compared to a band threshold, which is some amount of reflection that is the minimum considered to be in a band. If the output is still in the current band, the tuning parameter is modified by the specified amount repeatedly until the output indicates that the laser wavelength has moved out of the band. Once the output is out of a band, the tuning parameter is then modified by the specified value until the output moves into the next band as indicated by comparing the output with the band threshold. The number of bands traversed, which starts at one, is incremented and compared with the number between that was initially determined. If more bands must be traversed to reach the band containing $\lambda_N$, the process iterates. If the band containing $\lambda_N$ has been reached, then a one directional implementation of the method shown in FIG. 14 is used to find the reflective maxima corresponding to $\lambda_N$. It is preferable that the second specified value be smaller than the specified value used for counting bands, because fine tuning the reflective maxima requires smaller steps than identifying and counting the bands between the desired wavelength and the initial wavelength. In some embodiment, the various bands will have different reflectivities and comparison to those known reflectivities can be used instead of band counting to locate the desired wavelength.

In the embodiments described above, the MRBR and SRBR of the present invention are distributed dielectric multilayer stack reflectors. In alternative embodiments, materials other than dielectric materials may be employed for some or all of the layers, e.g. semiconductor materials.

In the embodiments described above, the MRBR is a distributed dielectric multilayer stack reflector. In an alternative embodiment, an alternative MRBR may be formed by disposing two DBR mirrors on opposing surfaces of an intervening layer, such as a piezoelectric (electrooptic) layer. Such a reflector will form an etalon, which has a reflectivity profile having a plurality of reflectivity peaks. Such a reflector may be referred to as a DBR-piezoelectric-etalon reflector. The reflectivity and spacing of the peaks depend on the reflectivity profiles of the two DBRs and the intervening piezoelectric layer, including the refractive index and thickness of the intervening piezoelectric layer. For example, comparatively low reflectivity (e.g., about 80%) dielectric DBRs may be employed, to give rise to etalon reflectivity peaks well above 99% in reflectivity. The characteristics of such a reflector may be selected, for example, so that the reflectivity peaks fall on ITU grid wavelengths, and may be integrated into, e.g., a two-section VECSEL. The gain spectrum may cover several of these reflectivity peaks, and may be adjusted to select lasing at one of them. Additionally, a voltage can be applied across the piezoelectric layer to change its index of refraction and to shift the reflectivity peaks. This may be used, for example, to fine-tune the lasing wavelength when the laser is locked onto a given one of the reflectivity peaks. Alternatively, the characteristics of such a DBR-piezoelectric-etalon reflector may be selected, for example, so that they are widely spaced so that only a single reflectivity peak falls within the gain spectrum. In this case, a voltage across the piezoelectric layer may be varied to shift (in wavelength terms) the reflectivity peak closest to the gain spectrum maximum, to tune or change the lasing wavelength.

In the present application, a "non-section-112(6) means" for performing a specified function is not intended to be a means under 35 U.S.C. section 112, paragraph 6, and refers to any means that performs the function. Such a non-section-112(6) means is in contrast to a "means for" element under 35 U.S.C. section 112, paragraph 6 (i.e., a "section-112(6) means"), which literally covers only the corresponding structure, material, or acts described in the specification and equivalents thereof.

Some embodiments or aspects of the present invention can also be embodied in the form of computer-implemented processes and apparatuses for practicing those processes. The present invention can also be embodied in the form of computer program code embodied in tangible media, such as floppy diskettes, CD-ROMs, hard drives, or any other computer-readable storage medium, wherein, when the computer program code is loaded into and executed by a computer, the computer becomes an apparatus for practicing the invention. The present invention can also be embodied in the form of computer program code, for example, whether stored in a storage medium, loaded into and/or executed by a computer, or transmitted as a propagated computer data or other signal over some transmission or propagation medium, such as over electrical wiring or cabling, through fiber optics, or via electromagnetic radiation, or otherwise embodied in a carrier wave, wherein, when the computer program code is loaded into and executed by a computer, the computer becomes an apparatus for practicing the invention. When implemented on a future general-purpose microprocessor sufficient to carry out the present invention, the computer program code segments configure the microprocessor to create specific logic circuits to carry out the desired process.

The present invention, therefore, is well adapted to carry out the objects and attain the ends and advantages mentioned, as well as others inherent therein. While the invention has been depicted and described and is defined by reference to particular preferred embodiments of the invention, such references do not imply a limitation on the invention, and no such limitation is to be inferred. The invention is capable of considerable modification, alteration and equivalents in form and function, as will occur to those ordinarily skilled in the pertinent arts. The depicted and described preferred embodiments of the invention are exemplary only and are not exhaustive of the scope of the invention. Consequently, the invention is intended to be limited only by the spirit and scope of the appended claims (if any), giving full cognizance to equivalents in all respects.

What is claimed is:

1. A planar lightwave circuit (PLC) module for conditioning light output from a tunable laser designed to generate light at a target wavelength, the PLC module comprising:
   a substrate;
   a primary waveguide embedded in said substrate, said primary waveguide having an input end for receiving light from the tunable laser and an output end for outputting said light;
   at least a first secondary waveguide embedded in said substrate, wherein a portion thereof is located close enough to a portion of the primary waveguide so that said first secondary waveguide receives a first portion of said light from the tunable laser by direct or indirect evanescent coupling from said primary waveguide; and
   a filter means having a passband centered on the target wavelength and coupled to an output of the first secondary waveguide to receive said first portion of light, wherein said filter means is for generating a signal related to the intensity of said first portion of light in the passband centered on the target wavelength.

2. The PLC module of claim 1, further comprising a second secondary waveguide that receives a second portion of said light from the tunable laser and a power monitoring photosensor coupled to an output of the second secondary waveguide to receive said second portion of light, wherein said photosensor is adapted to generate a signal related to the intensity of said second portion of light.

3. The PLC module of claim 2, wherein the power monitoring photosensor comprises a photodiode.

4. The PLC module of claim 2, wherein said secondary waveguides each receive a respective portion of said light: from the tunable laser by direct or indirect evanescent coupling from said primary waveguide.

5. The PLC module of claim 1, wherein said substrate is a silica or silicon substrate and the waveguides are patterned silicon oxide waveguides embedded in said substrate.

6. The PLC module of claim 1, wherein the target wavelength is one of a plurality of different target wavelengths.

7. The PLC module of claim 6, wherein the filter is a tunable filter the passband of which can be selectively centered on any of the plurality of target wavelengths.

8. The PLC module of claim 6, wherein the filter is a multiple-output filter having a plurality of filters, one for each of the plurality of target wavelengths, each of said filters having a passband centered on a respective one of the plurality of target wavelengths and adapted to generate a signal related to the intensity of said first portion of light in the respective passband of said each filter, whereby said multiple-output filter provides a plurality of output signals related, respectively, to the intensity of said first portion of light in passbands centered on each of the plurality of target wavelengths, respectively.

9. The PLC module of claim 8, wherein said multiple-output filter comprises a reflectively coupled zigzag waveguide.

10. The PLC module of claim 8, wherein said multiple-output filter comprises:
a plurality of substantially identical distributed dielectric multilayer stack filters mounted in the substrate, each multilayer stack filter having a passband determined in part by the angle at which filtered light impinges on said filter;
a plurality of secondary filter waveguides, one for each of the multilayer stack filters, each of the plurality of secondary filter waveguides receiving light from said first secondary waveguide and patterned in the substrate so as to terminate at a unique angle with respect to its corresponding multilayer stack filter so that each multilayer stack filter has a passband centered on a respective one of the plurality of target wavelengths.

11. The PLC module of claim 1, wherein said primary waveguide comprises a conditioning device between its input and output ends for conditioning said light so that the primary waveguide provides, at its output end, light from the tunable laser conditioned by the conditioning device.

12. The PLC module of claim 11, said conditioning device is one of a semiconductor optical amplifier and a modulator.

13. A system for conditioning light output from a tunable laser designed to generate light at a target wavelength, the system comprising:
a planar lightwave circuit (PLC) module comprising:
a substrate;
a primary waveguide embedded in said substrate, said primary waveguide having an input end for receiving light from the tunable laser and an output end for outputting said light;
at least a first secondary waveguide embedded in said substrate, wherein a portion thereof is located close enough to a portion of the primary waveguide so that said first secondary waveguide receives a first portion of said light from the tunable laser by direct or indirect evanescent coupling from said primary waveguide; and
a filter means having a passband centered on the target wavelength and coupled to an output of the first secondary waveguide to receive said first portion of light, wherein said filter means is for generating a filter output signal related to the intensity of said first portion of light in the passband centered on the target wavelength; and
a processor means for generating, based on said filter output signal, a control signal, to adjust the lasing wavelength of the tunable laser to achieve or maintain the target wavelength.

14. The system of claim 13, further comprising the tunable laser.

15. The system of claim 13, further comprising driver circuitry for receiving said control signal and for generating, in response to said control signal, analog signals to control the lasing wavelength of the tunable laser.

16. The system of claim 13, wherein:
the target wavelength is one of a plurality of different target wavelengths;
the filter means is a multiple-output filter means having a plurality of substantially identical distributed dielectric multilayer stack filters mounted in the substrate, one for each of the plurality of target wavelengths, each of said multilayer stack filters having a passband determined in part by the angle at which filtered light impinges on said filter and centered on a respective one of the plurality of target wavelengths and adapted to generate a signal related to the intensity of said first portion of light in the respective passband of said each filter, whereby said multiple-output filter provides a plurality of output signals related, respectively, to the intensity of said first portion of light in passbands centered on each of the plurality of target wavelengths, respectively; and
the PLC module further comprises a plurality of secondary filter waveguides, one for each of the multilayer stack filters, each of the plurality of secondary filter waveguides receiving light from said first secondary waveguide and patterned in the substrate so as to terminate at a unique angle with respect to its corresponding multilayer stack filter so that each multilayer stack filter has a passband centered on a respective one of the plurality of target wavelengths.

17. A planar lightwave circuit (PLC) module for conditioning light output from a tunable laser means for generating light at a target wavelength, the PLC module comprising:
a substrate means;
a primary waveguide means embedded in said substrate means, said primary waveguide means having an input end means for receiving light from the tunable laser and an output end means for outputting said light;
a secondary waveguide means embedded in said substrate means, wherein a portion thereof is located close enough to a portion of the primary waveguide means so that said secondary waveguide means receives a first portion of said light from the tunable laser means by direct or indirect evanescent coupling from said primary waveguide means; and
a filter means having a passband centered on the target wavelength and coupled to an output of the secondary waveguide means to receive said first portion of light wherein said filter means is for generating a signal related to the intensity of said first portion of light in the passband centered on the target wavelength.

18. A planar lightwave circuit (PLC) module for conditioning light output from a tunable laser designed to generate light at one target wavelength of a plurality of different target wavelengths, the PLC module comprising:

a substrate;

a primary waveguide embedded in said substrate, said primary waveguide having an input end for receiving light from the tunable laser and an output end for outputting said light;

at least a first secondary waveguide embedded in said substrate;

means for coupling the first secondary waveguide to the primary waveguide so that the first secondary waveguide receives a first portion of tunable laser light from the primary waveguide;

a multiple-output filter means coupled to an output of the first secondary waveguide to receive said first portion of light, said multiple-output filter means comprising a plurality of substantially identical distributed dielectric multilayer stack filter means mounted in the substrate means, one multilayer stack filter means for each of the plurality of target wavelengths, each of said multilayer stack filter means having a passband determined in part by the angle at which filtered light impinges on said filter, each said passband centered on a respective one of the plurality of the target wavelengths, wherein each said multilayer stack filter means is for generating a signal related to the intensity of said first portion of light in the respective passband of said each multilayer stack filter means, whereby said multiple-output filter means provides a plurality of output signals related, respectively, to the intensity of said first portion of light in passbands centered on each of the plurality of target wavelengths, respectively; and a plurality of secondary filter waveguide means, one for each of the multilayer stack filter means, each of the plurality of secondary filter waveguide means receiving light from said first secondary waveguide means and patterned in the substrate means so as to terminate at a unique angle with respect to its corresponding multilayer stack filter means so that each multilayer stack filter means has a passband centered on a respective one of the plurality of target wavelengths.

* * * * *